US011350044B2

United States Patent
Mori et al.

(10) Patent No.: US 11,350,044 B2
(45) Date of Patent: May 31, 2022

(54) SOLID-STATE IMAGING DEVICE, METHOD FOR DRIVING SOLID-STATE IMAGING DEVICE, AND ELECTRONIC APPARATUS

(71) Applicant: BRILLNICS SINGAPORE PTE. LTD., Singapore (SG)

(72) Inventors: Kazuya Mori, Tokyo (JP); Isao Takayanagi, Tokyo (JP); Shunsuke Tanaka, Tokyo (JP); Toshinori Otaka, Tokyo (JP); Naoto Yasuda, Tokyo (JP)

(73) Assignee: BRILLNICS SINGAPORE PTE. LTD., Singapore (SG)

(*) Notice: Subject to any disclaimer, the term of this patent is extended or adjusted under 35 U.S.C. 154(b) by 47 days.

(21) Appl. No.: 16/628,980

(22) PCT Filed: Jun. 29, 2018

(86) PCT No.: PCT/JP2018/024892
§ 371 (c)(1),
(2) Date: Jan. 6, 2020

(87) PCT Pub. No.: WO2019/009213
PCT Pub. Date: Jan. 10, 2019

(65) Prior Publication Data
US 2020/0137325 A1   Apr. 30, 2020

(30) Foreign Application Priority Data
Jul. 7, 2017 (JP) .............................. JP2017-133466

(51) Int. Cl.
*H04N 5/335* (2011.01)
*H01L 27/146* (2006.01)
(Continued)

(52) U.S. Cl.
CPC ....... *H04N 5/335* (2013.01); *H01L 27/14609* (2013.01); *H04N 5/2173* (2013.01); *H01L 27/14603* (2013.01)

(58) Field of Classification Search
CPC .. H04N 5/335; H04N 5/2173; H04N 5/37452; H04N 5/35563; H04N 5/3559;
(Continued)

(56) References Cited

U.S. PATENT DOCUMENTS 9,332,200 B1   5/2016   Hseih et al.
9,363,450 B2   6/2016   Nakamura et al.
(Continued)

FOREIGN PATENT DOCUMENTS

JP   2000165754 A   6/2000
JP   2013070245 A   4/2013
(Continued)

OTHER PUBLICATIONS

Patent Cooperation Treaty, International Search Report for PCT/JP2018/024892, dated Sep. 4, 2018, pp. 1-3.
(Continued)

*Primary Examiner* — Albert H Cutler
(74) *Attorney, Agent, or Firm* — Pillsbury Winthrop Shaw Pittman LLP

(57) ABSTRACT

A pixel PXL includes a first photodiode PDSL and a second photodiode PSLS having different well capacities and responsivities, transfer transistors TGSL-Tr, TGLS-Tr for transferring the charges stored in the photodiodes to a floating diffusion FD, and a capacitance changing part 80 for changing the capacitance of the floating diffusion depending on a capacitance changing signal. The first well capacity of the first photodiode PDSL is smaller than the second well capacity of the second photodiode PDLS, and the first responsivity of the first photodiode PDSL is larger than the
(Continued)

second responsivity of the second photodiode PDLS. With these configurations, it becomes possible to realize a widened dynamic range, prevent the read-out noise from affecting the performance, and eventually achieve improved image quality.

19 Claims, 40 Drawing Sheets

(51) Int. Cl.
  *H04N 5/217* (2011.01)
  *H04N 5/3745* (2011.01)
  *H04N 5/355* (2011.01)

(58) Field of Classification Search
  CPC ............ H04N 5/37457; H04N 5/35545; H01L 27/14609; H01L 27/14603; H01L 27/146
  See application file for complete search history.

(56) References Cited

U.S. PATENT DOCUMENTS

| | | | |
|---|---|---|---|
| 2010/0243864 A1* | 9/2010 | Itonaga | H01L 31/103 250/208.1 |
| 2011/0001861 A1 | 1/2011 | Tanaka et al. | |
| 2013/0256510 A1 | 10/2013 | Lyu | |
| 2014/0022401 A1* | 1/2014 | Awatani | H04N 5/335 348/207.11 |
| 2015/0002713 A1 | 1/2015 | Nomura | |
| 2018/0191974 A1* | 7/2018 | Shim | H04N 5/345 |
| 2018/0366513 A1* | 12/2018 | Yang | H04N 5/37452 |
| 2019/0014276 A1* | 1/2019 | Cheung | H04N 5/3575 |

FOREIGN PATENT DOCUMENTS

| | | |
|---|---|---|
| JP | 2016021606 A | 2/2016 |
| JP | 2016220192 A | 12/2016 |
| WO | 2018/011121 A1 | 1/2018 |
| WO | WO2018155297 * | 8/2018 |

OTHER PUBLICATIONS

Patent Cooperation Treaty, International Search Report issued in PCT/JP2018/024892, dated Sep. 4, 2018, pp. 1-4.

Willassen, et al., A 1280×1080 4.2μm Split-diode Pixel HDR Sensor in 110nm BSI CMOS Process, 2015, pp. 1-4, accessed Jan. 3, 2020 at https://pdfs.semanticscholar.org/7357/602380bcc5677665374a207cf557ea06623a.pdf.

European Patent Office, Extended European Search Report issued in EP Patent Application No. 18828179.4, dated Feb. 25, 2022, pp. 1-21.

Mori et al., "P29 Back Side Illuminated High Dynamic Range 3.0[mu]m Pixel Featuring Vertical p-n Junction Capacitance in A Deep Pinned Photodiode", Retrieved from the Internet: URL:https://www.imagesensors.org/Past%20Workshops/2017%20Workshop/2017%20Papers/P29, Jun. 2, 2017, pp. 1-4.

* cited by examiner

| Mode | Read of read PD | PDAF Function | DR dB (extended LFWC) | 1st read PD Sig1 | 2nd read PD Sig2 | 3rd read PD Sig3 | PDAF Sig | HDR Sig |
|---|---|---|---|---|---|---|---|---|
| Non-HDR | 1 | NA | 93dB (50Ke) | PDSL&PDLS 1~4 (1) | NA | NA | NA | NA |
| HDR | 2 | NA | 103dB (150Ke) | PDSL (2) | PDLS1&2 (3) | NA | NA | Sig2 |
| PDAF(V) | 3 | Vertical | 103dB (150Ke) | PDSL (2) | PDLS1&2 (4) | PDLS3&4 (4) | Sig2−Sig3 | Sig2+Sig3 |
| PDAF(H) | 3 | Horizontal | 103dB (150Ke) | PDSL (2) | PDLS1&3 (4) | PDLS2&4 (4) | Sig2−Sig3 | Sig2+Sig3 |
| PDAF(D) | 3 | Diagonal | 103dB (150Ke) | PDSL (2) | PDLS1&4 (4) | PDLS2&3 (4) | Sig2−Sig3 | Sig2+Sig3 |
| Extra-HDR | 3 | NA | 108dB (250Ke) | PDSL (2) | PDLS1&2&3 (5) | PDLS4 (6) | NA | Sig2+Sig3 |

Assumption :
LFWC
PDSL : 10Ke
PDLS1~4 : 10Ke
Noise : 1e

DR=20Log(total LFWC/noise)

FIG. 25

SOLID-STATE IMAGING DEVICE, METHOD FOR DRIVING SOLID-STATE IMAGING DEVICE, AND ELECTRONIC APPARATUS

RELATED PATENT APPLICATION

This application is based on and claims the benefit of priority International Application No. PCT/JP2018/024892, filed on Jun. 29, 2018, which claims priority to Japanese Patent Application No. 2017-133466, filed on Jul. 7, 2017, the contents of which are hereby incorporated by reference in their entirety.

TECHNICAL FIELD

The present invention relates to a solid-state imaging device, a method for driving a solid-state imaging device, and an electronic apparatus.

BACKGROUND

Solid-state imaging devices (image sensors) including photoelectric conversion elements for detecting light and generating charges are embodied as CMOS (complementary metal oxide semiconductor) image sensors, which have been in practical use. The CMOS image sensors have been widely applied as parts of various types of electronic apparatuses such as digital cameras, video cameras, surveillance cameras, medical endoscopes, personal computers (PCs), mobile phones and other portable terminals (mobile devices).

A CMOS image sensor includes, for each pixel, a photodiode (a photoelectric conversion element) and a floating diffusion (FD) amplifier having a floating diffusion (FD). The mainstream design of the reading operation in CMOS image sensors is a column parallel output processing performed by selecting a row in a pixel array and reading the pixels simultaneously in the column direction.

To improve characteristics, various methods have been proposed for fabricating a CMOS image sensor that has a wide dynamic range and provides a high picture quality (see, for example, Patent Literature 1).

Patent Literature 1 discloses a dynamic range widening technology that involves dividing the exposure period into two or more exposure sessions of different durations, including short-exposure imaging for high illuminance and long-exposure imaging for low illuminance. Patent Literature 1 also discloses a dynamic range widening technology that involves employing a floating diffusion FD with a variable capacitance.

According to the dynamic range widening technology disclosed in Patent Literature 1, the imaging for low illuminance and the imaging for high illuminance are performed at different timings (during different periods), and this means that the signals obtained as a result of multiple exposure sessions are used. This disadvantageously creates defects in the images, causes moving object distortions and thus impair the quality of the moving image.

To address this issue, a solid-state imaging device has been proposed that has, in each pixel, two different photodiodes (PDs) with different responsivities so that two pieces of image data having different responsivities are obtained (see, for example, Non-Patent Literature 1).

FIG. 1 shows a configuration of a pixel of a CMOS image sensor disclosed in Non-Patent Literature 1. FIG. 2 is a timing chart including parts (A) to (E) to illustrate a reading operation for the pixel in FIG. 1.

The pixel shown in FIG. 1 includes a small photodiode (photoelectric converting element) SPD having a small responsivity and a small well capacity and a large photodiode (LPD) having a large responsivity and a large well capacity. For the small photodiode SPD, a small transfer transistor TGS and a small floating diffusion FDS are provided. For the large photodiode LPD, a large transfer transistor TGL and a large floating diffusion FDL are provided. The small floating diffusion FDS and the large floating diffusion FDL are connected to each other via a connection switching transistor TDFD. Between the small floating diffusion FDS and a reset potential vrfd, a reset transistor TRST is connected. A source follower transistor TSF and a selection transistor TSEL are connected in series between a power supply line VDD and a vertical signal line vpix, and the gate of the source follower transistor TSF is connected to the large floating diffusion FDL.

In the pixel shown in FIG. 1, a low conversion gain (LCG) can be obtained by bringing the connection switching transistor TDFD into the conduction state. This increases the equivalent capacitance of the gate of the source follower transistor TSF. A high conversion gain (HCG) can be obtained by bringing the connection switching transistor TDFD into the non-conduction state. According to the pixel shown in FIG. 1, the large photodiode LPD can be used for both of the low conversion gain (LCG) reading and the high conversion gain (HCG) reading, and the small photodiode SPD can be used only for the low conversion gain (LCG) reading.

RELEVANT REFERENCES

List of Relevant Patent Literature

Patent Literature 1: Japanese Patent Application Publication No. 2000-165754.

List of Relevant Non-Patent Literature

Non-Patent Literature 1: T. Willassen, et al., "A 1280×1080 4.2Ξm Split-Diode Pixel HDR Sensor in 110 nm BSI CMOS Process" International Image Sensor Workshop (IISW), 8-11 Jun. 2015, Vaals, Netherlands.

SUMMARY

The dynamic range widening technology disclosed in Non-Patent Literature 1 has the following problems. When a dark signal (a signal obtained when the illuminance is low) is read out using the photodiode LPD having a large responsivity, the read-out noise deteriorates since the floating diffusion FD has a large capacitance. The floating diffusion FD, however, needs to have a large capacitance in order to read all the signals. The read-out noise can be reduced by reducing the capacitance of the floating diffusion FD for the large photodiode LPD. This, however, deteriorates the SNR gap for the reading of the other photodiode PD.

The present invention is designed to provide a solid-state imaging device, a method for driving a solid-state imaging device, and an electronic apparatus that are capable of realizing a widened dynamic range, preventing the read-out noise from affecting the performance, and achieving improved image quality.

A first aspect of the present invention provides a solid-state imaging device including a pixel part having a pixel arranged therein. The pixel has at least one first photoelectric converting part for storing therein, in a storing period, charges generated by photoelectric conversion, at least one second photoelectric converting part for storing therein, in a storing period, charges generated by photoelectric conversion, at least one first transfer element for transferring, in a designated transfer period, the charges stored in the first photoelectric converting part, at least one second transfer element for transferring, in a designated transfer period, the charges stored in the second photoelectric converting part, a floating diffusion to which the charges stored in at least one selected from the group consisting of the first photoelectric converting part and the second photoelectric converting part are transferred through at least one selected from the group consisting of the first transfer element and the second transfer element, a source follower element for converting the charges in the floating diffusion into a voltage signal with a gain determined by the quantity of the charges, and a capacitance changing part for changing a capacitance of the floating diffusion depending on a capacitance changing signal. Here, the first photoelectric converting part has a first well capacity and a first responsivity, the second photoelectric converting part has a second well capacity and a second responsivity, and the second well capacity and the second responsivity are respectively different from the first well capacity and the first responsivity.

A second aspect of the present invention provides a method for driving a solid-state imaging device including a pixel part having a pixel arranged therein. The pixel has at least one first photoelectric converting part for storing therein, in a storing period, charges generated by photoelectric conversion, at least one second photoelectric converting part for storing therein, in a storing period, charges generated by photoelectric conversion, at least one first transfer element for transferring, in a designated transfer period, the charges stored in the first photoelectric converting part, at least one second transfer element for transferring, in a designated transfer period, the charges stored in the second photoelectric converting part, a floating diffusion to which the charges stored in at least one selected from the group consisting of the first photoelectric converting part and the second photoelectric converting part are transferred through at least one selected from the group consisting of the first transfer element and the second transfer element, a source follower element for converting the charges in the floating diffusion into a voltage signal with a gain determined by the quantity of the charges, a reset element for discharging, in a reset period, the charges from the floating diffusion, and a capacitance changing part for changing the capacitance of the floating diffusion depending on a capacitance changing signal. Here, the first photoelectric converting part has a first well capacity and a first responsivity, the second photoelectric converting part has a second well capacity and a second responsivity, and the second well capacity and the second responsivity are respectively different from the first well capacity and the first responsivity. Here, in a read-out scanning period including reading, in a reading period following a reset period in which the floating diffusion is reset through the reset element, a signal in a reset state, and reading, in a reading period following a transfer period in which the charges stored in the first photoelectric converting part or the second photoelectric converting part are transferred to the floating diffusion through the first transfer element or the second transfer element after the reading period following the reset period, a signal determined by the stored charges, where the first photoelectric converting part has a first well capacity and a first responsivity and the second photoelectric converting part has a second well capacity and a second responsivity, in a single reading period, at least one selected from the group consisting of first conversion gain mode reading of reading the pixel signal corresponding to the charges stored in the first photoelectric converting part, with a first conversion gain corresponding to a first capacitance set by the capacitance changing part and second conversion gain mode reading of reading the pixel signal corresponding to the charges stored in the second photoelectric converting part, with a second conversion gain corresponding to a second capacitance set by the capacitance changing part is performed.

A third aspect of the present invention provides an electronic apparatus including a solid-state imaging device, and an optical system for forming a subject image on the solid-state imaging device. The solid-state imaging device includes a pixel part having a pixel arranged therein, and the pixel has at least one first photoelectric converting part for storing therein, in a storing period, charges generated by photoelectric conversion, at least one second photoelectric converting part for storing therein, in a storing period, charges generated by photoelectric conversion, at least one first transfer element for transferring, in a designated transfer period, the charges stored in the first photoelectric converting part, at least one second transfer element for transferring, in a designated transfer period, the charges stored in the second photoelectric converting part, a floating diffusion to which the charges stored in at least one selected from the group consisting of the first photoelectric converting part and the second photoelectric converting part are transferred through at least one selected from the group consisting of the first transfer element and the second transfer element, a source follower element for converting the charges in the floating diffusion into a voltage signal with a gain determined by the quantity of the charges, and a capacitance changing part for changing the capacitance of the floating diffusion depending on a capacitance changing signal. Here, the first photoelectric converting part has a first well capacity and a first responsivity, the second photoelectric converting part has a second well capacity and a second responsivity, and the second well capacity and the second responsivity are respectively different from the first well capacity and the first responsivity.

Advantages

The present invention is capable of realizing a widened dynamic range, preventing the read-out noise from affecting the performance, and achieving improved image quality.

BRIEF DESCRIPTION OF THE DRAWINGS

FIG. 25 is a table briefly showing reading modes in which a dynamic range widening function and a phase difference detecting function are effectuated in accordance with the seventh embodiment.

10, 10A to 10G . . . solid-state imaging device, 20, 20A to 20G . . . pixel part, PDSL . . . first photodiode (first photoelectric converting part), PDLS, PDLS1 to PDS8 . . . second photodiode (second photoelectric converting part), TGSL-Tr . . . first transfer transistor (first transfer element), TGLS-Tr, TGLS1-Tr to TGLS8-Tr . . . second transfer transistor (second transfer element), 210 . . . semiconductor substrate, 220 . . . first photodiode, 240 . . . second photodiode, 30 . . . vertical scanning circuit, 40 . . . reading circuit, 50 . . . horizontal scanning circuit, 60 . . . timing control circuit, 70 . . . reading part, 80, 80A to 80C . . . capacitance changing part, C81,C82 . . . capacitor, SW81-Tr, SW82-Tr . . . switching transistor (switch element), 81 . . . first binning switch, 82 . . . second binning switch, 83 . . . overflow drain (OFD) gate, 91 . . . microlens array, 92 . . . color filter group, 93 . . . wiring pattern layer, 94 . . . silicon substrate, 100 ... electronic apparatus, 110 ... CMOS image sensor, 120 ... optical system, 130 ... signal processing circuit (PRC)

DESCRIPTION OF THE EMBODIMENTS

Embodiments of the present invention will be hereinafter described with reference to the drawings.

First Embodiment

Figure 3:
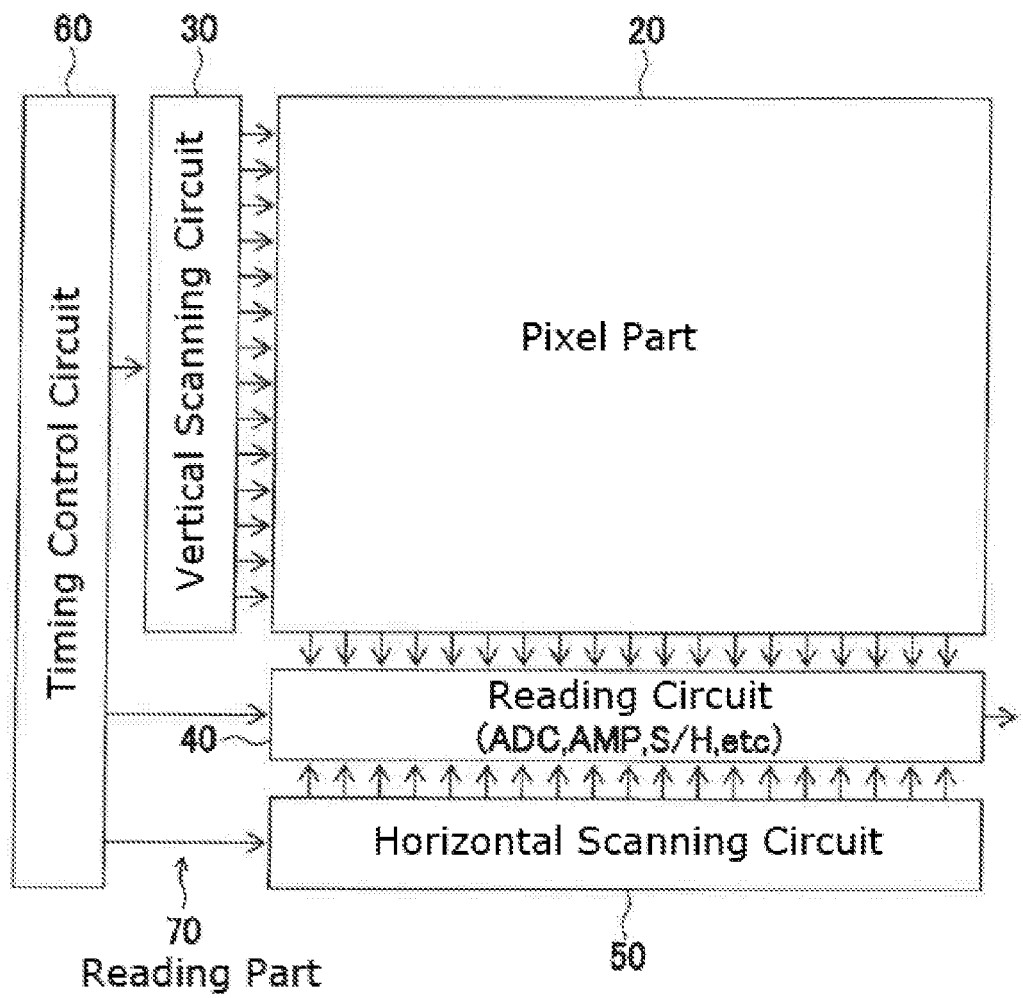
FIG. 3 is a block diagram showing an example configuration of a solid-state imaging device relating to a first embodiment of the present invention.

FIG. 3 is a block diagram showing an example configuration of a solid-state imaging device relating to a first embodiment of the present invention.

In this embodiment, a solid-state imaging device 10 is constituted by, for example, a CMOS image sensor.

As shown in FIG. 3, the solid-state imaging device 10 is constituted mainly by a pixel part 20 serving as an image capturing part, a vertical scanning circuit (a row scanning circuit) 30, a reading circuit (a column reading circuit) 40, a horizontal scanning circuit (a column scanning circuit) 50, and a timing control circuit 60. Among these components, for example, the vertical scanning circuit 30, the reading circuit 40, the horizontal scanning circuit 50, and the timing control circuit 60 constitute the reading part 70 for reading out pixel signals.

In the first embodiment, the solid-state imaging device 10 includes pixels arranged in a matrix pattern in the pixel part 20, and each pixel includes a plurality of photodiodes or photoelectric converting parts having different well capacities and responsivities and a plurality of transfer elements (transfer transistors) for transferring the charges stored in the corresponding photodiodes to a floating diffusion FD, as will be described in detail below.

In the solid-state imaging device 10 relating to the first embodiment, the pixel part 20 or the pixels arranged in a matrix pattern in the pixel part 20 each include a capacitance changing part configured to change the capacitance of the floating diffusion depending on a capacitance changing signal, as will be described below in detail. In the solid-state imaging device 10, the capacitance of the floating diffusion is set (changed) by the capacitance changing part in a predetermined period within a single reading period following a single charge storing period (exposure period), so that the conversion gain is switched within this reading period.

In the first embodiment, the reading part 70 is capable of performing read-out scanning that involves a reset period, a reading period following the reset period, a transfer period, and a reading period following the transfer period. In the reset period, the floating diffusion is reset through a reset element. In the reading period following the reset period, the signal in the reset state is read out. The reading period following the reset period is followed by the transfer period, in which the charges stored in a first photoelectric converting element having a first well capacity and a first responsivity or the charges stored in a second photoelectric converting part having a second well capacity and a second responsivity are transferred to the floating diffusion through a first transfer element or a second transfer element. In the reading period following the transfer period, the signal corresponding to the stored charges is read out. The reading part 70 is configured to be capable of performing at least one selected from the group consisting of first conversion gain mode reading and second conversion gain mode reading in a single reading period. In the first conversion gain mode reading, the reading part 70 reads a pixel signal with a first conversion gain (for example, a high gain or HCG) corresponding to a first capacitance set by the capacitance changing part. In the second conversion gain mode reading, the reading part 70 reads a pixel signal with a second conversion gain (for example, a low gain or LCG) corresponding to a second capacitance set by the capacitance changing part.

Furthermore, in the first embodiment, the reading part 70 can be also configured to be capable of performing first conversion gain mode reading and second conversion gain mode reading in a single reading period. In the first conversion gain mode reading, the reading part 70 reads a pixel signal with a first conversion gain corresponding to a first capacitance set by the capacitance changing part. In the second conversion gain mode reading, the reading part 70 reads a pixel signal with a second conversion gain corresponding to a second capacitance set by the capacitance changing part (that is different from the first capacitance). The solid-state imaging device 10 relating to the first embodiment can be provided as a solid-state image sensor that can output both bright and dark signals and thus achieve a wide dynamic range. This is accomplished by, when the charges (electrons) obtained by photoelectric conversion in a single storing period (exposure period) are processed into an output signal, switching the mode of the pixel between a first conversion gain (e.g., a high conversion gain) mode and a second conversion gain (e.g., a low conversion gain) mode in a single reading period.

In a normal pixel reading operation, the reading part 70 drives the pixels in such a manner that shutter scanning is followed by read-out scanning. The first conversion gain mode reading (HCG) and the second conversion gain mode reading (LCG) are performed in the period of the read-out scanning.

The following first outlines the configurations and functions of the parts of the solid-state imaging device 10 and then describes the reading operations and the like relating to the configurations of the pixel and capacitance changing part.

<Configurations of Pixel Part 20 and Pixel PXL>

In the pixel part 20, a plurality of pixels each including a photodiode (a photoelectric converting element) and an in-pixel amplifier are arranged in a two-dimensional matrix comprised of N rows and M columns.

Figure 4:
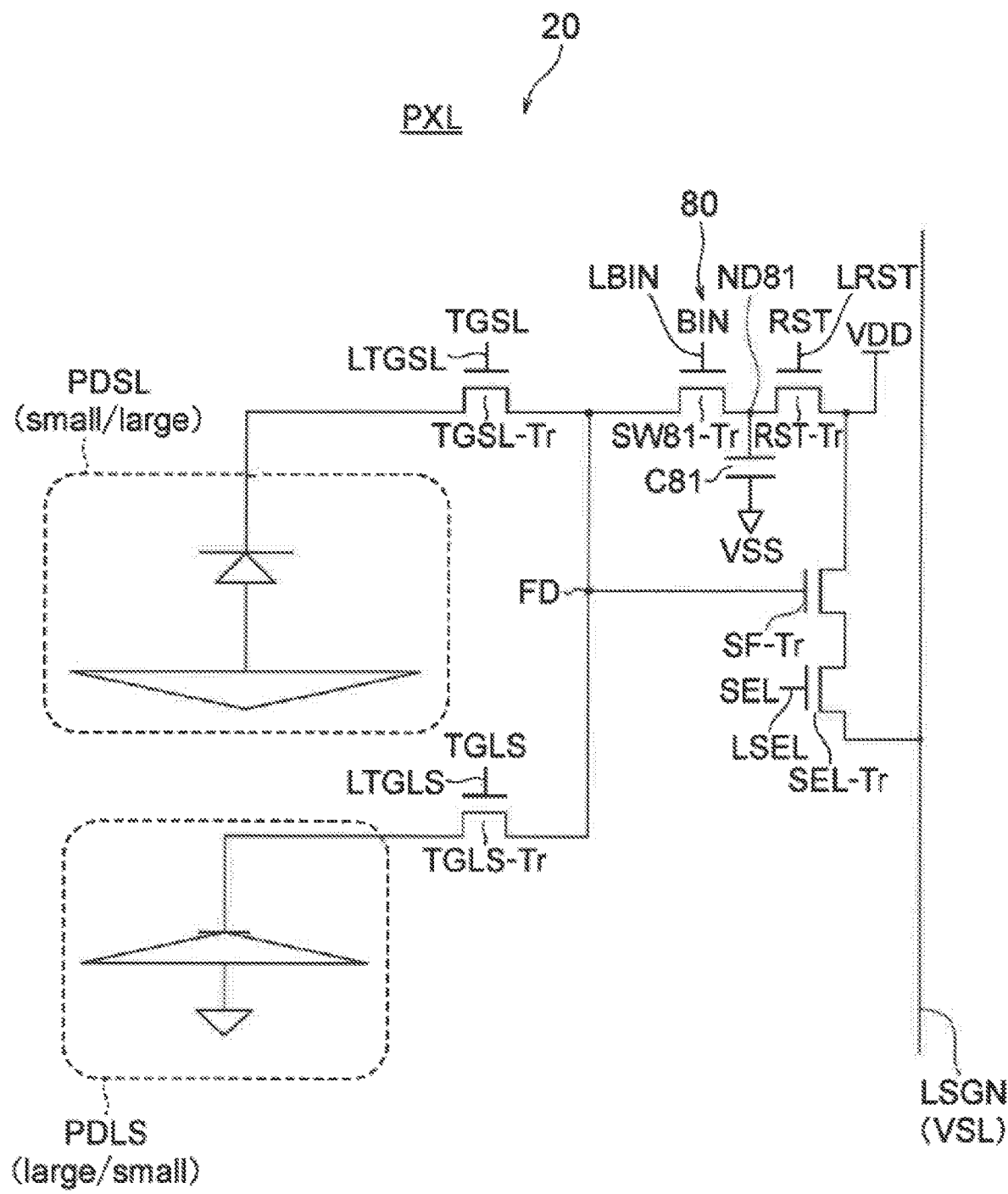
FIG. 4 is a circuit diagram showing an example of a pixel according to the first embodiment.

FIG. 4 is a circuit diagram showing an example of the pixel relating to the present embodiment.

The pixel PXL includes, for example, a plurality of (in the first embodiment, two) photodiodes or photoelectric converting parts (photoelectric converting elements) having different well capacities and responsivities and a plurality of (in the first embodiment, two) transfer elements or transfer transistors TGSL-Tr, TGLS-Tr for transferring the charges stored in the corresponding photodiodes to a floating diffusion FD. In the first embodiment, each pixel PXL includes a first photodiode PDSL serving as a first photoelectric converting part having a first well capacity and a first responsivity and a second photodiode PDLS serving as a second photoelectric converting part having a second well capacity and a second responsivity, which are respectively different from the first well capacity and the second responsivity. In the first embodiment, the first well capacity is smaller than the second well capacity and the first responsivity is higher than the second responsivity. For example, the first well capacity is approximately 5 ke, and the second well capacity is approximately 20 ke. Furthermore, for example, the first responsivity is approximately 5 ke/lux, and the second responsivity is approximately 25 ke/lux.

To the first photodiode PDSL, a transfer transistor TGSL-Tr serving as a first transfer element is connected. To the second photodiode PDLS, a transfer transistor TGLS-Tr serving as a second transfer element is connected.

The pixel PXL includes one reset transistor RST-Tr serving as a reset element, a source follower transistor SF-Tr serving as a source follower element, and a selection transistor SEL-Tr serving as a selecting element.

The pixel PXL includes a capacitance changing part 80 that is connected to the floating diffusion FD and configured to change the capacitance of the floating diffusion FD depending on a capacitance changing signal BIN. In the first embodiment, the capacitance changing part 80 is connected between the reset transistor RST-Tr and the floating diffusion FD.

The photodiodes PDSL and PDLS generate signal charges (electrons) in an amount determined by the quantity of the incident light and store the same. A description will be hereinafter given of a case where the signal charges are electrons and each transistor is an n-type transistor. However, it is also possible that the signal charges are holes or each transistor is a p-type transistor. Further, this embodiment is also applicable to the case where a plurality of photodiodes share the transistors or the case where the pixel includes no selection transistors.

The photodiodes (PDs) in each pixel PXL are pinned photodiodes (PPDs). On a substrate surface for forming the photodiodes (PDs), there is a surface level due to dangling bonds or other defects, and therefore, a lot of charges (dark current) are generated due to heat energy, so that signals fail to be read out correctly. In the case of a pinned photodiode (PPD), a charge storage part of the photodiode (PD) is buried in the substrate to reduce mixing of the dark current into signals.

The first photodiode PDSL and the second photodiode PDLS are provided as pinned photodiodes and have the following configuration. The first photodiode PDSL includes a semiconductor layer of a first conductivity type (in the present embodiment, the n type) (in the present embodiment, the n layer) that is embedded in a semiconductor substrate having a first substrate surface and a second substrate surface opposing the first substrate surface, and is capable of photoelectrically converting the received light and storing the resulting charges. On the lateral portion of the first photodiode PDSL in the direction orthogonal to the normal to the substrate, a separation layer of a second conductivity type (in the present embodiment, the p type) is formed. The second photodiode PDLS includes an n layer (a first-conductivity-type semiconductor layer) buried in the substrate such that the second photodiode PDLS is parallel with the first photodiode PDSL with the second-conductivity-type separation layer being sandwiched therebetween. The second photodiode PDLS is capable of photoelectrically converting received light and storing the resulting charges. In the present embodiment, the aperture of the light receiving region of the first photodiode PDSL is larger than the aperture of the light receiving region of the second photodiode PDLS, and the impurity concentration of the n layer in the first photodiode PDSL is lower than the impurity concentration in the n layer in the second photodiode PDLS.

With the above-described arrangement, the pixel PXL is characteristically configured such that the first photodiode PDSL has a smaller well capacity than the second photodiode PDLS and a larger responsivity than the second photodiode PDLS.

In the present embodiment, the second photodiode PDLS includes, in its photoelectric converting part, at least one p layer (second-conductivity-type semiconductor layer) having a junction capacitance component with the n layer (first-conductivity-type semiconductor layer) in the direction (the X or Y direction) orthogonal to the normal to the substrate, in order to increase the storable capacitance (well capacity).

<Specific Example Configurations of Photodiodes PDSL an PDLS of Pinned Type>

Figure 5:
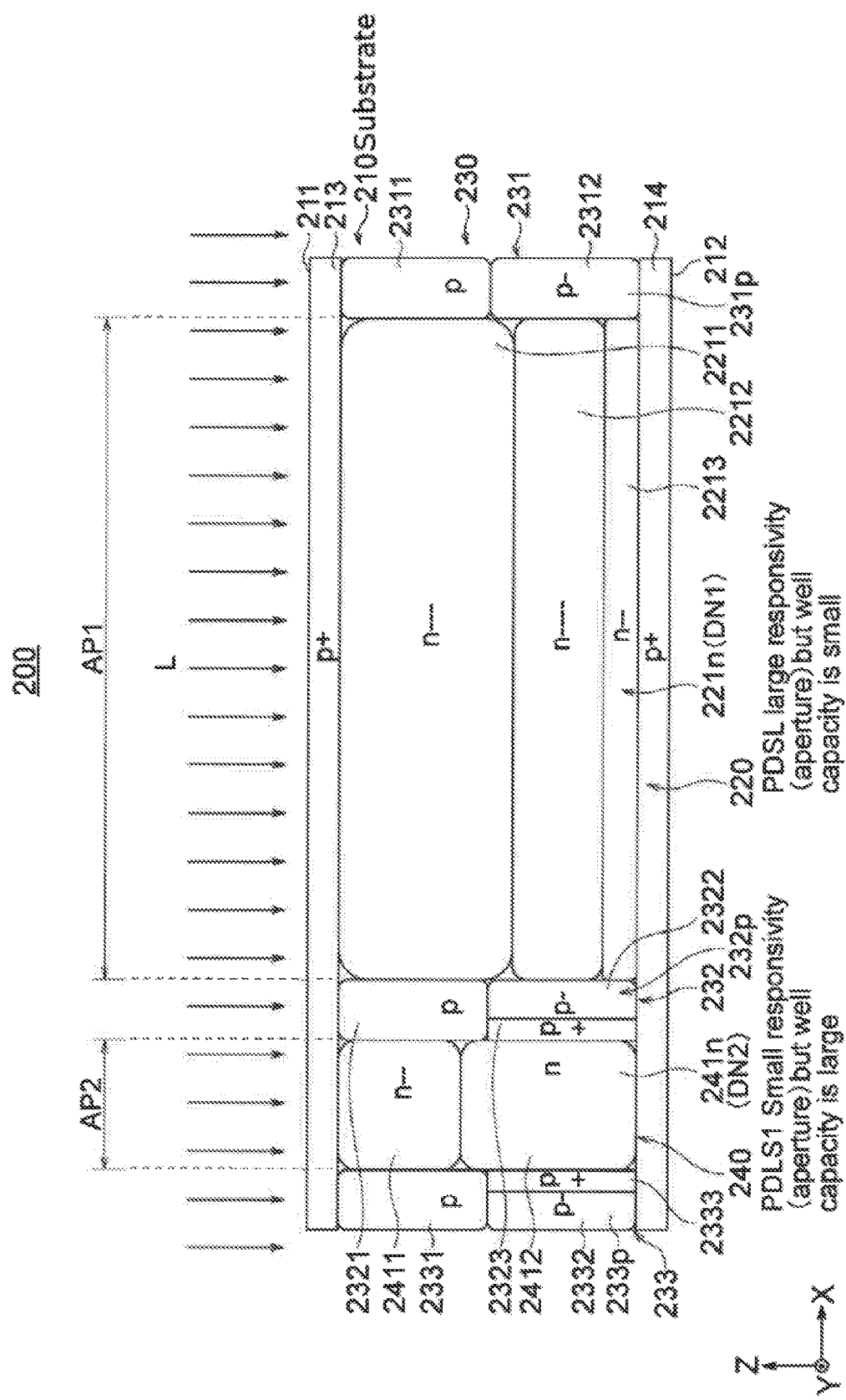
FIG. 5 is a simplified sectional view showing an example configuration of main parts of first and second photodiodes of the pinned type, excluding a charge transfer gate part, in accordance with the first embodiment of the present invention.

The specific example configurations of the first photodiode PDSL and the second photodiode PDLS of the pinned type are described with reference to FIG. 5. FIG. 5 is a simplified sectional view showing an example configuration of main parts of the first photodiode and the second photodiode of the pinned type, excluding a charge transfer gate part, in accordance with the first embodiment of the present invention. In the following, the pinned photodiode (PPD) portion is denoted by a reference sign 200.

The pinned photodiode (PPD) portion 200 shown in FIG. 5 includes a semiconductor substrate (hereinafter, referred to simply as "the substrate") 210 having a first substrate surface 211 (e.g., a back surface) to be irradiated with light L and a second substrate surface 212 (a front surface) opposite to the first substrate surface 211. The pinned photodiode portion 200 includes a first photodiode 220 (PDSL) that includes a semiconductor layer of a first conductivity type (in the present embodiment, then type) (in the present embodiment the n layer) 221n buried in the substrate 210 and is capable of photoelectrically converting received light and storing the resulting charges. The pinned photodiode portion 200 includes a second photodiode 240 (PDLS) that includes an n layer (a first-conductivity-type semiconductor layer) 241n buried in the substrate 210 such that the second photodiode PDLS is parallel with the first photodiode 220 (PDSL) with the second-conductivity-type (p type) separation layer 230 being sandwiched therebetween. The second photodiode 240 (PDLS) is capable of photoelectrically converting received light and storing the resulting charges.

In the pinned photodiode portion 200, on the lateral portions (the boundary portions of the n layers) of the first photodiode 220 (PDSL) and the second photodiode 240 (PDLS) in the direction orthogonal to the normal to the substrate 210, separation layers of the second conductivity type (the p type) are formed. In the example of FIG. 5, the first photodiode 220 (PDSL) is formed between the second-conductivity-type (p-type) separation layer 231 and the p-type separation layer 232, which are formed on the lateral portions (the boundary portions of the n layer) in the direction (for example, the X direction) orthogonal to the normal to the substrate 210. The second photodiode 240 (PDLS) is formed between the p-type separation layer 232 and the p-type separation layer 233, which are formed on the lateral portions (the boundary portions of the n layer) in the direction orthogonal to the normal to the substrate 210.

In the present embodiment, the aperture AP1 of the light receiving region of the first photodiode PDSL is larger than the aperture AP2 of the light receiving region of the second photodiode PDLS (AP1>AP2), and the impurity concentration DN1 of the n layer 221n in the first photodiode PDSL is lower than the impurity concentration DN2 of the n layer 241n in the second photodiode PDLS (DN1<DN2).

In the first photodiode 220 (PDSL) shown in FIG. 5, the n layer (the first-conductivity-type semiconductor layer) 221n has a three-layer structure in the normal direction to the substrate 210 (the Z direction in the orthogonal coordinate system shown in FIG. 5). In the present example, an n--- layer 2211 is the closest to the first substrate surface 211, an n---- layer 2212 is closer to the second substrate surface 212 than the n--- layer 2211 is, and an n-- layer 2213 is closer to the second substrate surface 212 than the n---- layer 2212 is.

In the second photodiode 240 (PDLS) shown in FIG. 5, the n layer (the first-conductivity-type semiconductor layer) 241n has a two-layer structure in the normal direction to the substrate 210 (the Z direction in the orthogonal coordinate system shown in FIG. 5). In the present example, an n-- layer 2411 is closer to the first substrate surface 211 and an n layer 2412 is closer to the second substrate surface 212 than the n-- layer 2411 is.

The above-described configurations are only illustrated as examples. Alternatively, a single-layer structure may be employed, or a multilayer structure made up by three, four or more layers may be applied.

In the p-type separation layer 231 shown in FIG. 5, a p layer (second-conductivity-type semiconductor layer) 231p has a two-layer structure in the normal direction to the substrate 210 (the Z direction in the orthogonal coordinate system shown in FIG. 5). In the present example, a p layer 2311 is closer to the first substrate surface 211 and a p− layer 2312 is closer to the second substrate surface 212 than the p layer 2311 is.

In the p-type separation layer 232 shown in FIG. 5, a p layer (second-conductivity-type semiconductor layer) 232p has a two-layer structure in the normal direction to the substrate 210 (the Z direction in the orthogonal coordinate system shown in FIG. 5). In the present example, a p layer 2321 is closer to the first substrate surface 211 and a p− layer 2322 is closer to the second substrate surface 212 than the p layer 2321 is. On the lateral portion of the p− layer 2322 of the p-type separation layer 232 relating to the first embodiment in the direction (the X direction in the orthogonal coordinate system in FIG. 5) orthogonal to the normal to the substrate, which is in contact with the n layer 2412 of the second photodiode 240, a p+ layer (second-conductivity-type semiconductor layer) 2323 is formed that has a junction capacitance component with the n layer (the first-conductivity-type semiconductor layer) 2412.

In the p-type separation layer 233 shown in FIG. 5, a p layer (second-conductivity-type semiconductor layer) 233p has a two-layer structure in the normal direction to the substrate 210 (the Z direction in the orthogonal coordinate system shown in FIG. 5). In the present example, a p layer 2331 is closer to the first substrate surface 211 and a p− layer 2332 is closer to the second substrate surface 212 than the p layer 2331 is. On the lateral portion of the p− layer 2332 of the p-type separation layer 233 relating to the first embodiment in the direction (the X direction in the orthogonal coordinate system in FIG. 5) orthogonal to the normal to the substrate that is in contact with the n layer 2412 of the second photodiode 240, a p+ layer (second-conductivity-type semiconductor layer) 2333 is formed that has a junction capacitance component with the n layer (first-conductivity-type semiconductor layer) 2412.

The above-described configurations are shown only as examples. A single-layer structure may be employed, or a stacked structure made up by three, four or more layers may be alternatively applied.

The following explains the reasons why the p+ layers (second-conductivity-type semiconductor layers) 2323, 2333 are formed that have a junction capacitance component with the n layer (first-conductivity-type semiconductor layer) 2412. In the case of a relatively large pixel with a relatively high aspect ratio, for example, a pixel of approximately 3 μm☐, the stored charges are mainly limited to the vertical (the normal direction to the substrate: the depth direction of the substrate) pn junction capacitance at a site close to the surface of the photodiode (PD) portion (photoelectric converting part), and it is difficult to efficiently increase the capacitance to be stored. According to the solid-state imaging device 10 relating to the first embodiment, the photoelectric converting part of the second photodiode 240 (PDLS) of the pinned type includes the p+ layers (second-conductivity-type semiconductor layers) 2323, 2333 having a junction capacitance component with the n layer (first-conductivity-type semiconductor layer) 2412, so that a horizontal (the direction orthogonal to the normal to the substrate) pn junction portion can be present in the pixel and the capacitance to be stored can be thus increased. This configuration can increase the area of the n layer extending along the p+ layer. As a result, a large to-be-stored capacitance can be reliably achieved even with a small PD area.

In the pinned photodiode portion 200 relating to the first embodiment, p+ layers (second-conductivity-type semiconductor layers) 213, 214 are formed on the surfaces of the first photodiode 220 (PDSL), the p-type separation layers 231, 232, 233 and the second photodiode 240 (PDLS) that respectively face the first substrate surface 211 and the second substrate surface 212.

The above has described in detail the structure of the pinned photodiode (PPD) 200 relating to the first embodiment. The pixel shown in FIG. 4 is now described again.

The first transfer transistor TGSL-Tr is connected between the first photodiode PDSL and the floating diffusion FD and controlled by a control signal TGSL applied to the gate thereof through a control line LTGSL. The first transfer transistor TGSL-Tr remains selected and in the conduction state during a transfer period in which the control signal TGSL is at the high (H) level, to transfer to the floating diffusion FD the charges (electrons) produced by the photoelectric conversion and then stored in the first photodiode PDSL.

The second transfer transistor TGLS-Tr is connected between the second photodiode PDLS and the floating diffusion FD and controlled by a control signal TGLS applied to the gate thereof through a control line LTGLS. The second transfer transistor TGLS-Tr remains selected and in the conduction state during a transfer period in which the control signal TGLS is at the high (H) level, to transfer to the floating diffusion FD the charges (electrons) produced by the photoelectric conversion and then stored in the second photodiode PDLS.

The reset transistor RST-Tr is connected between, for example, the power supply line VDD and the floating diffusion FD and controlled by a control signal RST applied to the gate thereof through a control line LRST. The reset transistor RST-Tr remains selected and in the conduction state during a period in which the control signal RST is at the H level, to reset the floating diffusion FD to the potential of the power supply line VDD.

The source follower transistor SF-Tr and the selection transistor SEL-Tr are connected in series between the power supply line VDD and the vertical signal line LSGN. The gate of the source follower transistor SF-Tr is connected to the floating diffusion FD, and the selection transistor SEL-Tr is controlled by a control signal SEL applied to the gate thereof through a control line LSEL. The selection transistor SEL-Tr remains selected and in the conduction state during a period in which the control signal SEL is at the H level. Thus, the source follower transistor SF-Tr outputs, to the vertical signal line LSGN, a read-out signal VSL of a column output generated by converting the charges at the floating diffusion FD into a voltage signal with a gain determined by a quantity of the charges (the potential). These operations are performed concurrently in parallel in the pixels forming each row since, for example, the gates of the transfer transistors TGSL-Tr or TGLS-Tr, reset transistors RST-Tr, and selection transistors SEL-Tr in each row are connected to each other.

Since the pixel part 20 includes the pixels PXL arranged in N rows and M columns, there are N control lines LSEL, LRST, LTGSL, LTGLS and LBIN and M vertical signal lines LSGN. In FIG. 4, the control lines LSEL, LRST, LTGSL, LTGLS, LBIN are represented as one row-scanning control line.

The vertical scanning circuit 30 drives the pixels in shutter and read-out rows through the row-scanning control lines under the control of the timing control circuit 60. Further, the vertical scanning circuit 30 outputs, according to address signals, row selection signals for row addresses of the read-out rows from which signals are to be read out and the shutter rows in which the charges accumulated in the photodiodes PD are reset.

As described above, in a normal pixel reading operation, shutter scanning and then read-out scanning are performed by driving of the pixels by the vertical scanning circuit 30 of the reading part 70.

Figure 6A:
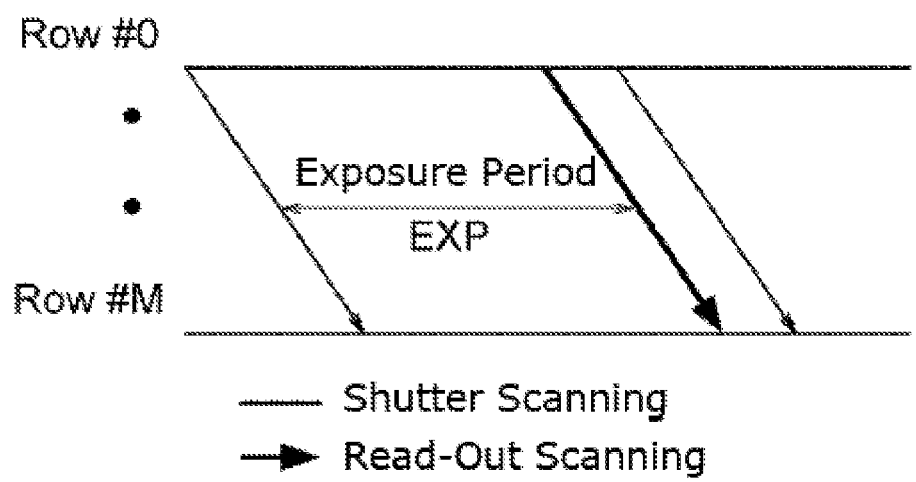
FIGS. 6A and 6B are timing charts to illustrate a shutter scanning operation and a read-out scanning operation of a normal pixel read-out operation relating to the first embodiment.
Figure 6B:
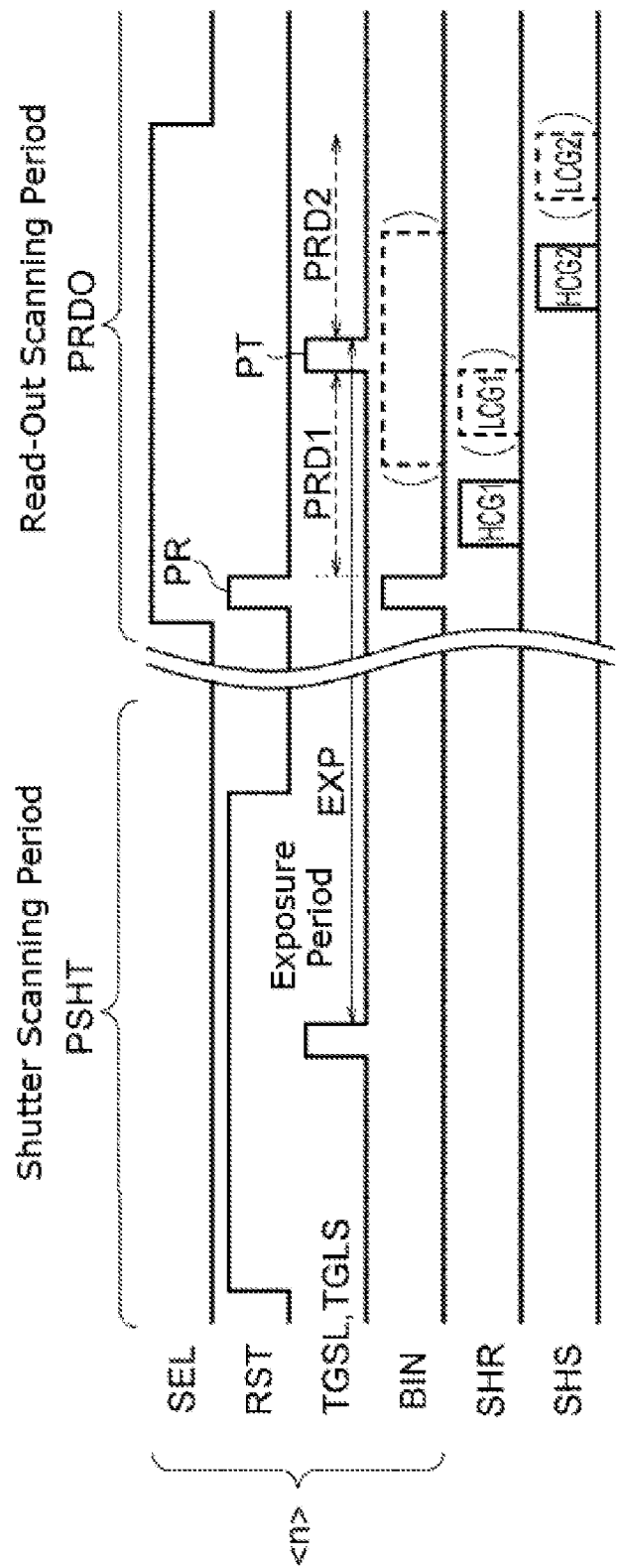

FIGS. 6A and 6B are timing charts to illustrate the shutter scanning and read-out scanning in a normal pixel reading operation relating to the first embodiment.

The control signal SEL used to turn on (conduction) or off (non-conduction) the selection transistor SEL-Tr is set to the L level during the shutter scanning period PSHT so that the selection transistor SEL-Tr remains in the non-conduction state, and set to the H level during the read-out scanning period PRDO so that the selection transistor SEL-TR remains in the conduction state.

In the shutter scanning period PSHT, the control signal TGSL or TGLS is set at the H level during a predetermined period within the period in which the control signal RST is at the H level, so that the photodiode PD and the floating diffusion FD are reset through the reset transistor RST-Tr and the transfer transistor TGSL-Tr or TGLS-Tr.

In the read-out scanning period PRDO, the control signal RST is set at the H level so that the floating diffusion FD is reset through the reset transistor RST-Tr, and the signal in the reset state is read out in the reading period PRD1 after this reset period PR. After the reading period PRD1, during a predetermined period, the control signal TGSL or TGLS is set at the H level, so that the charges stored in the photodiode PDSL or PDLS are transferred to the floating diffusion FD through the transfer transistor TGSL-Tr or TGLS-Tr. As a result, in the reading period PRD2 after this transfer period PT, a signal is read out that is determined by the stored electrons (charges).

In the normal pixel reading operation relating to the first embodiment, the storing period (exposure period) EXP is, for example, a period from when the photodiodes PDSL, PDLS and the floating diffusion FD are reset and the control signal TGSL or TGLS is switched to the L level in the shutter scanning period PSHT to when the control signal TGSL or TGLS is switched to the L level in order to terminate the transfer period PT of the read-out scanning period PRD0, as shown in FIG. 6B.

The reading circuit 40 includes a plurality of column signal processing circuits (not shown) arranged corresponding to the column outputs of the pixel part 20, and the reading circuit 40 may be configured such that the plurality of column signal processing circuits can perform column parallel processing.

The reading circuit 40 may include a correlated double sampling (CDS) circuit, an analog-digital converter (ADC), an amplifier (AMP), a sample/hold (S/H) circuit, and the like.

Figure 7A:
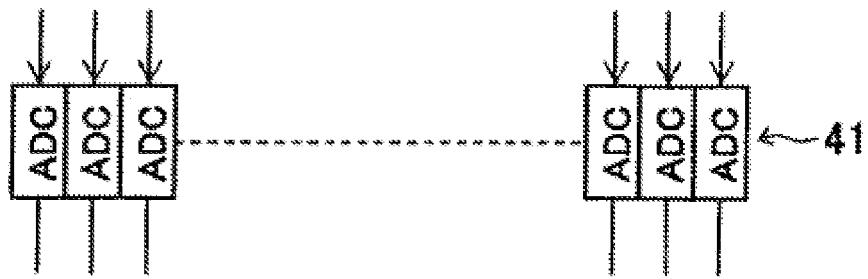
FIGS. 7A to 7C are used to illustrate example configurations of a column output reading system in a pixel part of the solid-state imaging device relating to the first embodiment of the present invention.
Figure 7B:
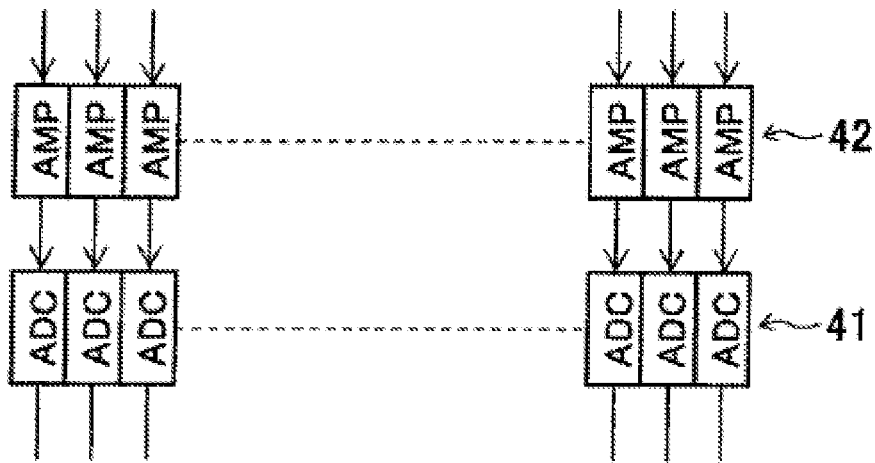
Figure 7C:
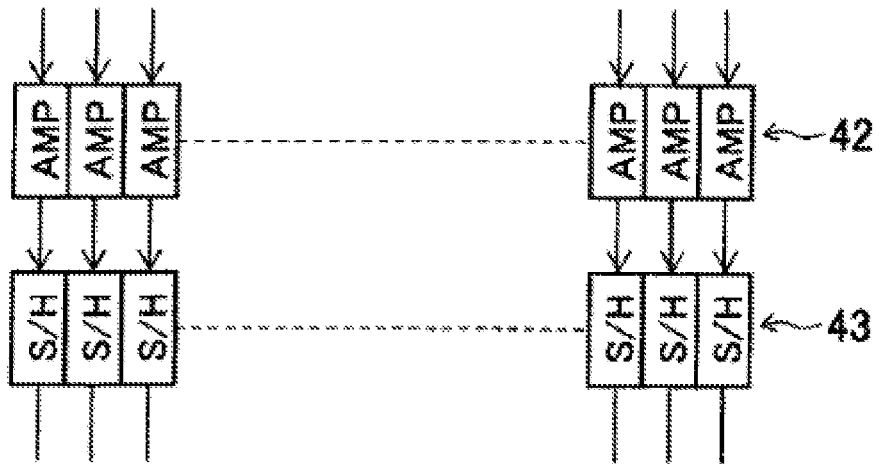

As mentioned above, as shown in FIG. 7A, for example, the reading circuit 40 may include ADCs 41 for converting the read-out signals VSL from the column outputs of the pixel part 20 into digital signals. Alternatively, as shown in FIG. 7B, for example, the reading circuit 40 may include amplifiers (AMPs) 42 for amplifying the read-out signals VSL from the column outputs of the pixel part 20. It is also possible that, as shown in FIG. 7C, for example, the reading circuit 40 may include sample/hold (S/H) circuits 43 for sampling/holding the read-out signals VSL from the column outputs of the pixel part 20.

The reading circuit 40 is applicable not only to a solid-state imaging device (CMOS image sensor) employing a rolling shutter as an electronic shutter but also to a solid-state imaging device (CMOS image sensor) employing a global shutter as an electronic shutter.

In a CMOS image sensor employing a global shutter as the electronic shutter, a pixel has therein a signal retaining part for retaining, in a sample-and-hold capacitor, a signal that is read out from a photoelectric conversion reading part, for example. The CMOS image sensor employing a global shutter stores the charges from the photodiodes in the sample-and-hold capacitors of the signal retaining parts at the same time in the form of voltage signals and subsequently sequentially read the voltage signals. In this way, the simultaneity is reliably achieved across the entire image. This CMOS image sensor is provided, for example, as a stacked CMOS image sensor.

The stacked CMOS image sensor has a stacked structure in which a first substrate (a pixel die) and a second substrate (an ASIC die) are connected through microbumps (connecting parts), for example. The first substrate has photoelectric conversion reading parts for individual pixels formed therein, and the second substrate has signal retaining parts for the individual pixels, signal lines, a vertical scanning circuit, a horizontal scanning circuit, a reading circuit and the like formed therein. Each of the pixels formed in the first substrate is connected to a corresponding one of the signal retaining parts formed in the second substrate, and the signal retaining parts are connected to the reading circuit 40 including the above-described ADCs and S/H circuits.

The horizontal scanning circuit 50 scans the signals processed in the plurality of column signal processing circuits of the reading circuit 40 such as ADCs, transfers the signals in a horizontal direction, and outputs the signals to a signal processing circuit (not shown).

The timing control circuit 60 generates timing signals required for signal processing in the pixel part 20, the vertical scanning circuit 30, the reading circuit 40, the horizontal scanning circuit 50, and the like.

In the first embodiment, the reading part 70 can perform read-out scanning including: reading, in a reading period following a reset period PR in which the floating diffusion FD is reset, a signal in the reset state; and reading, in a reading period following a transfer period PT in which the charges stored in the first photodiode PDSL or the second photodiode PDLS are transferred to the floating diffusion FD through the first transfer transistor TGSL-Tr or the second transfer transistor TGLS-Tr after the reading period following the reset period, a signal determined by the stored charges. Here, the first photodiode PDSL has a first well capacity and a first responsivity and the second photodiode has a second well capacity and a second responsivity. The reading part 70 is configured to be capable of performing at least one selected from the group consisting of first conversion gain mode reading and second conversion gain mode reading in a single reading period. In the first conversion gain mode reading, the reading part 70 reads pixel signals with a first conversion gain (for example, a high gain or HCG) corresponding to a first capacitance set by the capacitance changing part. In the second conversion gain mode reading, the reading part 70 reads pixel signals with a second conversion gain (for example, a low gain or LCG) corresponding to a second capacitance set by the capacitance changing part.

The above description has outlined the configurations and functions of the parts of the solid-state imaging device 10. Next, a detailed description will be given of the configuration of the capacitance changing part 80 relating to the first embodiment and the relating reading operations and the like.

The capacitance changing part 80 relating to the first embodiment includes a capacitor C81 and a switching transistor SW81-Tr that is connected between the capacitor C81 and the floating diffusion FD and that serves as a switch element to be turned on or off depending on a capacitance changing signal BIN applied to the gate thereof through a control line LBIN.

The capacitor C81 is connected between (i) a connection node ND81 between the reset transistor RST-Tr and the switching transistor SW81-Tr and (ii) the reference potential VSS. The switching transistor SW81-Tr is connected between the connection node ND81 and the floating diffusion FD.

Figure 8:
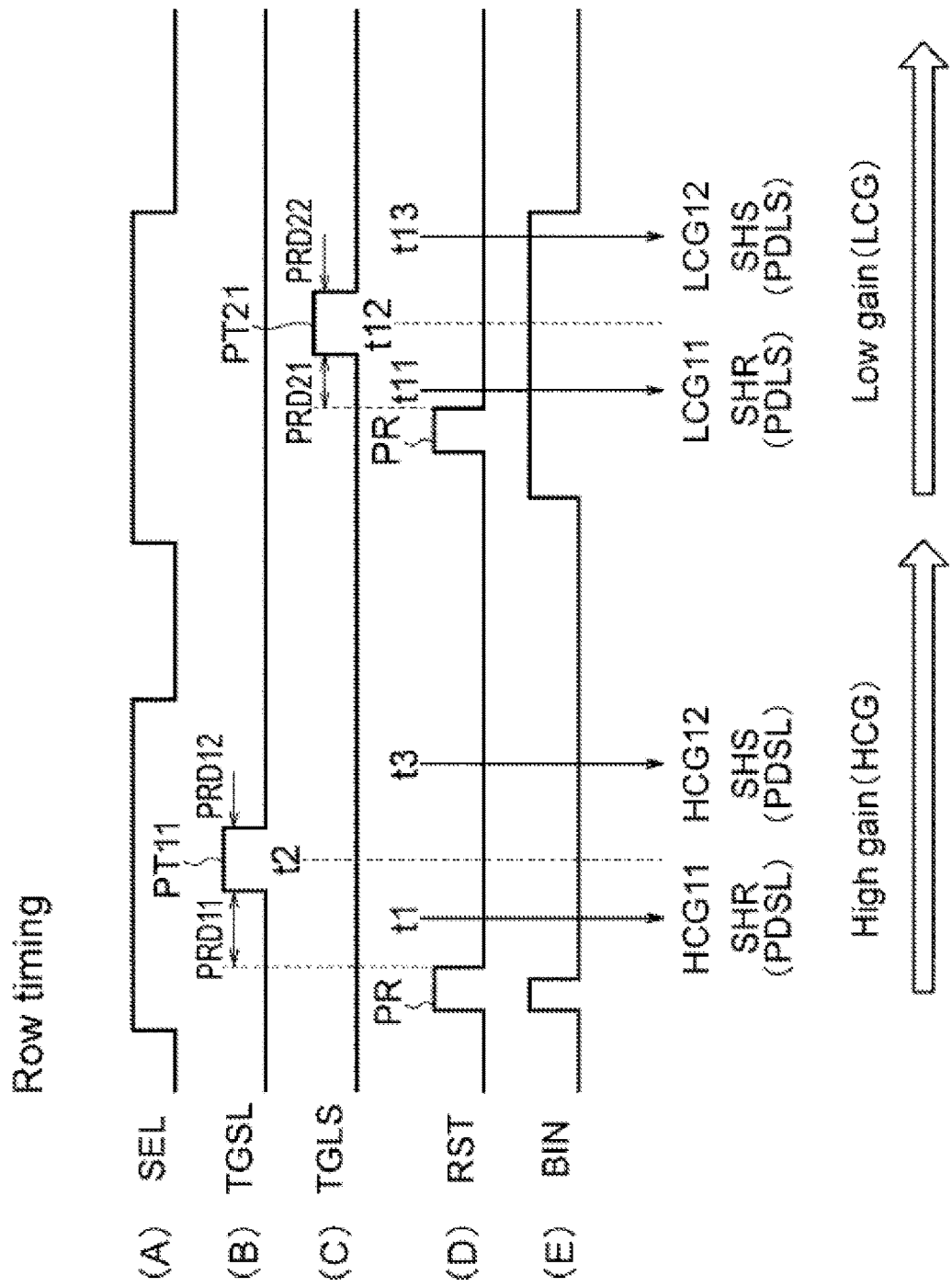
FIG. 8 is used to illustrate how to realize conversion-gain-based dynamic range widening when a capacitor and a switch are used to form a capacitance changing part relating to the first embodiment and includes parts (A) to (E).

The following describes a conversion-gain-dependent reading operation performed when a capacitor and a switch are used to form the capacitance changing part relating to the first embodiment, with reference to FIG. 8.

FIG. 8 is used to illustrate a conversion-gain-dependent reading operation performed when a capacitor and a switch are used to form the capacitance changing part relating to the first embodiment and includes parts (A) to (E). In FIG. 8, the part (A) shows the control signal SEL for the selection transistor SEL-Tr, the part (B) shows the control signal TGSL for the first transfer transistor TGSL-Tr, the part (C) shows the control signal TGLS for the second transfer transistor TGLS-Tr, the part (D) shows the control signal RST for the reset transistor RST-Tr, and the part (E) shows the control signal BIN for the switching transistor SW81-Tr.

<Reading Operation in First Conversion Gain Mode>

In the first conversion gain mode, the following reading operation is performed. In the read-out scanning period PRDO, as shown in the part (A) in FIG. 8, one of the rows in the array of pixels is selected by setting the control signal SEL on the control line connected to the pixels PXL in the to-be-selected row at the H level, so that the selection transistors SEL-TR in the pixels PXL are brought into the conduction state. While the above selection is made, in the reset period PR, the reset transistor RST-Tr remains selected and in the conduction state during a period in which the control signal RST is at the H level, the switching transistor SW81-Tr of the capacitance changing part 80 remains selected and in the conduction state during the period in which the capacitance changing signal BIN is at the H level, and the floating diffusion FD is reset to the potential of the power supply line VDD. After the floating diffusion FD is reset, as shown in the parts (E) and (D) in FIG. 8, the capacitance changing signal BIN is switched to the L level, so that the switching transistor SW81-Tr of the capacitance changing part 80 is brought into the non-conduction state. Then, the control signal RST is switched to the L level, so that the reset transistor RST-Tr is brought into the non-conduction state and the reset period PR ends. After the reset period PR has elapsed, the reset transistor RST-Tr is brought into the non-conduction state. A first reading period PRD11 then starts and lasts until the transfer period PT starts. In the first reading period PRD11, the pixel signal in the reset state is read out. In this way, the switching transistor SW81-Tr of the capacitance changing part 80 remains in the non-conduction state, so that the capacitor C81 remains non-connected to the floating diffusion FD. In this way, the capacitance of the floating diffusion FD (the quantity of the charges) is kept at the first capacitance.

At a timing t1 after the first reading period PRD11 starts, while the capacitance changing signal BIN is at the L level, the reading part 70 performs first high conversion gain mode reading HCG11 for reading the pixel signal with a high conversion gain (a first conversion gain: HCG), which is obtained by changing the capacitance (the quantity of the charges) of the floating diffusion FD to the first capacitance. At this timing, in each pixel PXL, the source follower transistor SF-Tr converts the charges at the floating diffusion FD into a voltage signal with a gain corresponding to the quantity of the charges (potential), and the voltage signal is output to the vertical signal line LSGN as a read-out signal VSL (HCG11) of a column output, fed to the reading circuit 40 and then retained, for example.

At this point, the first reading period PRD11 ends and the transfer period PT11 starts. Here, the capacitance changing signal BIN is retained at the L level even after the transfer period PT11 has elapsed. As shown in the part (B) in FIG. 8, in the transfer period PT11, the transfer transistor TGSL-Tr remains selected and in the conduction state during the period in which the control signal TGSL is at the H level, and in a period including a timing t2, the charges (electrons) produced by photoelectric conversion and stored at the first photodiode PDSL are transferred to the floating diffusion FD. After the transfer period PT11 has elapsed (or after the transfer transistor TGSL-Tr is brought into the non-conduction state), a second reading period PRD12 starts, in which the pixel signal corresponding to the charges produced by the photoelectric conversion and stored in the first photodiodes PDSL is read out.

At a timing t3 after the second reading period PRD12 starts, while the capacitance changing signal BIN is set at the L level, the reading part 70 performs second high conversion gain mode reading HCG12 for reading the pixel signal with a high conversion gain (first conversion gain: HCG), which is obtained by setting the capacitance (the quantity of the charges) of the floating diffusion FD at the first capacitance. At this timing, in each pixel PXL, the source follower transistor SF-Tr converts the charges at the floating diffusion FD into a voltage signal with a gain corresponding to the quantity of the charges (potential), and the voltage signal is output to the vertical signal line LSGN as a read-out signal VSL (HCG12) of a column output, fed to the reading circuit 40 and then retained, for example.

After this, the reading circuit 40, which constitutes part of, for example, the reading part 70, calculates the difference {VSL(HCG12)−VSL(HCG11)} between the read-out signal VSL (HCG12) obtained in the second high conversion gain mode reading HCG12 and the read-out signal VSL (HCG11) obtained in the first high conversion gain mode reading HCG11 and performs the CDS.

<Reading Operation in Second Conversion Gain Mode>

In the second conversion gain mode, the following reading operation is performed. In the read-out scanning period PRDO, as shown in the part (A) in FIG. 8, one of the rows in the array of pixels is selected by setting the control signal SEL on the control line connected to the pixels PXL in the to-be-selected row at the H level, so that the selection transistor SEL-Tr in the pixels PXL is brought into the conduction state. While the above selection is made, the switching transistor SW81-Tr of the capacitance changing part 80 remains selected and in the conduction state during the period in which the capacitance changing signal BIN is at the H level. In this way, the switching transistor SW81-Tr of the capacitance changing part 80 remains in the conduction state, so that the capacitor C81 remains connected to the floating diffusion FD. In this way, the capacitance (the quantity of the charges) of the floating diffusion FD is set (changed) to the second capacitance. In the reset period PR, the reset transistor RST-Tr remains selected and in the conduction state during a period in which the control signal RST is at the H level, the switching transistor SW81-Tr of the capacitance changing part 80 remains selected and in the conduction state during the period in which the capacitance changing signal BIN is at the H level, and the floating diffusion FD is reset to the potential of the power supply line VDD. After the floating diffusion FD is reset, as shown in the parts (D) and (E) in FIG. 8, the capacitance changing signal BIN is kept at the H level, so that the switching transistor SW81-Tr of the capacitance changing part 80 remains in the conduction state. Then, the control signal RST is switched to the L level, so that the reset transistor RST-Tr is brought into the non-conduction state and the reset period PR ends. After the reset period PR has elapsed, the reset transistor RST-Tr is brought into the non-conduction state. A first reading period PRD21 then starts and lasts until the transfer period PT starts. In the first reading period PRD21, the pixel signal in the reset state is read out. In this period, the switching transistor SW81-Tr of the capacitance changing part 80 remains in the conduction state, so that the capacitor C81 remains connected to the floating diffusion FD. In this way, the capacitance (the quantity of the charges) of the floating diffusion FD is kept at the second capacitance.

At a timing t11 after the first reading period PRD21 starts, while the capacitance changing signal BIN is set at the H level, the reading part 70 performs first low conversion gain mode reading LCG11 for reading the pixel signal with a low conversion gain (second conversion gain: LCG), which is obtained by changing the capacitance (the quantity of the charges) of the floating diffusion FD to the second capacitance. At this timing, in each pixel PXL, the source follower transistor SF-Tr converts the charges at the floating diffusion FD into a voltage signal with a gain corresponding to the quantity of the charges (potential), and the voltage signal is output to the vertical signal line LSGN as a read-out signal VSL (LCG11) of a column output, fed to the reading circuit 40 and then retained, for example.

At this point, the first reading period PRD21 ends and the transfer period PT21 starts. Here, the capacitance changing signal BIN is retained at the H level even after the transfer period PT21 has elapsed. As shown in the part (C) in FIG. 8, in the transfer period PT21, the transfer transistor TGLS-Tr remains selected and in the conduction state during the period in which the control signal TGLS is at the H level, and in a period including a timing t12, the charges (electrons) produced by photoelectric conversion and stored at the second photodiode PDLS are transferred to the floating diffusion FD. After the transfer period PT21 has elapsed (or after the transfer transistor TGLS-Tr is brought into the non-conduction state), a second reading period PRD22 starts, in which the pixel signal corresponding to the charges produced by the photoelectric conversion and stored in the second photodiodes PDLS is read out.

At a timing t13 after the second reading period PRD22 starts, while the capacitance changing signal BIN is set at the H level, the reading part 70 performs second low conversion gain mode reading LCG12 for reading the pixel signal with a low conversion gain (second conversion gain: LCG), which is obtained by setting the capacitance (the quantity of the charges) of the floating diffusion FD at the second capacitance. At this timing, in each pixel PXL, the source follower transistor SF-Tr converts the charges at the floating diffusion FD into a voltage signal with a gain corresponding to the quantity of the charges (potential), and the voltage signal is output to the vertical signal line LSGN as a read-out signal VSL (LCG12) of a column output, fed to the reading circuit 40 and then retained, for example.

After this, the reading circuit 40, which constitutes part of, for example, the reading part 70, calculates the difference {VSL(LCG12)−VSL(LCG11)} between the read-out signal VSL (LCG12) obtained in the second low conversion gain mode reading LCG12 and the read-out signal VSL (LCG11) obtained in the first low conversion gain mode reading LCG11 and performs the CDS.

As described above, according to the first embodiment, the pixel PXL includes, for example, a plurality of (in the first embodiment, two) photoelectric converting parts (photoelectric converting elements) having different well capacities and responsivities, or the first photodiode PDSL and the second photodiode PDLS and a plurality of (in the first embodiment, two) transfer elements for transferring the charges stored in the corresponding photodiodes to the floating diffusion FD, or the transfer transistors TGSL-Tr, TGLS-Tr. In each pixel PXL, the first photodiode PDSL has a first well capacity and a first responsivity, and the second photodiode PDLS has a second well capacity and a second responsivity, which are respectively different from the first well capacity and the first responsivity of the first photodiode PDSL. The first well capacity of the first photodiode PDSL is smaller than the second well capacity of the second photodiode PDLS, and the first responsivity of the first photodiode PDSL is larger than the second responsivity of the second photodiode PDLS. In the solid-state imaging device 10 relating to the first embodiment, the pixels (or the pixel part 20) arranged in a matrix pattern in the pixel part 20 each includes a capacitance changing part for changing the capacitance of the floating diffusion depending on a capacitance changing signal. In this way, the capacitance changing part can set (change) the capacitance of the floating diffusion in a predetermined period within a single reading period following a single charge storing period (exposure period), so that the solid-state imaging device 10 can change the conversion gain within this reading period.

With the above-described configurations, according to the first embodiment, when a dark signal (a signal obtained when the illuminance is low) is read out using the first photodiode PDSL having a large responsivity, the capacitance of the floating diffusion FD is changed to a smaller capacitance in order to read the first photodiode PDSL and to a larger capacitance in order to read the second photodiode PDLS. As a result, while the SNR of the first photodiode PDSL is prevented from deteriorating, the read-out noise can be reduced. In other words, the first embodiment can realize a widened dynamic range, prevent the read-out noise from affecting the performance, and eventually achieve improved image quality.

Figure 1:
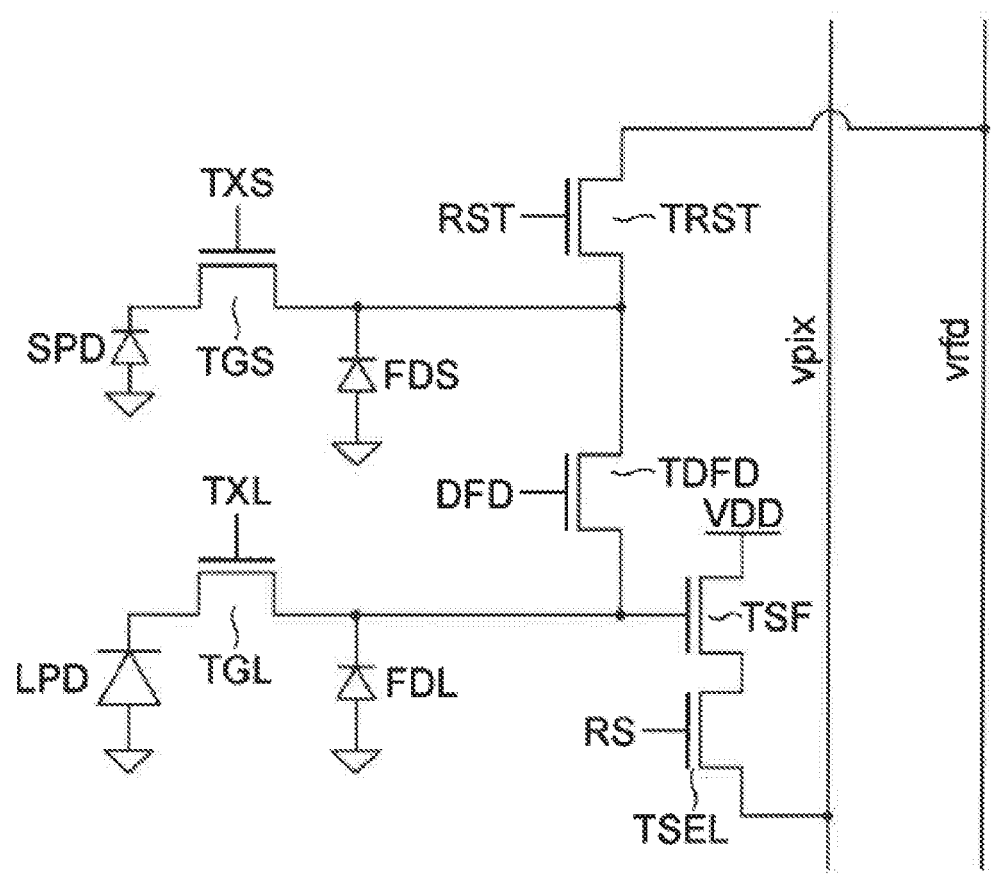
FIG. 1 shows a configuration of a pixel of a CMOS image sensor disclosed in Non-Patent Literature 1.
Figure 2:
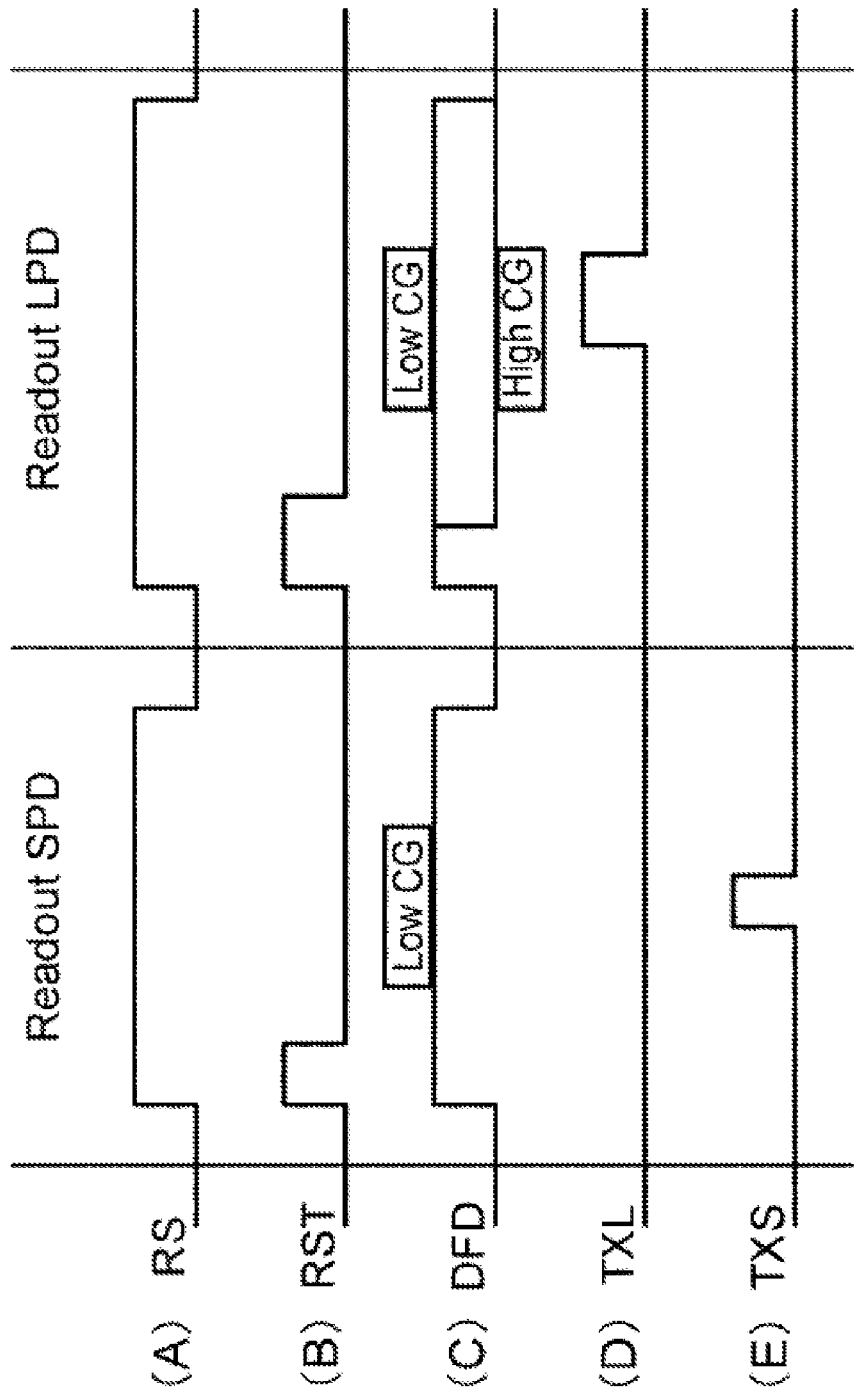
FIG. 2 is a timing chart including parts (A) to (E) to illustrate a reading operation for the pixel in FIG. 1.

The following now describes the input/output characteristics and SNR characteristics of the high gain signal and the low gain signal produced in the solid-state imaging device 10 of the first embodiment in relation to the exposure, with reference to FIGS. 9 to 13 in comparison with a comparative example. According to the comparative example, the pixel includes a small photodiode PDSS (SPD) having a small responsivity and a small well capacity and a large photodiode PDLL (LPD) having a large responsivity and a large well capacity, similarly to the pixel shown in FIG. 1.

Figure 9:
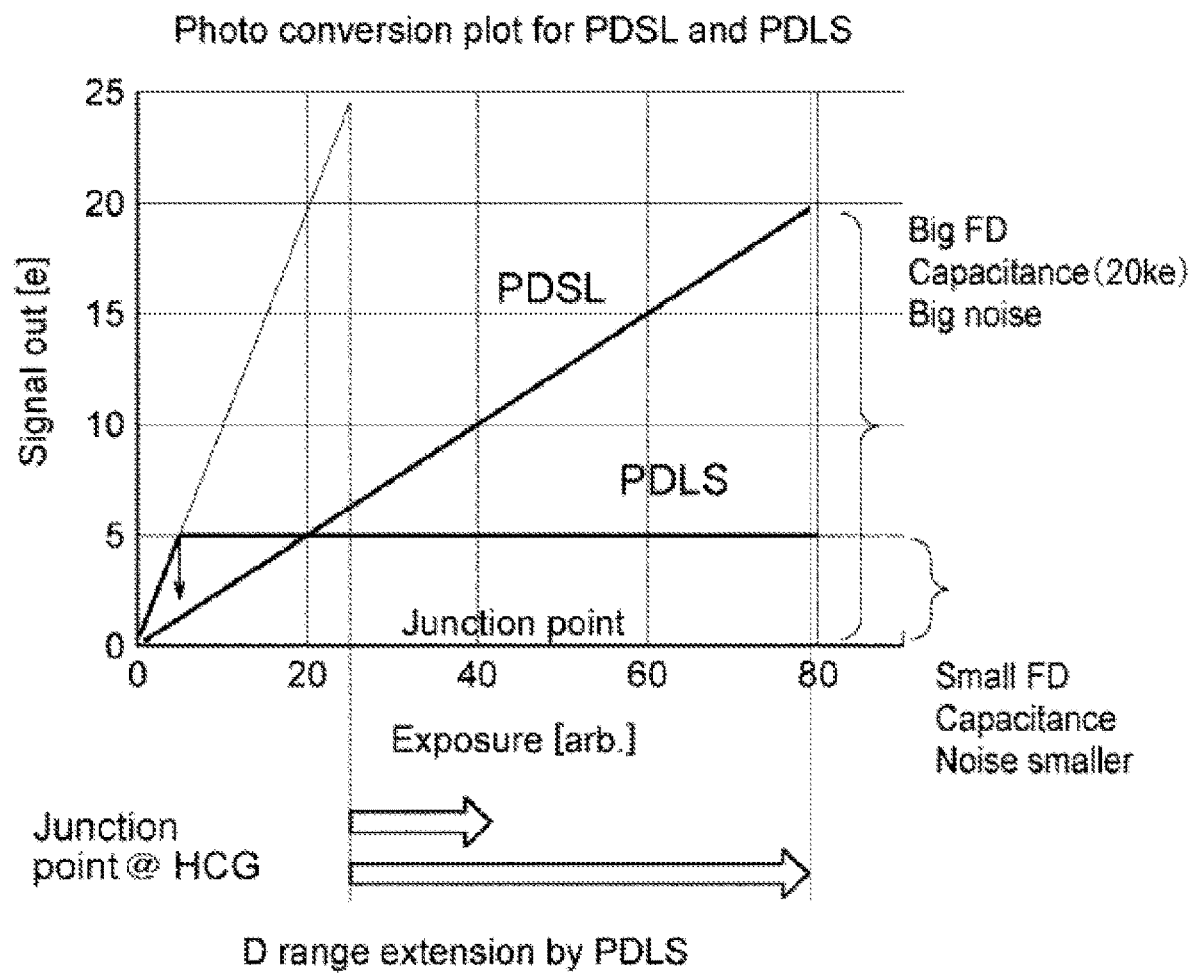
FIG. 9 shows the input/output characteristics of a high gain signal and a low gain signal in the solid-state imaging device relating to the first embodiment of the present invention and is used to illustrate how the capacitance of the floating diffusion is related to the read-out noise.
Figure 10:
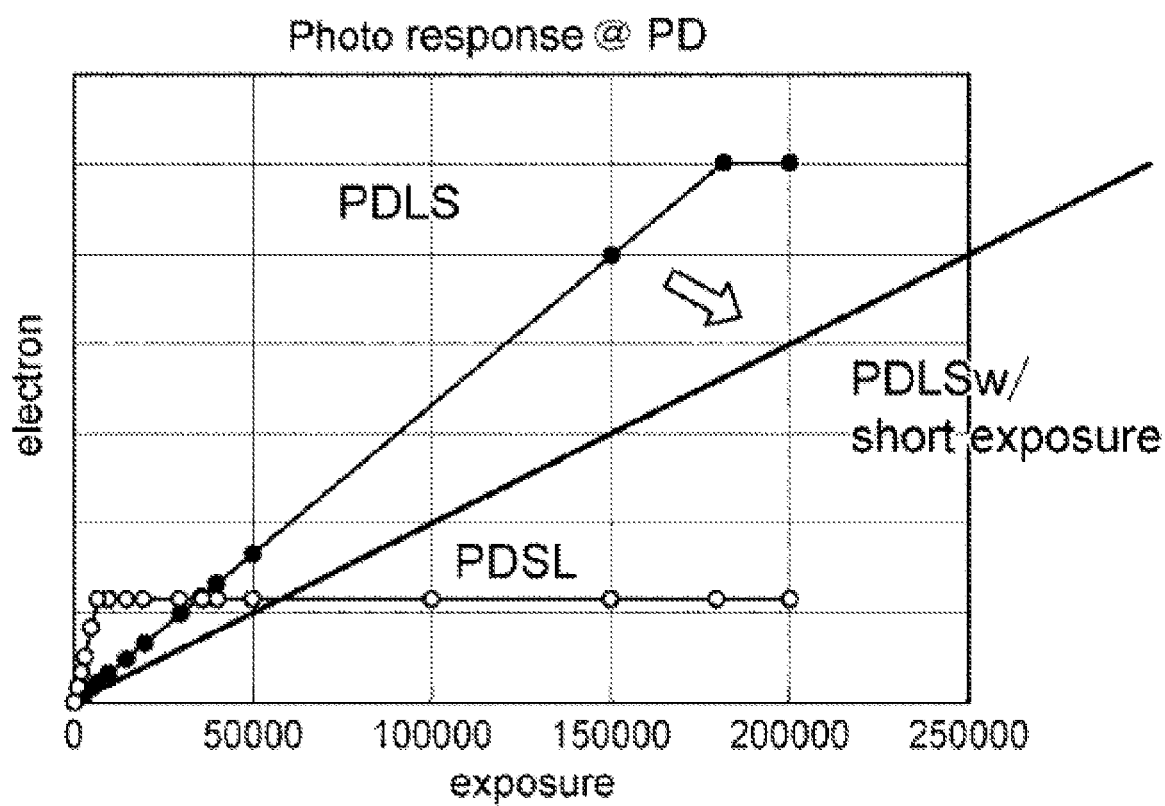
FIG. 10 shows the responsivity characteristics of the high gain signal and the low gain signal in the solid-state imaging device relating to the first embodiment of the present invention.
Figure 11:
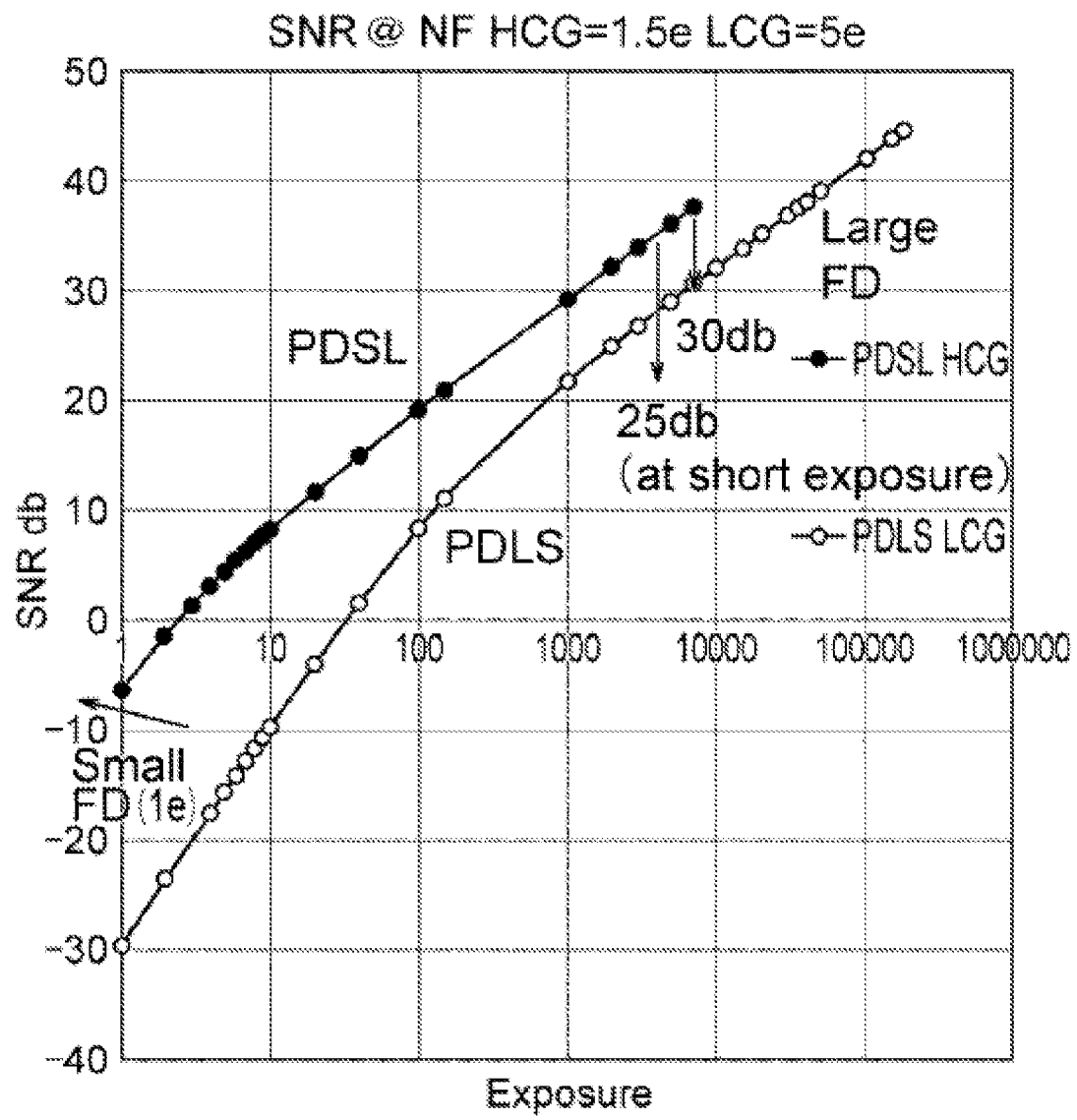
FIG. 11 shows the SNR characteristics of the high gain signal and the low gain signal in the solid-state imaging device relating to the first embodiment of the present invention.
Figure 12:
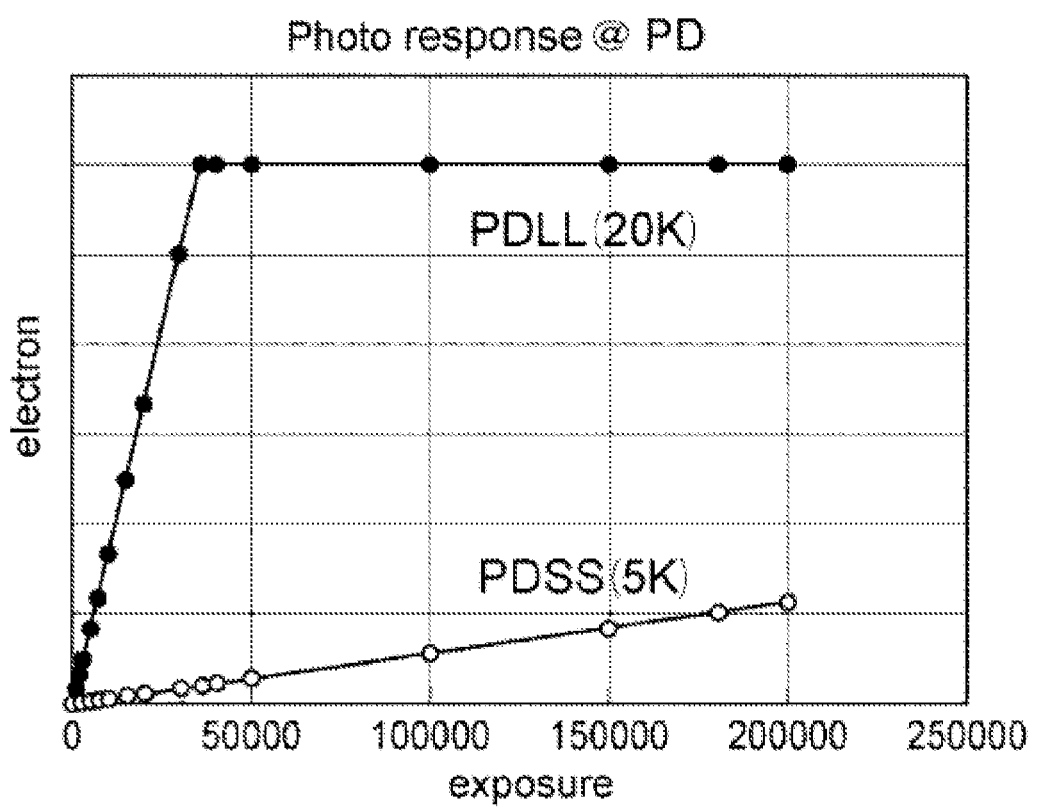
FIG. 12 shows the responsivity characteristics of a high gain signal and a low gain signal in a solid-state imaging device relating to a comparative example.
Figure 13:
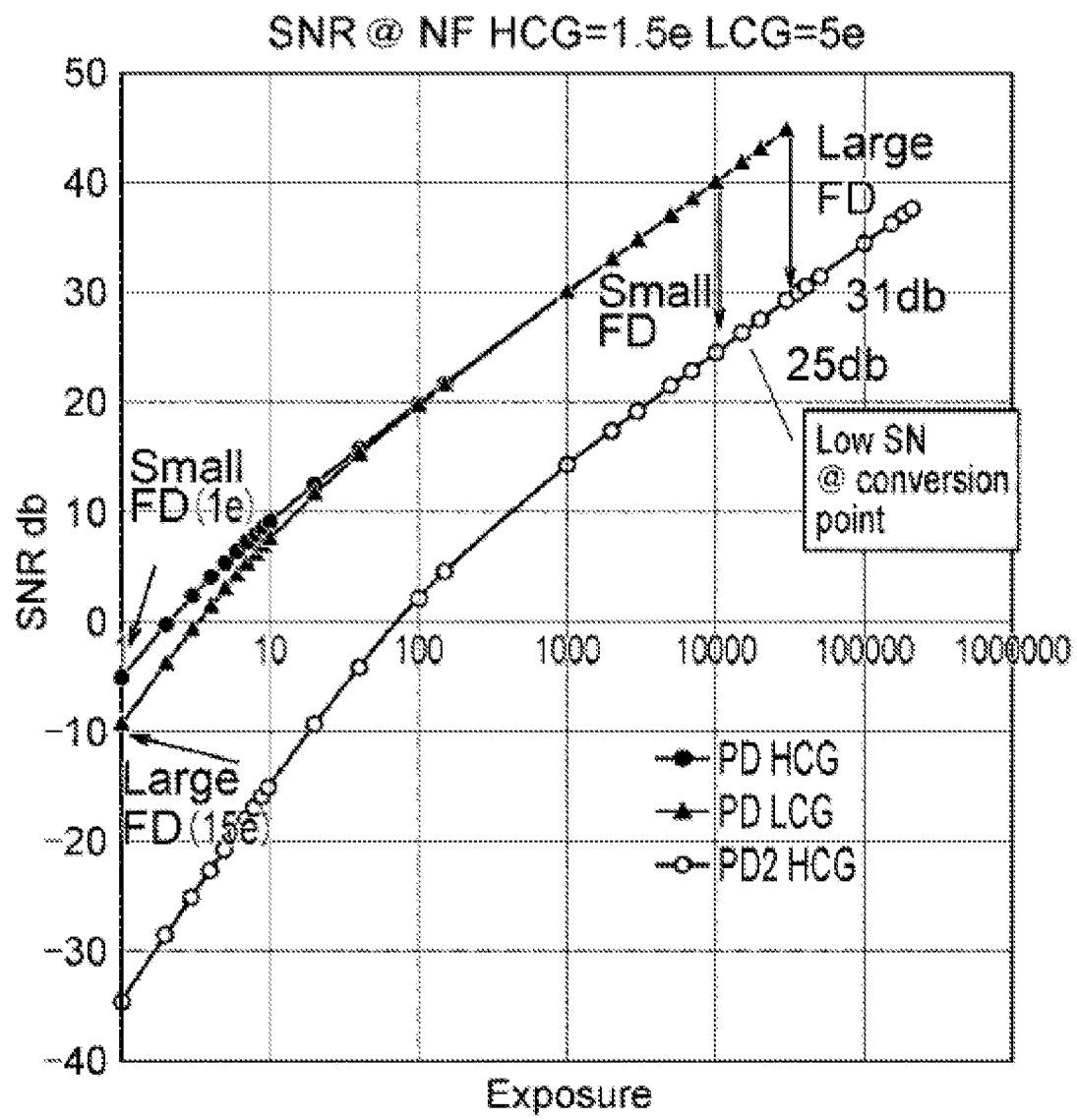
FIG. 13 shows the SNR characteristics of the high gain signal and the low gain signal in the solid-state imaging device relating to the comparative example.

FIG. 9 shows the input/output characteristics of the high gain signal and the low gain signal produced in the solid-state imaging device 10 relating to the first embodiment of the present invention and is used to illustrate how the capacitance of the floating diffusion FD is related to the read-out noise. In FIG. 9, the horizontal axis represents the amount of the exposure (time) and the vertical axis represents the output signal level after the charge-to-voltage conversion. FIG. 10 shows the responsivity characteristics of the high gain signal and the low gain signal produced in the solid-state imaging device 10 relating to the first embodiment of the present invention. In FIG. 10, the horizontal axis represents the amount of the exposure (time) and the vertical axis represents the amount of the charges (electrons). FIG. 11 shows the SNR characteristics of the high gain signal and the low gain signal produced in the solid-state imaging device 10 relating to the first embodiment of the present invention. In FIG. 11, the horizontal axis represents the amount of the exposure (time) and the vertical axis represents the SNR. FIG. 12 shows the responsivity characteristics of a high gain signal and a low gain signal produced in a solid-state imaging device relating to the comparative example. In FIG. 12, the horizontal axis represents the amount of the exposure (time) and the vertical axis represents the amount of the charges (electrons). FIG. 13 shows the SNR characteristics of the high gain signal and the low gain signal produced in the solid-state imaging device relating to the comparative example. In FIG. 13, the horizontal axis represents the amount of the exposure (time) and the vertical axis represents the SNR.

According to the comparative example, as shown in FIGS. 12 and 13, when a dark signal (a signal obtained when the illuminance is low) is read out using the PDLL (LPD) having a large responsivity, the read-out noise deteriorates since the floating diffusion FD has a large capacitance. Here, the floating diffusion FD needs to have a larger capacitance in order to read all the signals. On the other hand, the read-out noise can be reduced by reducing the capacitance of the floating diffusion FD for the large photodiode PDLL (LPD). This, however, deteriorates the SNR gap for the reading of the other photodiode PDSS (SPD).

According to the solid-state imaging device 10 relating to the first embodiment, on the other hand, as shown in FIGS. 9 to 11, a widened dynamic range can be realized. In addition, when a dark signal is read out using the first photodiode PDSL having a large responsivity, the capacitance of the floating diffusion FD is changed to a small capacitance in order to read the first photodiode PDSL and to a large capacitance in order to read the second photodiode PDLS. In this way, while the SNR of the first photodiode PDSL is prevented from deteriorating, the read-out noise can be reduced.

According to the solid-state imaging device 10 relating to the first embodiment, the photoelectric converting part of the second photodiode 240 (PDLS) of the pinned type includes the p+ layers (second-conductivity-type semiconductor layers) 2323, 2333 having a junction capacitance component with the n layer (first-conductivity-type semiconductor layer) 2412, so that the horizontal (the direction orthogonal to the normal to the substrate) pn junction portion can be present in the pixel. This can advantageously increase the to-be-stored capacitance efficiently.

Second Embodiment

Figure 14:
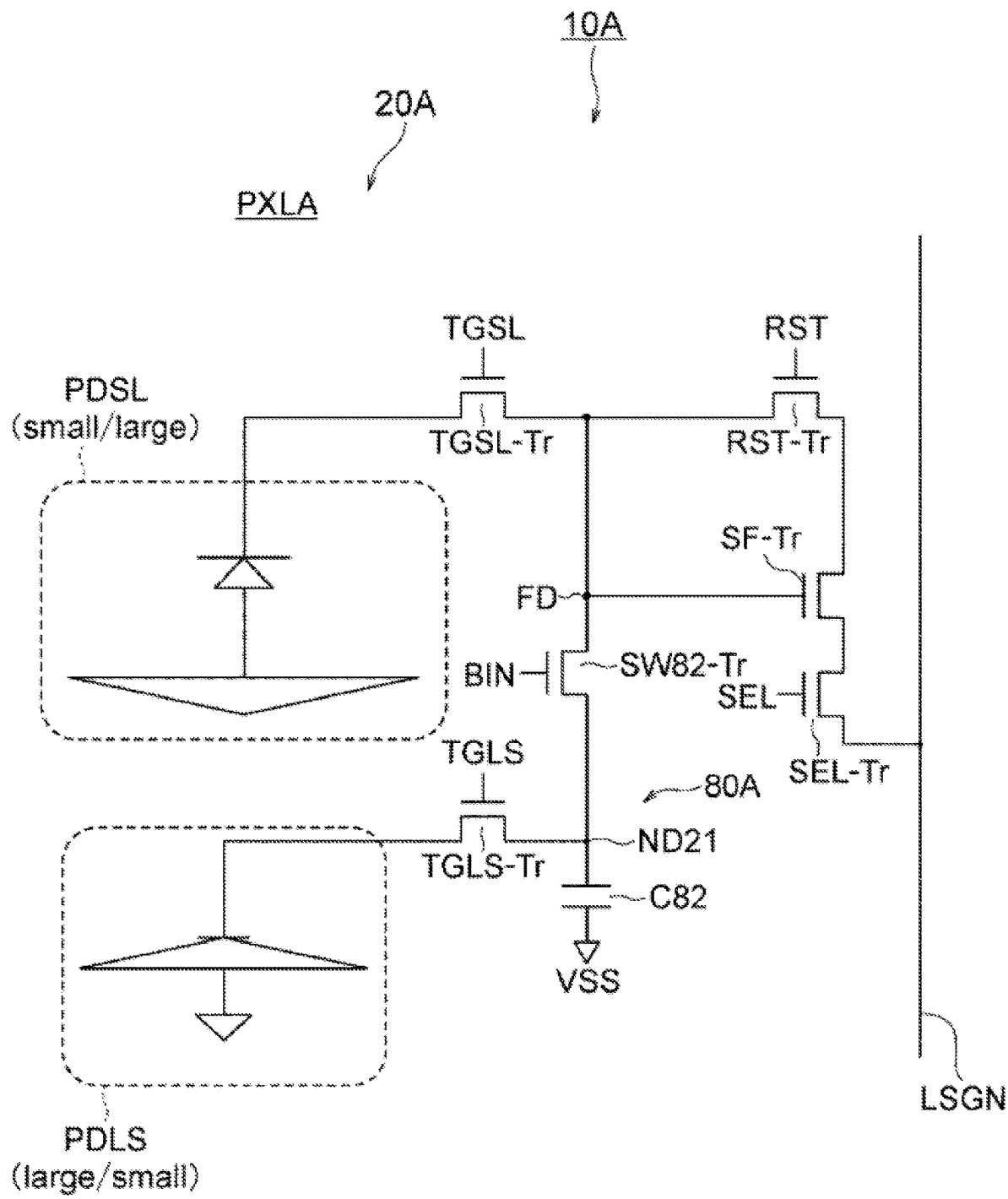
FIG. 14 shows an example configuration of a pixel part and a capacitance changing part relating to a second embodiment of the present invention.

FIG. 14 shows an example configuration of a pixel part and a capacitance changing part relating to a second embodiment of the present invention.

The pixel PXLA and capacitance changing part 80A relating to the second embodiment differ from the capacitance changing part 80 relating to the first embodiment in the following points.

In the solid-state imaging device 10A relating to the second embodiment, the capacitance changing part 80A includes a capacitor C82 and a switching transistor SW82-Tr as shown in FIG. 14. The capacitor C82 is connected to the output node ND21 of the second transfer transistor TGLS-Tr, and the switching transistor SW82-Tr is connected between the output node ND21 of the second transfer transistor TGLS-Tr and the floating diffusion FD, and serves as a switch element to be turned on or off depending on the capacitance changing signal BIN.

The conversion-gain-dependent reading operation performed when a capacitor and a switch are used to form the capacitance changing part relating to the second embodiment is performed in the same manner as the conversion gain dependent reading operation relating to the first embodiment described with reference to FIG. 8. Therefore, the reading operation is not described in detail here.

The second embodiment can produce the same effects as the above-described first embodiment.

Third Embodiment

Figure 15:
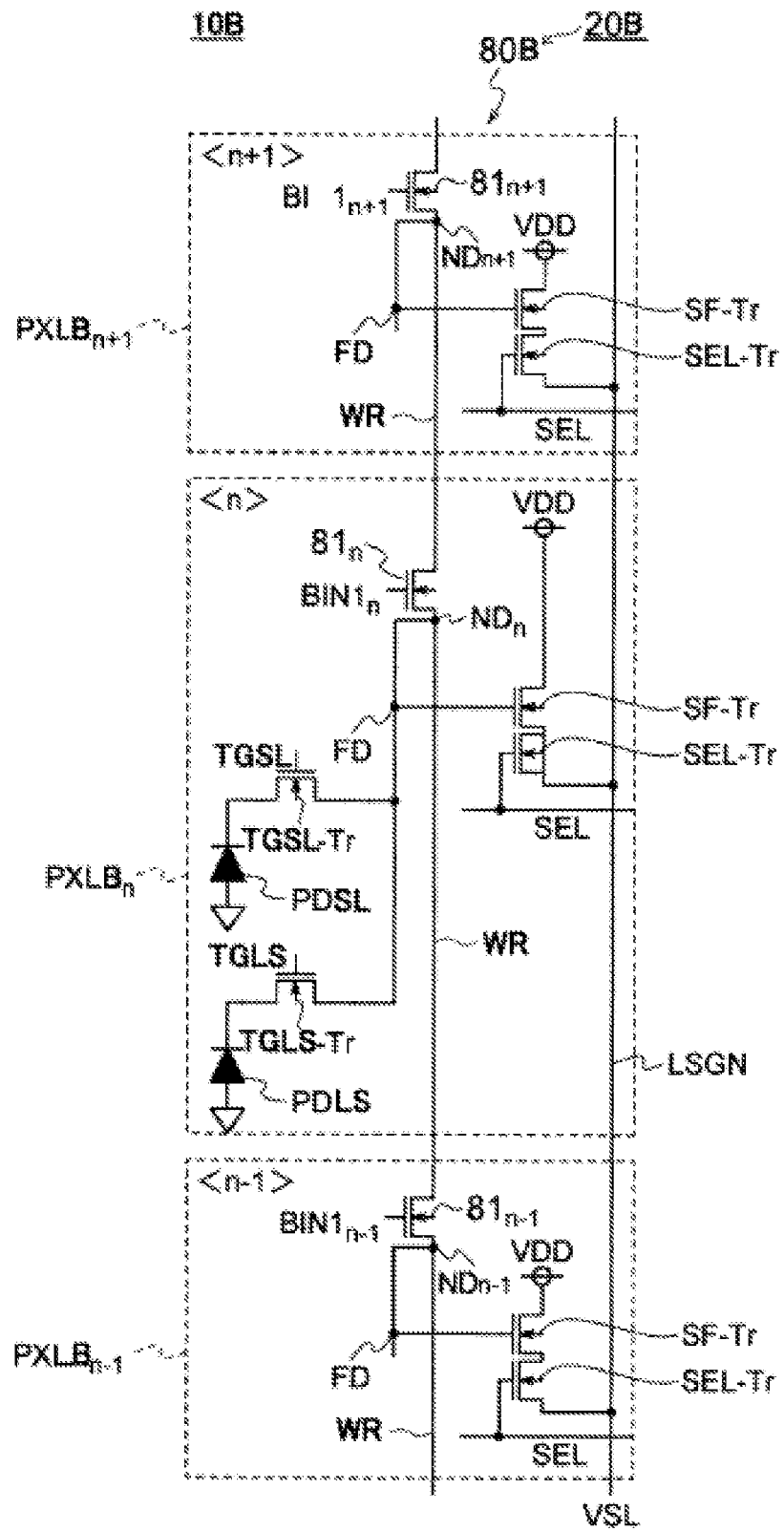
FIG. 15 shows an example configuration of a pixel part and a capacitance changing part relating to a third embodiment of the present invention.

FIG. 15 shows an example configuration of a pixel part and a capacitance changing part relating to a third embodiment of the present invention.

The pixel PXLB and capacitance changing part 80B relating to the third embodiment differ from the capacitance changing parts 80 and 80A relating to the first and second embodiments in the following points.

According to the third embodiment, the capacitance changing part 80B is constituted not by a capacitor but by first binning switches 81n−1, 81n and 81n+1 that are connected to (arranged in) wiring patterns WR formed between floating diffusions FD of a plurality of pixels PXLBn−1, PXLBn and PXLBn+1 adjacent to each other in the column direction and a first binning switch (not shown) connected between the floating diffusion FD of the pixel PXLBn+1 and the power supply line VDD.

In the third embodiment, the first binning switches 81 ( . . . , n−1, n, n+1, . . . ) are formed by using insulated gate field effect transistors, for example, n-channel MOS (NMOS) transistors. In the following description, the binning switches may be referred to as binning transistors.

In the third embodiment, capacitance changing signals BIN1n−1, BIN1n, and BIN1n+1 turn on or off the first binning switches 81n−1, 81n and 81n+1 to set the number of the floating diffusions FD connected to each other to one or more, which results in changing the capacitance of the floating diffusion FD in the pixel to be read out and changing the conversion gain of the floating diffusion FD in the pixel PXLBn or PXLBn+1 to be read out.

In the third embodiment, all of the pixels in each column ( . . . , PXLBn−1, PXLBn, PXLBn+1, . . . ) share the reset element. For example, the floating diffusion FD of the pixel PXL BO (not shown in FIG. 15) at one of the ends in a given one of the columns is connected to the power supply line VDD (not shown in FIG. 15) in the vicinity of the pixel PXLBN−1 at the other end of the given one column via the first binning transistors (switches) ( . . . , 81n−1, 81n, 81n+1, . . . ), which are formed on the wiring patterns WR, correspond to the pixels and cascade connected, and the nodes ( . . . , NDn−1, NDn, Ndn+1, . . . ) on the wiring patterns WR between the first binning switches are connected to the floating diffusions FD of the corresponding pixels ( . . . , PXLBn−1, PXLBn, PXLBn+1, . . . ). In the third embodiment, the first binning transistor (switch) 81N−1, which is not shown, at the other end serves as a shared reset element.

With the above arrangement, the solid-state imaging device 10B relating to the third embodiment can flexibly change the number of floating diffusions FDs connected to each other, which results in excellent scalability of the dynamic range. The solid-state imaging device 10B relating to the third embodiment can adjust and optimize the capacitance of the floating diffusion FD, obtain an optimal conversion gain for a particular mode, optimize the SN at the point of changing the conversion gain, obtain desired output characteristics and eventually produce high-quality images. In addition, the solid-state imaging device 10B relating to the third embodiment has a small number of transistors in the pixels, which can raise the PD aperture and enhance the photoelectric conversion responsivity and the number of electrons to achieve saturation.

Fourth Embodiment

Figure 16:
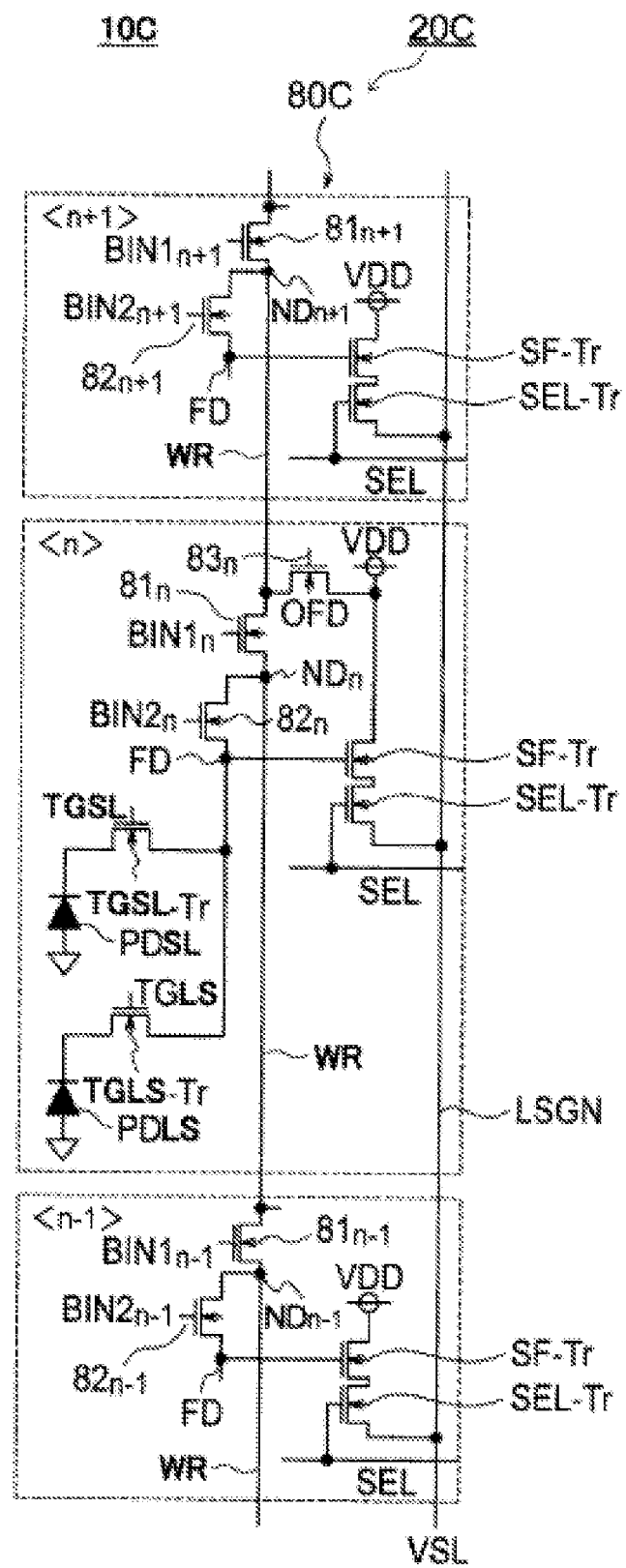
FIG. 16 shows an example configuration of a pixel part and a capacitance changing part relating to a fourth embodiment of the present invention.

FIG. 16 shows an example configuration of a pixel part and a capacitance changing part relating to a fourth embodiment of the present invention.

The pixel PXLC and capacitance changing part 80C relating to the fourth embodiment differ from the capacitance changing part 80B relating to the third embodiment in the following points.

In the fourth embodiment, in addition to the first binning transistors (binning switches) ( . . . , 81n−1, 81n, 81n+1, . . . ), which are formed on the wiring patterns WR, cascade connected, and correspond to the pixels, second binning transistors (binning switches) 82n−1, 82n, 82n+1 formed by, for example, NMOS transistors are connected between the floating diffusions FD of the pixels PXLCn−1, PXLCn, PXLCn+1 and the nodes NDn−1, NDn, NDn+1 on the wiring pattern WR.

The first binning transistors 81n−1, 81n, 81n+1 are respectively turned on or off selectively by first capacitance changing signals BIN1n−1, BIN1n, BIN1n+1, and the second binning transistors 82n−1, 82n, 82n+1 are respectively turned on or off selectively by second capacitance changing signals BIN2n−1, BIN2n, BIN2n+1. In the fourth embodiment, the first capacitance changing signals BIN1n−1, BIN1n, BIN1n+1 and the second capacitance changing signals BIN2n−1, BIN2n, BIN2n+1 form pairs and switched between the H level and the L level at the same timings (phases).

With the above arrangement, the first binning transistors 81n−1, 81n, 81n+1 are used to establish and cut off connections for the wiring patterns WR between adjacent FDs. The second binning transistors 82n−1, 82n, 82n+1 are arranged in the vicinity of the transfer transistors TG (SL, LS)-Tr of the pixels PXLCn−1, PXLCn, PXLCn+1 and used to minimize the parasitic capacitances of the floating diffusion FD nodes in the high conversion gain mode.

In the capacitance changing part 80C relating to the fourth embodiment, overflow drain (OFD) gates 83n−1, 83n, 83n+1 are connected between (i) the power supply line VDD and (ii) the connecting parts between the first binning transistors 81n−1, 81n, 81n+1 of the pixels PXLn−1, PXLn, PXLn+1 and the upper adjacent pixels.

The OFD gates 83n−1, 83n, 83n+1 can prevent, when the illuminance is high, the electrons (charges) overflowing from the photodiode PD to the floating diffusion FD from leaking to the adjacent pixels by discharging the overflowing electrons to the power supply lines (terminals).

By setting the voltage at the OFD gates 83n−1, 83n, 83n+1 higher than the voltage corresponding to the L level of the first capacitance changing signals BIN1n−1, BIN1n, BIN1n+1 and the second capacitance changing signals BIN2n−1, BIN2n, BIN2n+1, the electrons (charges) overflowing from the photodiode PD can be prevented from lowering the potential at the floating diffusions FD in the adjacent pixels.

The OFD gates 83n−1, 83n, 83n+1 may be used for resetting. In this case, the number of elements connected to the floating diffusion FD node is smaller than in the case where the reset element and the binning switch are included. Therefore, excellent characteristics can be obtained when the conversion gain is high.

The fourth embodiment can not only produce the same effects as the above-described third embodiment but also further optimize the capacitance of the floating diffusion FD, so that a further more optimal conversion gain can be obtained for a particular mode. In this way, the fourth embodiment can further optimize the SN at the point of changing the conversion gain, obtain desired output characteristics and eventually obtain high-quality images.

Fifth Embodiment

Figure 17:
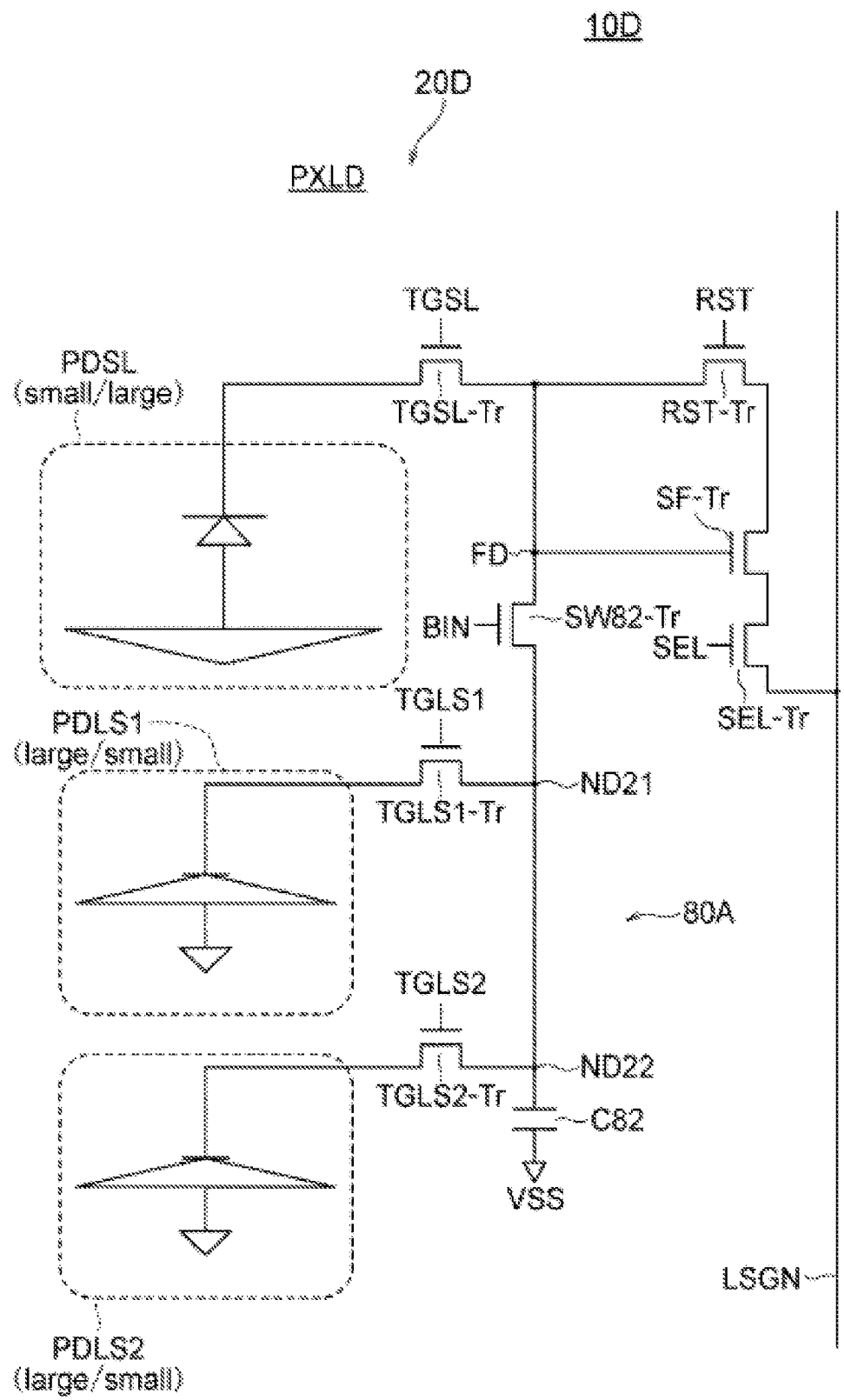
FIG. 17 shows an example configuration of a pixel part and a capacitance changing part relating to a fifth embodiment of the present invention.

FIG. 17 shows an example configuration of a pixel part and a capacitance changing part relating to a fifth embodiment of the present invention.

The pixel PXLD of the fifth embodiment differs from the pixel PXLA of the second embodiment in the following points.

In the fifth embodiment, the pixel PXLD includes a plurality of (in the fifth embodiment, two) second photodiodes PDLS and a plurality of (in the fifth embodiment, two) second transfer transistors TGLS-Tr. Specifically speaking, the pixel PXLD includes a first one of the second photodiodes PDLS1, a second one of the second photodiodes PDLS2, a first one of the second transfer transistors TGLS1-Tr and a second one of the second transfer transistors TGLS2-Tr.

In the pixel PXLD, the first one of the second transfer transistors TGLS1-Tr is connected between the first one of the second photodiodes PDLS1 and the output node ND21, and the second one of the second transfer transistors TGLS2-Tr is connected between the second one of the second photodiodes PDLS2 and the output node ND22. The output node ND21 of the first one of the second transfer transistors TGLS1-Tr is connected to the output node ND22 of the second one of the second transfer transistors TGLS2-Tr. The connecting point is connected to the capacitor C82 of the capacitance changing part 80A, and to one of the ends of the switching transistors SW82-Tr.

Figure 18:
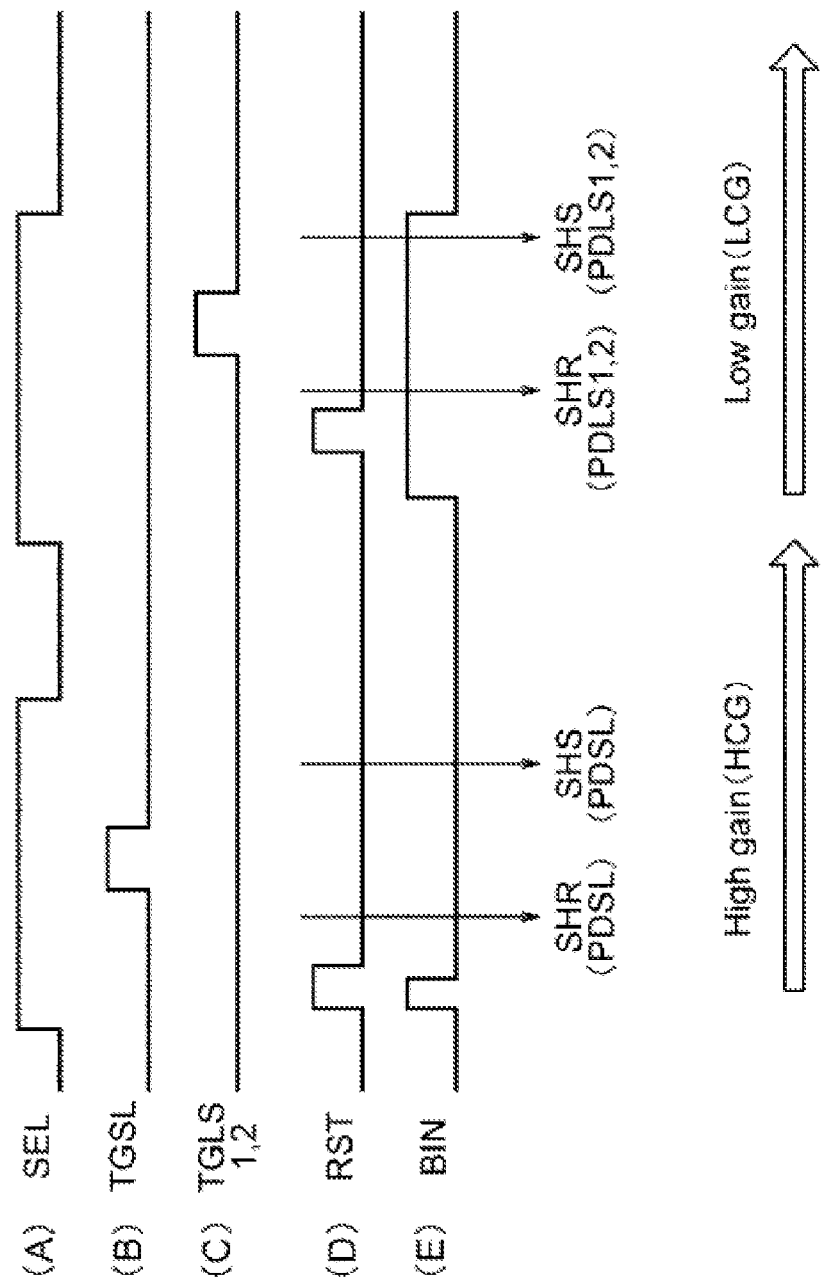
FIG. 18 is used to illustrate a conversion-gain-dependent first reading operation performed when a capacitor and a switch are used to form the capacitance changing part relating to the fifth embodiment and includes parts (A) to (E).
Figure 19:
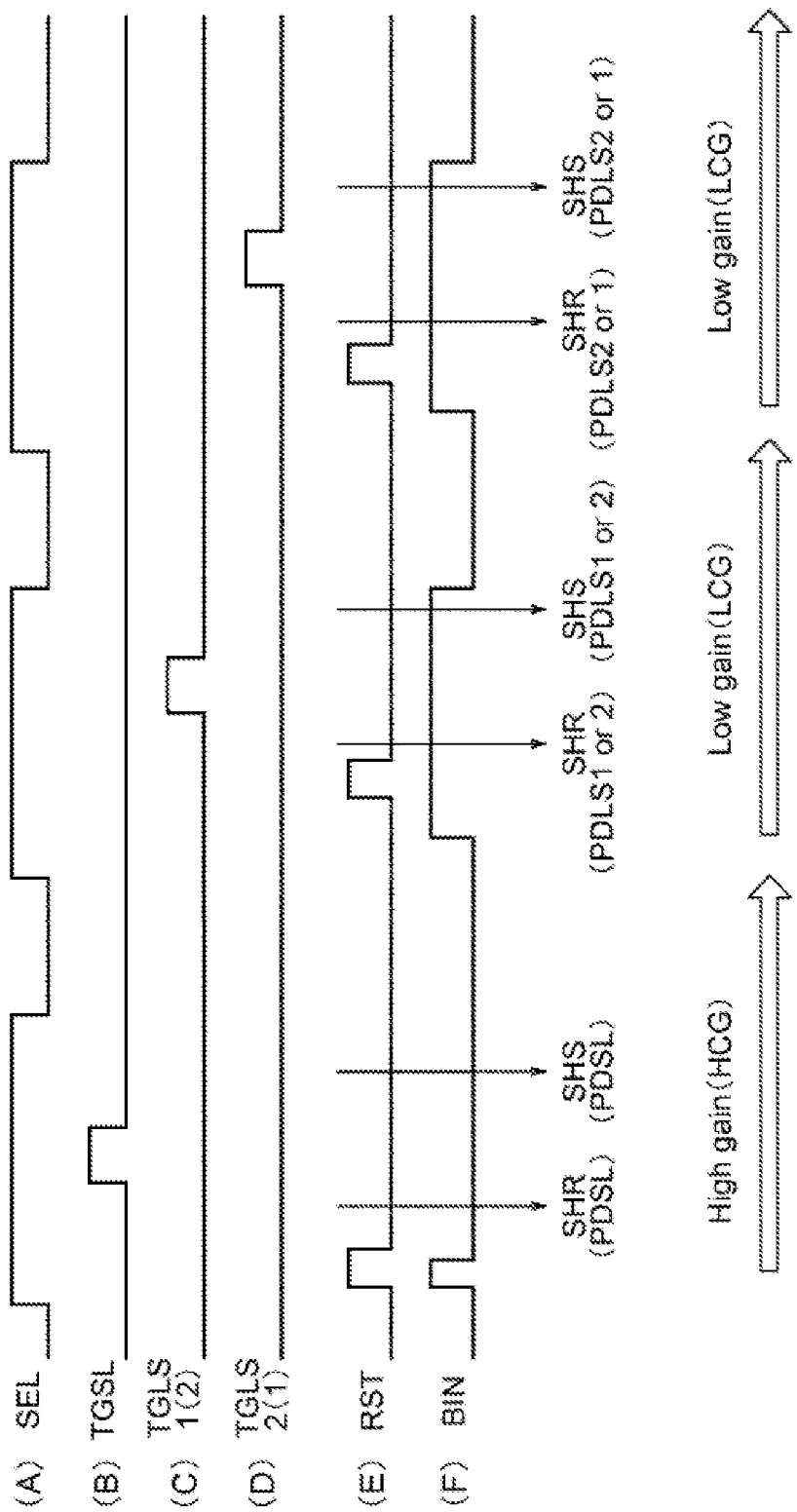
FIG. 19 is used to illustrate a conversion-gain-dependent second reading operation performed when a capacitor and a switch are used to form the capacitance changing part relating to the fifth embodiment and includes parts (A) to (F).

FIG. 18 is used to illustrate a conversion-gain-dependent first reading operation performed when a capacitor and a switch are used to form the capacitance changing part relating to the fifth embodiment and includes parts (A) to (E). FIG. 19 is used to illustrate a conversion-gain-dependent second reading operation performed when a capacitor and a switch are used to form the capacitance changing part relating to the fifth embodiment and includes parts (A) to (F).

The conversion-gain-dependent reading operation performed when a capacitor and a switch are used to form the capacitance changing part relating to the fifth embodiment is performed in the same manner as the conversion-gain-dependent reading operation relating to the first embodiment described with reference to FIG. 8 including the parts (A) to (E). Therefore, the reading is not described in detail here.

Here, in the pixel PXLD, a first transfer operation by the first one of the second photodiodes TGLS1-Tr to transfer the charges stored in the first one of the second photodiodes PDLS1 and a second transfer operation by the second one of the second transfer transistors TGLS2-Tr to transfer the charges stored in the second one of the second photodiodes PDLS2 can be performed using, for example, a first method shown in FIG. 18 including the parts (A) to (E) or a second method shown in FIG. 19 including the parts (A) to (F).

According to the first method, as shown in the parts (A) to (E) of FIG. 18, the first transfer operation and the second transfer operation are performed concurrently in parallel. According to the second method, as shown in the parts (A) to (F) of FIG. 19, the first transfer operation and the second transfer operation are separately performed.

<Specific Example Configurations of Pinned Photodiodes PDSL, PDLS1 and PDLS2>

Figure 20:
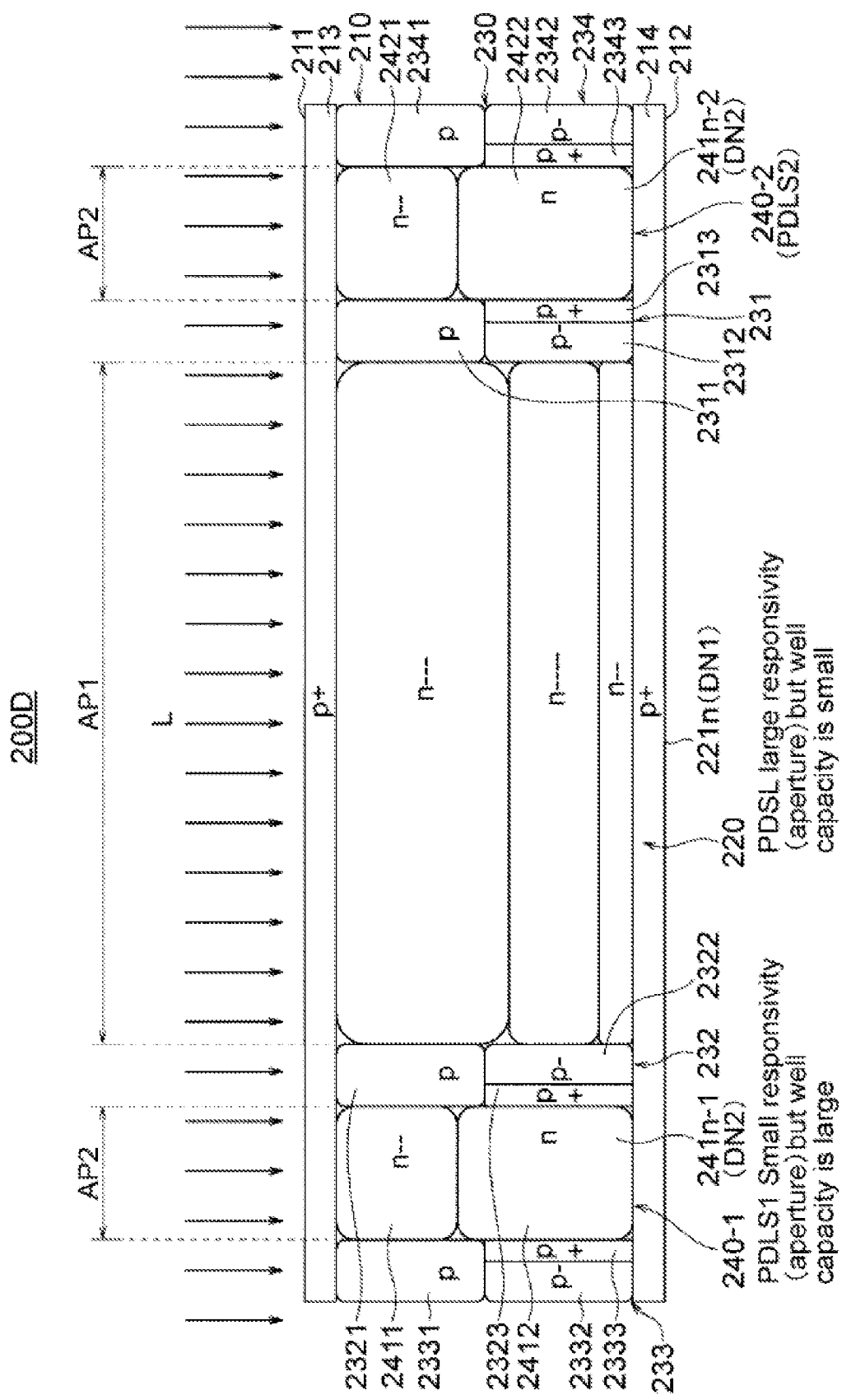
FIG. 20 is a simplified sectional view showing an example configuration of main parts of a first photodiode and two second photodiodes of the pinned type, excluding a charge transfer gate part, in accordance with the fifth embodiment of the present invention.

The specific example configurations of the first photodiode PDSL and the second photodiodes PDLS1, PDLS2 of the pinned type are now described with reference to FIG. 20. FIG. 20 is a simplified sectional view showing an example structure of the main parts of the first photodiode and the two second photodiodes of the pinned type, excluding a charge transfer gate part, in accordance with the fifth embodiment of the present invention. The pinned photodiode (PPD) portion 200D shown in FIG. 20 additionally includes the second one of the second photodiodes PDLS2 in addition to the constituents shown in FIG. 5.

In other words, the pinned photodiode (PPD) portion 200D shown in FIG. 20 includes a semiconductor substrate (hereinafter, referred to simply as "the substrate") 210 having a first substrate surface 211 (e.g., a back surface) to be irradiated with light L and a second substrate surface 212 (a front surface) opposite to the first substrate surface 211. The pinned photodiode portion 200D includes a first photodiode 220 (PDSL) that includes a semiconductor layer of a first conductivity type (in the present embodiment, the n type) (in the present embodiment, the n layer) $221n$ buried in the substrate 210 and is capable of photoelectrically converting received light and storing the resulting charges. The pinned photodiode portion 200D includes second photodiodes 240-1 (PDLS1) and 240-2 (PDLS2) that each include an n layer (a first-conductivity-type semiconductor layer) 241 buried in the substrate 210 such that the second photodiodes are parallel with the first photodiode 220 (PDSL) with the second-conductivity-type (p type) separation layer 230 being sandwiched therebetween. The second photodiodes 240-1 and 240-2 (PDLS1 and PDLS2) are capable of photoelectrically converting received light and storing the resulting charges.

In the pinned photodiode portion 200D, on the lateral portion (the boundary portion of the n layer) of the first photodiode 220 (PDSL) and the second photodiodes 240-1 (PDLS1), 240-2 (PDLS2) in the direction orthogonal to the normal to the substrate 210, separation layers 231, 232, 233, 234 of the second conductivity type (the p type) are formed. In the example of FIG. 20, the first photodiode 220 (PDSL) is formed between the second-conductivity-type (p-type) separation payer 231 and the p-type separation layer 232, which are formed on the lateral portions (the boundary portions of the n layer) in the direction orthogonal to the normal to the substrate 210. The first one of the second photodiodes 240-1 (PDLS1) is formed between the p-type separation layer 232 and the p-type separation layer 233, which are formed on the lateral portions (the boundary portions of the n layer) in the direction orthogonal to the normal to the substrate 210. The second one of the second photodiodes 240-2 (PDLS2) is formed between the p-type separation layer 231 and the p-type separation layer 234, which are formed on the lateral portions (the boundary portions of the n layer) in the direction orthogonal to the normal to the substrate 210.

In the present embodiment, the aperture AP1 of the light receiving region of the first photodiode PDSL is larger than the aperture AP2 of the light receiving region of the second photodiodes PDSL1, 2 (AP1>AP2), and the impurity concentration DN1 of the n layer $221n$ in the first photodiode PDSL is lower than the impurity concentration DN2 of the n layers $241n$–1, $241n$–2 in the second photodiodes PDLS1, 2 (DN1<DN2).

The fifth embodiment can produce the same effects as the above-described first and second embodiments. Since a plurality of second photodiodes PDLS and a plurality of second transfer transistors TGLS are provided, a phase difference detecting system can be provided to obtain phase difference information for, for example, autofocus (AF). With such a configuration, phase difference information can be obtained in the horizontal (left-to-right), vertical (top-to-down) and angled directions.

For example, when the second method shown in the parts (A) to (F) of FIG. 19 is employed to perform the reading, it is possible to read the signal from the first one of the second photodiodes PDLS1 and the signal from the second one of the second photodiodes PDLS2 without reading the signal from the first photodiode PDSL. In this way, only the phase difference information can be read out.

The above phase difference detecting function is based on, so-called, pupil-division phase difference technique. The pupil division phase difference technique involves pupil-dividing the light rays transmitting through the imaging lens to form a pair of divided images and detecting a pattern discrepancy (phase shift amount). In this way, the amount of defocusing of the imaging lens may be detected.

Sixth Embodiment

Figure 21:
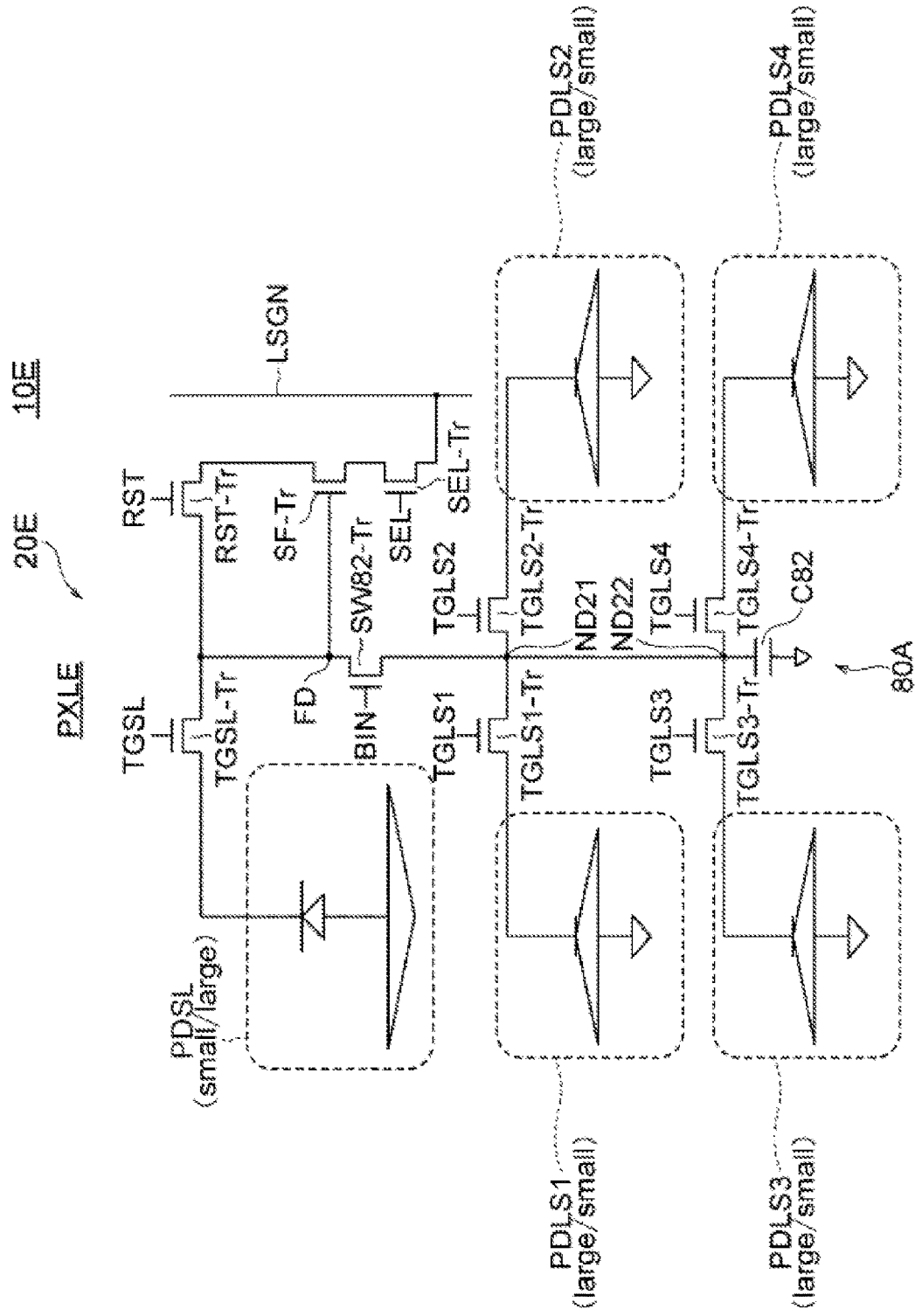
FIG. 21 shows an example configuration of a pixel part and a capacitance changing part relating to a sixth embodiment of the present invention.

FIG. 21 shows an example configuration of a pixel part and a capacitance changing part relating to a sixth embodiment of the present invention.

The pixel PXLE of the sixth embodiment differs from the pixel PXLA of the second embodiment and the pixel PXLD of the fifth embodiment in the following points.

In the sixth embodiment, the pixel PXLE includes four second photodiodes PDLS and four second transfer transistors TGLS-Tr. Specifically speaking, the pixel PXLE includes a first one of the second photodiodes PDLS1, a second one of the second photodiodes PDLS2, a third one of the second photodiodes PDLS3, a fourth one of the second photodiodes PDLS4, a first one of the second transfer transistors TGLS1-Tr, a second one of the second transfer transistors TGLS2-Tr, a third one of the second transfer transistor TGLS3-Tr and a fourth one of the second transfer transistors TGLS4-Tr.

In the pixel PXLE, the first one of the second transfer transistors TGLS1-Tr is connected between the first one of the second photodiodes PDLS1 and the output node ND21, and the second one of the second transfer transistors TGLS2-Tr is connected between the second one of the second photodiodes PDLS2 and the output node ND21. The third one of the second transfer transistors TGLS3-Tr is connected between the third one of the second photodiodes PDLS3 and the output node ND22, and the fourth one of the second transfer transistors TGLS4-Tr is connected between the fourth one of the second photodiodes PDLS4 and the output node ND22. The output node ND21 of the first one of the second transfer transistors TGLS1-Tr and the second one of the second transfer transistors TGLS2-Tr is connected to the output node ND22 of the third one of the second transfer transistors TGLS3-Tr and the fourth one of the second transfer transistors TGLS4-Tr, and the connecting point is connected to the capacitor C82 of the capacitance changing part 80A and to one of the ends of the switching transistor SW82-Tr.

Since four second photodiodes PDLS and four second transfer transistors TGLS are provided, the sixth embodiment can provide a phase difference detecting system for obtaining phase difference information for, for example, autofocus (AF), and phase difference information can be obtained in the horizontal (left-to-right), vertical (top-to-down) and angled directions.

<Example of how to Arrange First and Second Photodiodes in Pixel PXLE>

Figure 22:
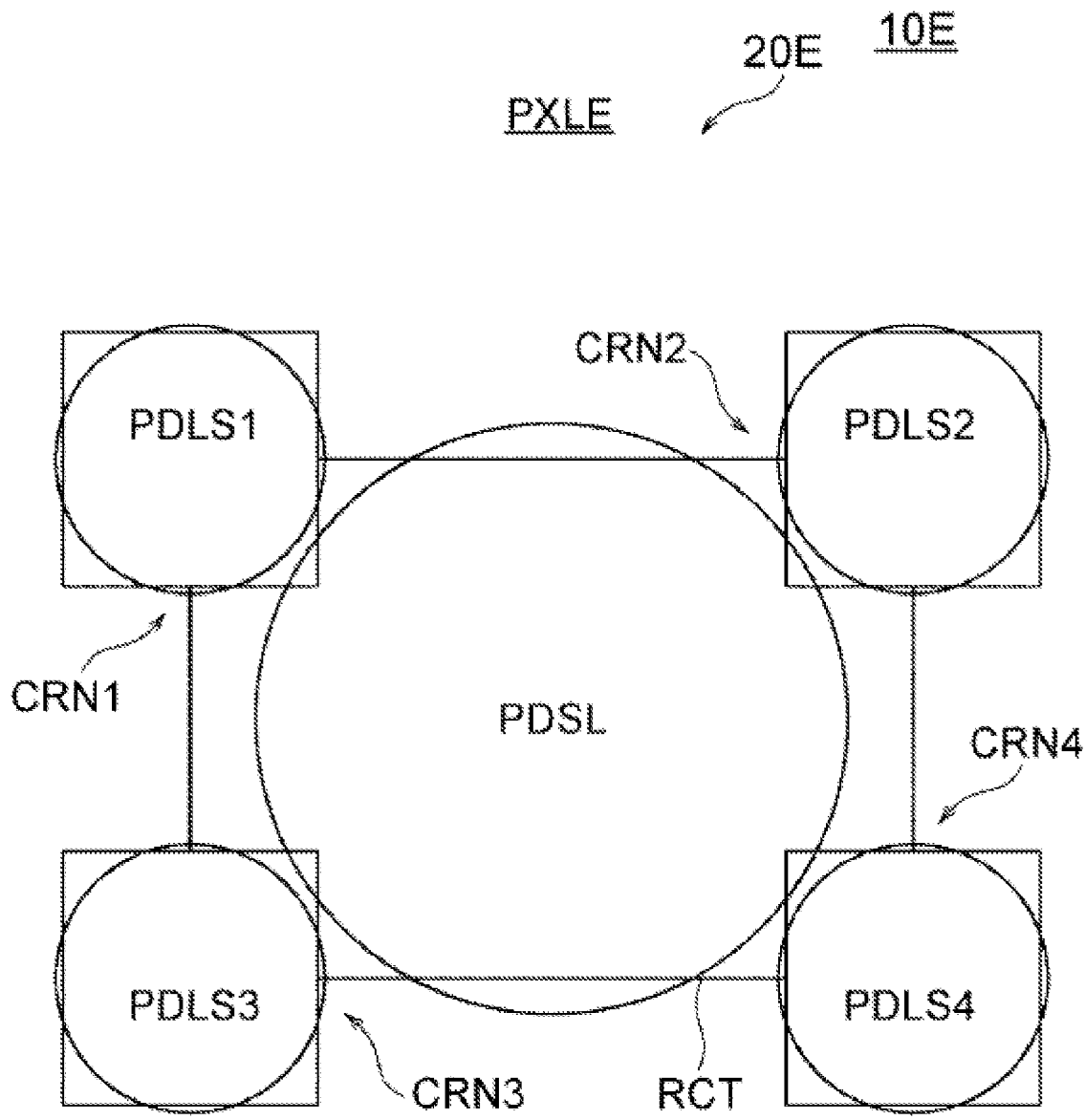
FIG. 22 is used to illustrate an example of how to arrange a first photodiode and four second photodiodes in the pixel relating to the sixth embodiment.

The following describes an example of how to arrange a first photodiode and four second photodiodes in the pixel PXLE relating to the sixth embodiment. FIG. 22 is used to illustrate an example of how to arrange a first photodiode and four second photodiodes in the pixel PXLE relating to the sixth embodiment.

The pixel PXLE relating to the sixth embodiment includes, for example, a first photodiode PDSL that has a rectangular shape RCT. At the four corners of the first photodiode PDSL, the second photodiodes PDLS1 to PDLS4 and the second transfer transistors TGLS1-Tr to TGLS4-Tr are arranged.

As the four corners, the pixel PXLE has a first corner CRN1 that is an upper left corner, a second corner CRN2 that is an upper right corner, a third corner CRN3 that is a lower left corner and a fourth corner CRN4 that is a lower right corner as shown in FIG. 22. In the pixel PXLE, for example, the first one of the second photodiodes PDLS1 and the first one of the second transfer transistors TGLS1-Tr are arranged at the first corner CRN1. The second one of the second photodiodes PDLS2 and the second one of the second transfer transistors TGLS2-Tr are arranged at the second corner CRN2. The third one of the second photodiodes PDLS3 and the third one of the second transfer transistors TGLS3-Tr are arranged at the third corner CRN3. The fourth one of the second photodiodes PDLS4 and the fourth one of the second transfer transistors TGLS4-Tr are arranged at the fourth corner CRN4.

In the sixth embodiment, the reading part 70 is configured to perform reading in such a manner that at least one selected from the group consisting of a dynamic range widening function and a phase difference detecting function is effectuated by combining reading operations for the charges stored in the first photodiode PDSL, the first one of the second photodiodes PDLS1, the second one of the second photodiodes PDLS2, the third one of the second photodiodes PDLS3 and the fourth one of the second photodiodes PDLS4.

The reading operations in the above-mentioned reading mode that effectuates the dynamic range widening function and the phase difference detecting function will be described with reference to a seventh embodiment, which will be described below.

The sixth embodiment can not only produce the same effects as the first and second embodiments, but also provide a phase difference detecting system designed to obtain phase difference information for, for example, autofocus (AF) since four second photodiodes PDLS and four second transfer transistors TGLS and obtain phase difference information in the horizontal (left-to-right), vertical (top-to-down) and angled directions.

Seventh Embodiment

Figure 23:
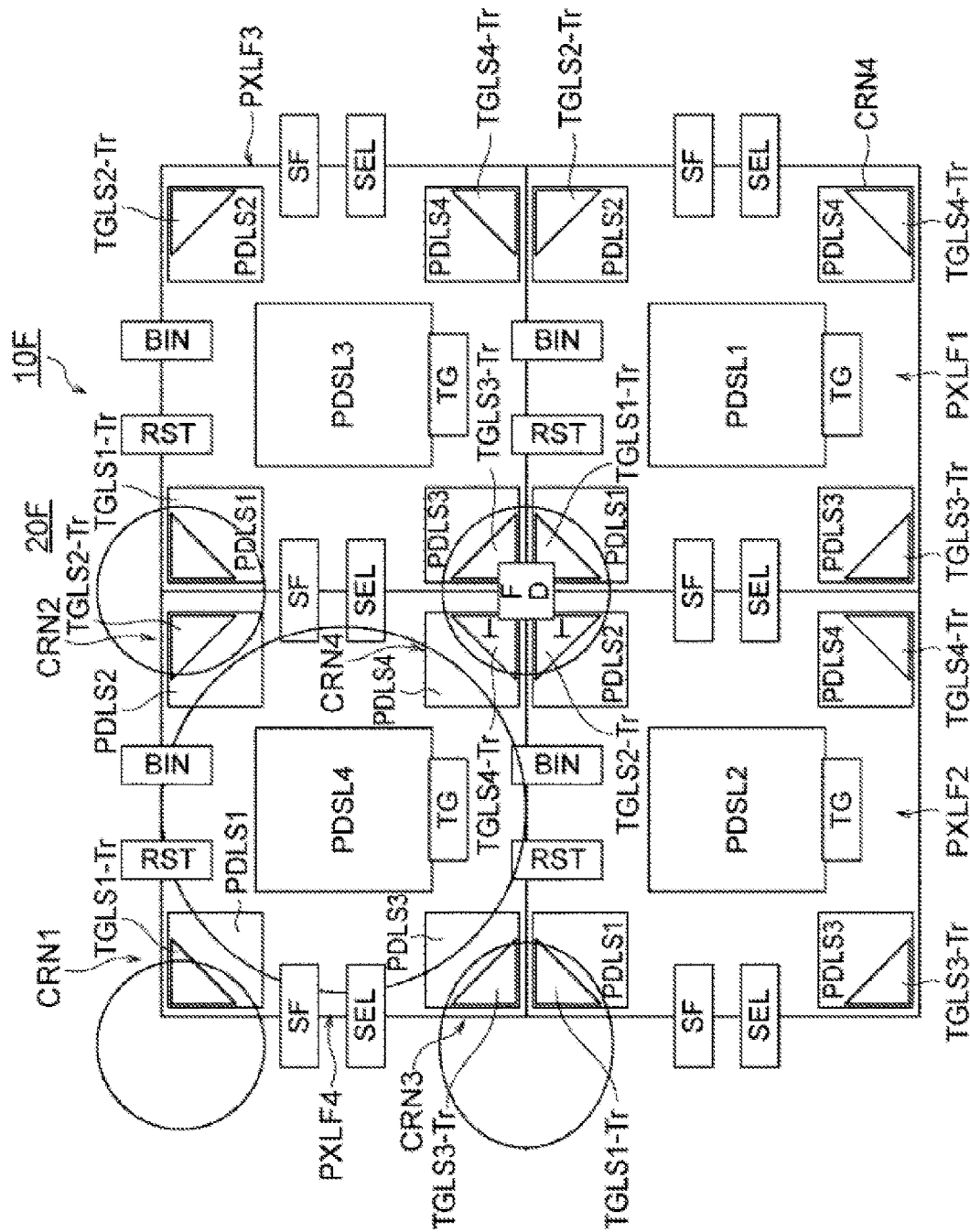
FIG. 23 shows an example layout of a pixel part and a capacitance changing part relating to a seventh embodiment of the present invention.
Figure 24:
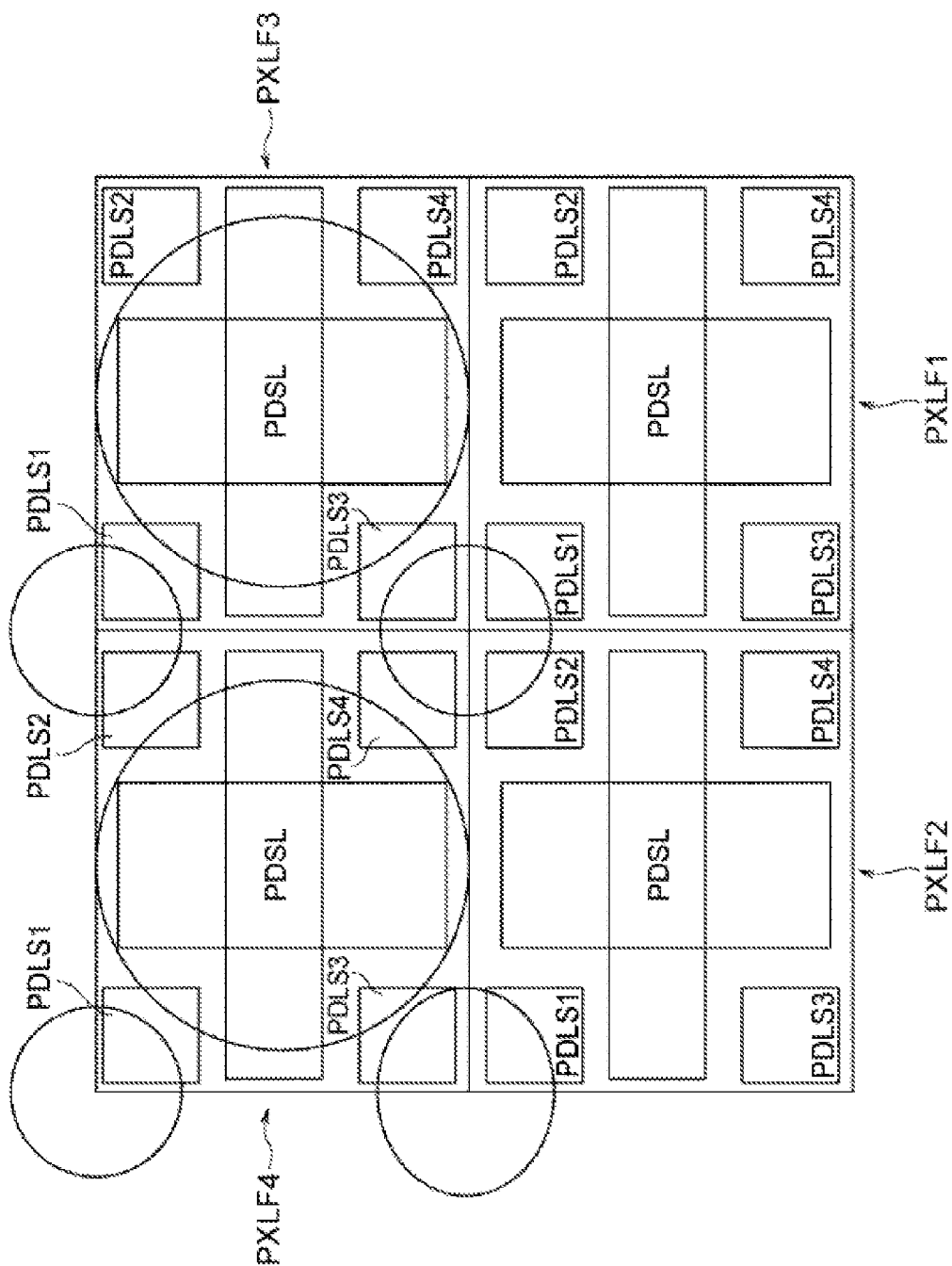
FIG. 24 shows a basic layout pattern of pixels of the pixel part shown in FIG. 23 seen from the back-surface side.

FIG. 23 shows an example layout of a pixel part and a capacitance changing part relating to a seventh embodiment of the present invention. FIG. 24 shows a basic layout pattern of pixels of the pixel part shown in FIG. 23 seen from the back-surface side. FIGS. 23 and 24 show an example where four pixels are arranged in a matrix pattern of 2×2 for the sake of simplicity.

The pixel PXLF relating to the seventh embodiment differs from the pixel PXLE relating to the sixth embodiment in the following points.

In the seventh embodiment, the pixel part 20F includes a plurality of pixels PXLF arranged therein in a matrix pattern and has a pixel sharing structure where one floating diffusion FD is shared between the second photodiodes PDLS and the second transfer transistors TGLS-Tr of adjacent pixels.

As the four corners, the pixel PXLF has a first corner CRN1 that is an upper left corner, a second corner CRN2 that is an upper right corner, a third corner CRN3 that is a lower left corner and a fourth corner CRN4 that is a lower right corner as shown in FIG. 23. In the pixel PXLF, for example, the first one of the second photodiodes PDLS1 and the first one of the second transfer transistors TGLS1-Tr are arranged at the first corner CRN1. The second one of the second photodiodes PDLS2 and the second one of the second transfer transistors TGLS2-Tr are arranged at the second corner CRN2. The third one of the second photodiodes PDLS3 and the third one of the second transfer transistors TGLS3-Tr are arranged at the third corner CRN3. The fourth one of the second photodiodes PDLS4 and the fourth one of the second transfer transistors TGLS4-Tr are arranged at the fourth corner CRN4.

In the seventh embodiment, the first one of the second photodiodes PDLS1 and the first one of the second transfer transistors TGLS1-Tr in each pixel PXLF basically share one floating diffusion FD with at least one selected from the group consisting of (i) the second one of the second photodiodes PDLS2 and the second one of the second transfer transistors TGLS2-Tr in the left adjacent pixel in the column direction, (ii) the third one of the second photodiodes PDLS3 and the third one of the second transfer transistors TGLS3-Tr in the upper adjacent pixel in the row direction, and (iii) the fourth one of the second photodiodes PDLS4 and the fourth one of the second transfer transistors TGLS4-Tr in the upper left adjacent pixel.

The second one of the second photodiodes PDLS2 and the second one of the second transfer transistors TGLS2-Tr in each pixel PXLF share one floating diffusion FD with at least one selected from the group consisting of (i) the first one of the second photodiodes PDLS1 and the first one of the second transfer transistors TGLS1-Tr in the right adjacent pixel in the column direction, (ii) the fourth one of the second photodiodes PDLS4 and the fourth one of the second transfer transistors TGLS4-Tr in the upper adjacent pixel in the row direction, and (iii) the third one of the second photodiodes PDLS3 and the third one of the second transfer transistors TGLS3-Tr in the upper right adjacent pixel.

The third one of the second photodiodes PDLS3 and the third one of the second transfer transistors TGLS3-Tr in each pixel PXLF share one floating diffusion FD with at least one selected from the group consisting of (i) the fourth one of the second photodiodes PDLS4 and the fourth one of the second transfer transistors TGLS4-Tr in the left adjacent pixel in the column direction, (ii) the first one of the second photodiodes PDLS1 and the first one of the second transfer transistors TGLS1-Tr in the lower adjacent pixel in the row direction, and (iii) the second one of the second photodiodes PDLS2 and the second one of the second transfer transistors TGLS2-Tr in the lower left adjacent pixel.

The fourth one of the second photodiodes PDLS4 and the fourth one of the second transfer transistors TGLS4-Tr in each pixel PXLF share one floating diffusion FD with at least one selected from the group consisting of (i) the third one of the second photodiodes PDLS3 and the third one of the second transfer transistors TGLS3-Tr in the right adjacent pixel in the column direction, (ii) the second one of the second photodiodes PDLS2 and the second one of the second transfer transistors TGLS2-Tr in the lower adjacent pixel in the row direction, and (iii) the first one of the second photodiodes PDLS1 and the first one of the second transfer transistors TGLS1-Tr in the lower right adjacent pixel.

According to the example shown in FIGS. 23 and 24, a first pixel PXLF1, a second pixel PXLF2, a third pixel PXLF3, and a fourth pixel PXLF4 are arranged in a matrix pattern in the pixel part 20F. One floating diffusion FD is shared between (i) the first one of the second photodiodes PDLS1 and the first one of the second transfer transistors TGLS1-Tr in the first pixel PXLF1, (ii) the second one of the second photodiodes PDLS2 and the second one of the second transfer transistors TGLS2-Tr in the second pixel PXLF2, (iii) the third one of the second photodiodes PDLS3 and the third one of the second transfer transistors TGLS3-Tr in the third pixel PXLF3, and (iv) the fourth one of the second photodiodes PDLS4 and the fourth one of the second transfer transistors TGLS4-Tr in the fourth pixel PXLF4.

In the seventh embodiment, the reading part 70 is configured to perform reading in such a manner that at least one selected from the group consisting of a dynamic range widening function and a phase difference detecting function is effectuated by combining reading operations for the charges stored in the first photodiode PDSL1 in the first pixel PXLF1, the first one of the second photodiodes PDLS1 in the first pixel PXLF1, the second one of the second photodiodes PDLS2 in the second pixel PXLF2, the third one of the second photodiodes PDLS3 in the third pixel PXL3 and the fourth one of the second photodiodes PDLS4 in the fourth pixel PXLF4.

The reading operations relating to the seventh embodiment in the reading mode that effectuates the above-mentioned dynamic range widening function and the phase difference detecting function will be described below.

FIG. 25 is a table briefly showing the reading modes in which the dynamic range widening function and the phase difference detecting function are effectuated in accordance with the seventh embodiment.

FIG. 25 shows, as an example, the following six reading modes.

(1) Dynamic range non-widening mode (Non-HDR)
(2) Dynamic range widening mode (HDR)
(3) First phase difference detecting mode (PDAF(V))
(4) Second phase difference detecting mode (PDAF(H))
(5) Third phase difference detecting mode (PFAF(D))
(6) Special dynamic range widening mode (Extra-HDR)

The reading operations performed in these reading modes will be now outlined. In the following description, some modes are described with reference to timing charts. The conversion-gain-dependent reading operation relating to the seventh embodiment performed when a capacitor and a switch are used to form the capacitance changing part (FIG. 21) is performed in the same manner as the conversion gain dependent reading operation relating to the first embodiment basically described with reference to FIG. 8.

The reading part 70 is capable of performing, in a single reading period, at least one selected from the group consisting of first conversion gain mode reading for reading the pixel signal with a first conversion gain corresponding to a first capacitance set by the capacitance changing part 80A and second conversion gain mode reading for reading the pixel signal with a second conversion gain corresponding to a second capacitance set by the capacitance changing part 80A, as described above.

(1) Dynamic Range Non-Widening Mode (Non-HDR)

In the dynamic range non-widening mode (Non-HDR), the dynamic range widening function and the phase difference detecting function are not effectuated. In this case, the switching transistor SW82-Tr of the capacitance changing part 80A remains in the on state, so that the charges stored in the first photodiode PDSL, the first one of the second photodiodes PDLS1, the second one of the second photodiodes PDLS2, the third one of the second photodiodes PDLS3, and the fourth one of the second photodiodes PDLS4 are transferred to the floating diffusion FD concurrently in parallel. The second conversion gain reading with a low conversion gain (LCG) is performed and a first reading operation signal Sig1 is obtained.

(2) Dynamic Range Widening Mode (HDR)

Figure 26:
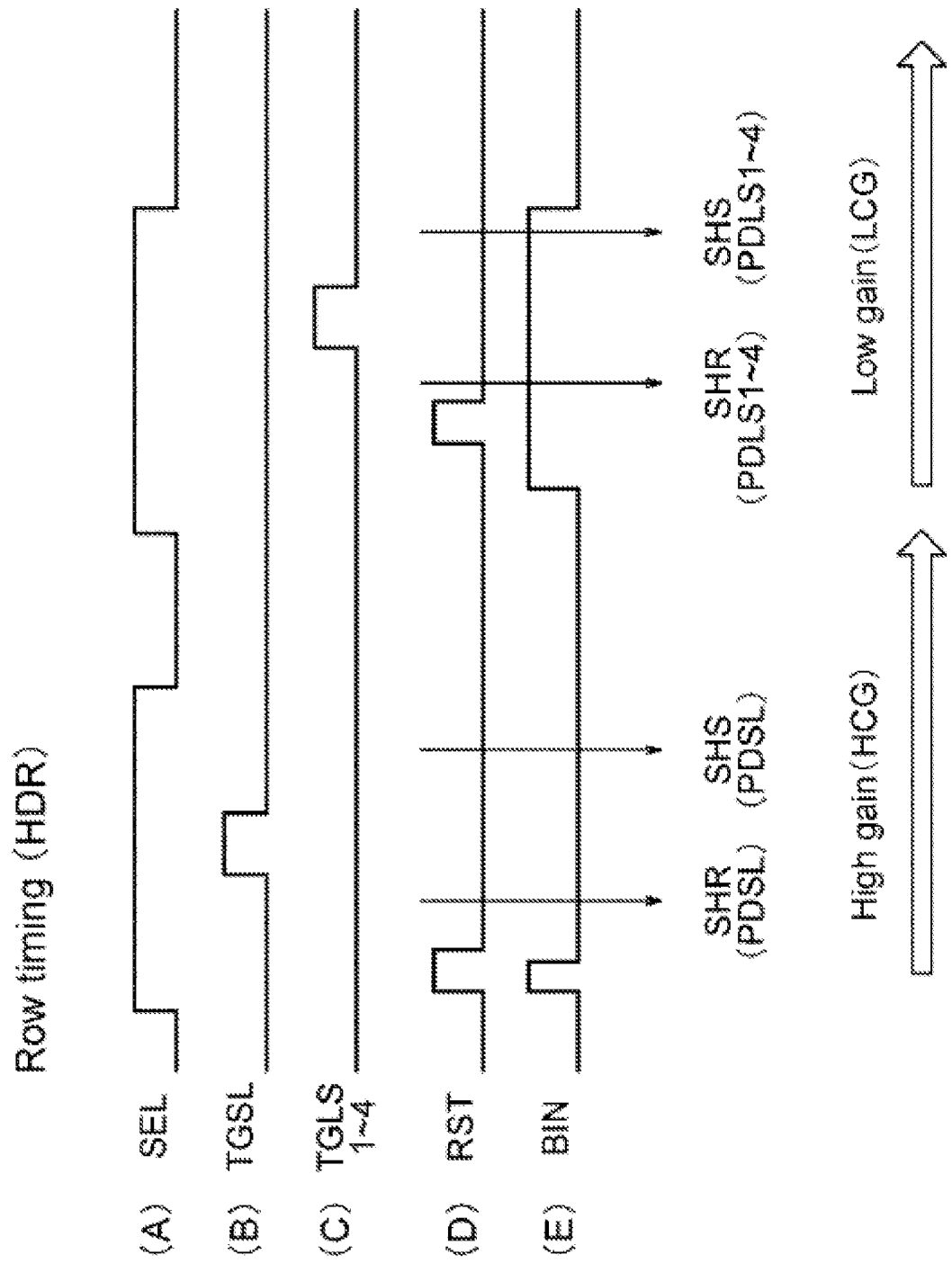
FIG. 26 is a timing chart including parts (A) to (E) to illustrate a reading operation performed in a dynamic range widening mode (HDR) relating to the seventh embodiment.

FIG. 26 is a timing chart including parts (A) to (E) to illustrate a reading operation performed in the dynamic range widening mode (HDR) relating to the seventh embodiment.

In the dynamic range widening mode (HDR), when a first dynamic range widening function is effectuated, the capacitance changing part 80A keeps the capacitance of the floating diffusion FD at the first capacitance corresponding to the first conversion gain (HCG) at least after the reset period, in order to obtain a first first reading operation signal Sig1. In a first reading period following the reset period, a first round of the first conversion gain mode reading is performed. While the capacitance of the floating diffusion FD is retained at the first capacitance corresponding to the first conversion gain (HCG), a transfer operation of a first transfer period by the first transfer transistor TGSL-Tr is performed after the first reading period. In a second reading period following the first transfer period, a second round of the first conversion gain mode reading is performed.

In the dynamic range widening mode (HDR), the capacitance changing part 80A keeps the capacitance of the floating diffusion FD at the second capacitance that includes the capacitance of the capacitor C82 and corresponds to the second conversion gain (LCG) at least after the reset period, in order to obtain a first second reading operation signal Sig2. In a third reading period following the reset period, a first round of the second conversion gain mode reading is performed. While the capacitance of the floating diffusion FD is kept at the second capacitance corresponding to the second conversion gain (LCG), a transfer operation of a second transfer period following the third reading period is performed by the first one of the second transfer transistors TGLS1-Tr, the second one of the second transfer transistors TGLS2-Tr, the third one of the second transfer transistors TGLS3-Tr, and the fourth one of the second transfer transistors TGLS4-Tr. In a fourth reading period following the second transfer period, a second round of the second conversion gain mode reading is performed.

In the dynamic range widening mode (HDR), the first second reading operation signal Sig2 is used as a first dynamic range widening signal HDRSig.

In the dynamic range widening mode (HDR), the dynamic range is 103 dB, and the to-be-stored capacitance (LFWC) is, for example, equivalent to 150 Ke. This means that a sufficient well capacity can be obtained and a sufficiently widened dynamic range can be achieved.

(3) First Phase Difference Detecting Mode (PDAF(V))

Figure 27:
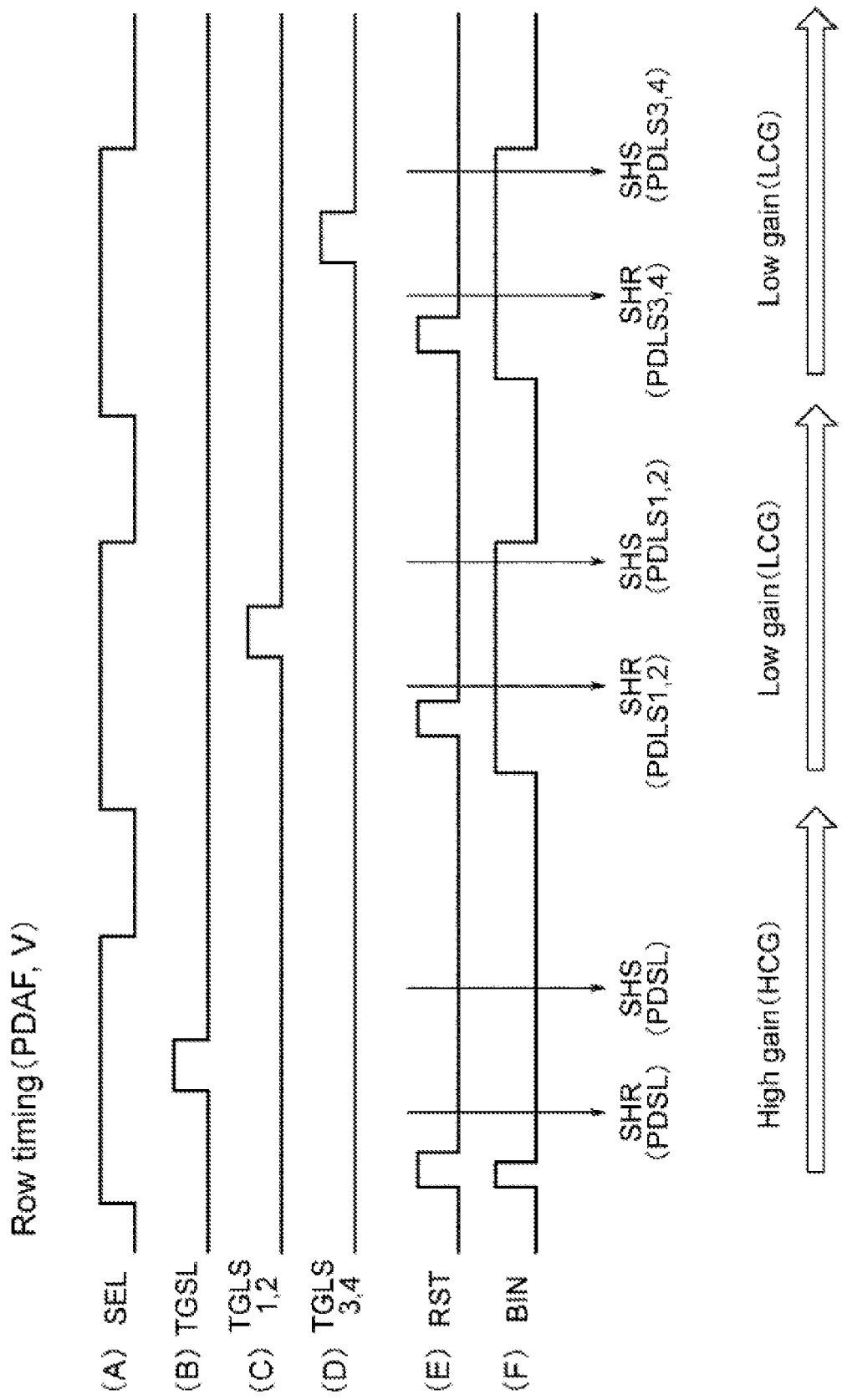
FIG. 27 is a timing chart including parts (A) to (F) to illustrate a reading operation performed in a first phase difference detecting mode (PDAF(V)) relating to the seventh embodiment.

FIG. 27 is a timing chart including parts (A) to (F) to illustrate a reading operation performed in a first phase difference detecting mode (PDAF(V)) relating to the seventh embodiment.

In the first phase difference detecting mode (PDAF(V)), when a second dynamic range widening function and a first phase difference detecting function are effectuated, the capacitance changing part 80A keeps the capacitance of the floating diffusion FD at the first capacitance corresponding to the first conversion gain (HCG) at least after the reset period, in order to obtain a second first reading operation signal Sig1. In a first reading period following the reset period, a first round of the first conversion gain mode reading is performed. While the capacitance of the floating diffusion FD is retained at the first capacitance corresponding to the first conversion gain (HCG), a transfer operation of a first transfer period by the first transfer transistor TGSL-Tr is performed after the first reading period. In a second reading period following the first transfer period, a second round of the first conversion gain mode reading is performed.

In some cases, this mode may not be performed, and only a phase difference signal can be read out by performing two rounds of reading.

In the first phase difference detecting mode (PDAF(V)), the capacitance changing part 80A keeps the capacitance of the floating diffusion FD at the second capacitance that includes the capacitance of the capacitor C82 and corresponds to the second conversion gain (LCG) at least after the reset period, in order to obtain a second second reading operation signal Sig2. In a third reading period following the reset period, a first round of the second conversion gain mode reading is performed. While the capacitance of the floating diffusion FD is retained at the second capacitance corresponding to the second conversion gain (LCG), a transfer operation of a second transfer period by the first one of the second transfer transistors TGLS1-Tr and the second one of the second transfer transistors TGLS2-Tr is performed after the third reading period. In a fourth reading period following the second transfer period, a second round of the second conversion gain mode reading is performed.

In the first phase difference detecting mode (PDAF(V)), the capacitance changing part 80A keeps the capacitance of the floating diffusion FD at the second capacitance that includes the capacitance of the capacitor C82 and corresponds to the second conversion gain (LCG) at least after the reset period, in order to obtain a third second reading operation signal Sig3. In a fifth reading period following the reset period, a first round of the second conversion gain mode reading is performed. While the capacitance of the floating diffusion FD is retained at the second capacitance corresponding to the second conversion gain (LCG), a transfer operation of a second transfer period by the third one of the second transfer transistors TGSL3-Tr and the fourth one of the second transfer transistor TGLS4-Tr is performed after the fifth reading period. In a sixth reading period following the second transfer period, a second round of the second conversion gain mode reading is performed.

In the first phase difference detecting mode (PDAF(V)), as a first phase difference detecting signal PDAFSig, a difference signal (Sig2−Sig3) between the second second reading operation signal Sig2 and the third second reading operation signal Sig3 is used.

In the first phase difference detecting mode (PDAF(V)), as a second dynamic range widening signal HDRSig, a sum signal (Sig2+Sig3) of adding together the second second reading operation signal Sig2 and the third second reading operation signal Sig3 is used.

In the first phase difference detecting mode (PDAF(V)), the dynamic range is 103 dB, and the to-be-stored capacitance (LFWC) is, for example, equivalent to 150 Ke. This means that a sufficient well capacity can be obtained and a sufficiently widened dynamic range can be achieved.

(4) Second Phase Difference Detecting Mode (PDAF(H))

Figure 28:
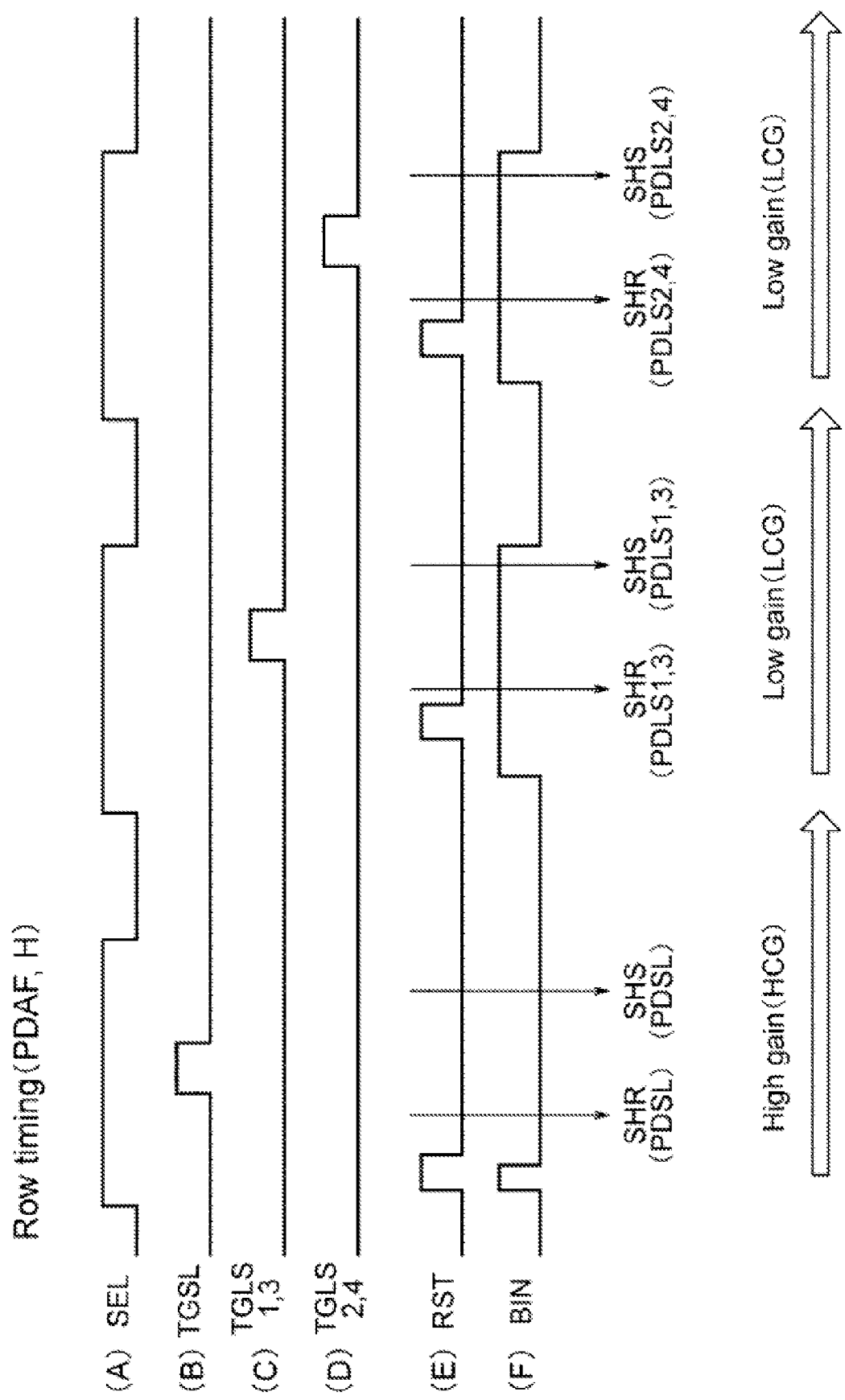
FIG. 28 is a timing chart including parts (A) to (F) to illustrate a reading operation performed in a second phase difference detecting mode (PDAF(H)) relating to the seventh embodiment.

FIG. 28 is a timing chart including parts (A) to (F) to illustrate a reading operation performed in a second phase difference detecting mode (PDAF(H)) relating to the seventh embodiment.

In the second phase difference detecting mode (PDAF(H), when a third dynamic range widening function and a second phase difference detecting function are effectuated, the capacitance changing part 80A keeps the capacitance of the floating diffusion FD at the first capacitance corresponding to the first conversion gain (HCG) at least after the reset period, in order to obtain a third first reading operation signal Sig1. In a first reading period following the reset period, a first round of the first conversion gain mode reading is performed. While the capacitance of the floating diffusion FD is retained at the first capacitance corresponding to the first conversion gain (HCG), a transfer operation of a first transfer period by the first transfer transistor TGSL-Tr is performed after the first reading period. In a second reading period following the first transfer period, a second round of the first conversion gain mode reading is performed.

In the second phase difference detecting mode (PDAF(H)), the capacitance changing part 80A keeps the capacitance of the floating diffusion FD at the second capacitance that includes the capacitance of the capacitor C82 and corresponds to the second conversion gain (LCG) at least after the reset period, in order to obtain a fourth second reading operation signal Sig2. In a third reading period following the reset period, a first round of the second conversion gain mode reading is performed. While the capacitance of the floating diffusion FD is retained at the second capacitance corresponding to the second conversion gain (LCG), a transfer operation of a second transfer period by the first one of the second transfer transistors TGLS1-Tr and the third one of the second transfer transistors TGLS3-Tr is performed after the third reading period. In a fourth reading period following the second transfer period, a second round of the second conversion gain mode reading is performed.

In the second phase difference detecting mode (PDAF (H)), the capacitance changing part 80A keeps the capacitance of the floating diffusion at the second capacitance that includes the capacitance of the capacitor C82 and corresponds to the second conversion gain (LCG) at least after the reset period, in order to obtain a fifth second reading operation signal Sig3. In a fifth reading period following the reset period, a first round of the second conversion gain mode reading is performed. While the capacitance of the floating diffusion FD is retained at the second capacitance corresponding to the second conversion gain (LCG), a transfer operation of a second transfer period by the second one of the second transfer transistors TGLS2-Tr and the fourth one of the second transfer transistors TGLS4-Tr is performed after the fifth reading period. In a sixth reading period following the second transfer period, a second round of the second conversion gain mode reading is performed.

In the second phase difference detecting mode (PDAF (H)), as a second phase difference detecting signal PDAFSig, a difference signal (Sig2–Sig3) between the fourth second reading operation signal Sig2 and the fifth second reading operation signal Sig3 is used.

In the second phase difference detecting mode (PDAF (H)), as a third dynamic range widening signal HDRSig, a sum signal (Sig2+Sig3) of adding together the fourth second reading operation signal Sig2 and the fifth second reading operation signal Sig3 is used.

In the second phase difference detecting mode (PDAF (H)), the dynamic range is 103 dB, and the to-be-stored capacitance (LFWC) is 150 Ke. This means that a sufficient well capacity can be obtained and a sufficiently widened dynamic range can be achieved.

(5) Third Phase Difference Detecting Mode (PFAF(D))

Figure 29:
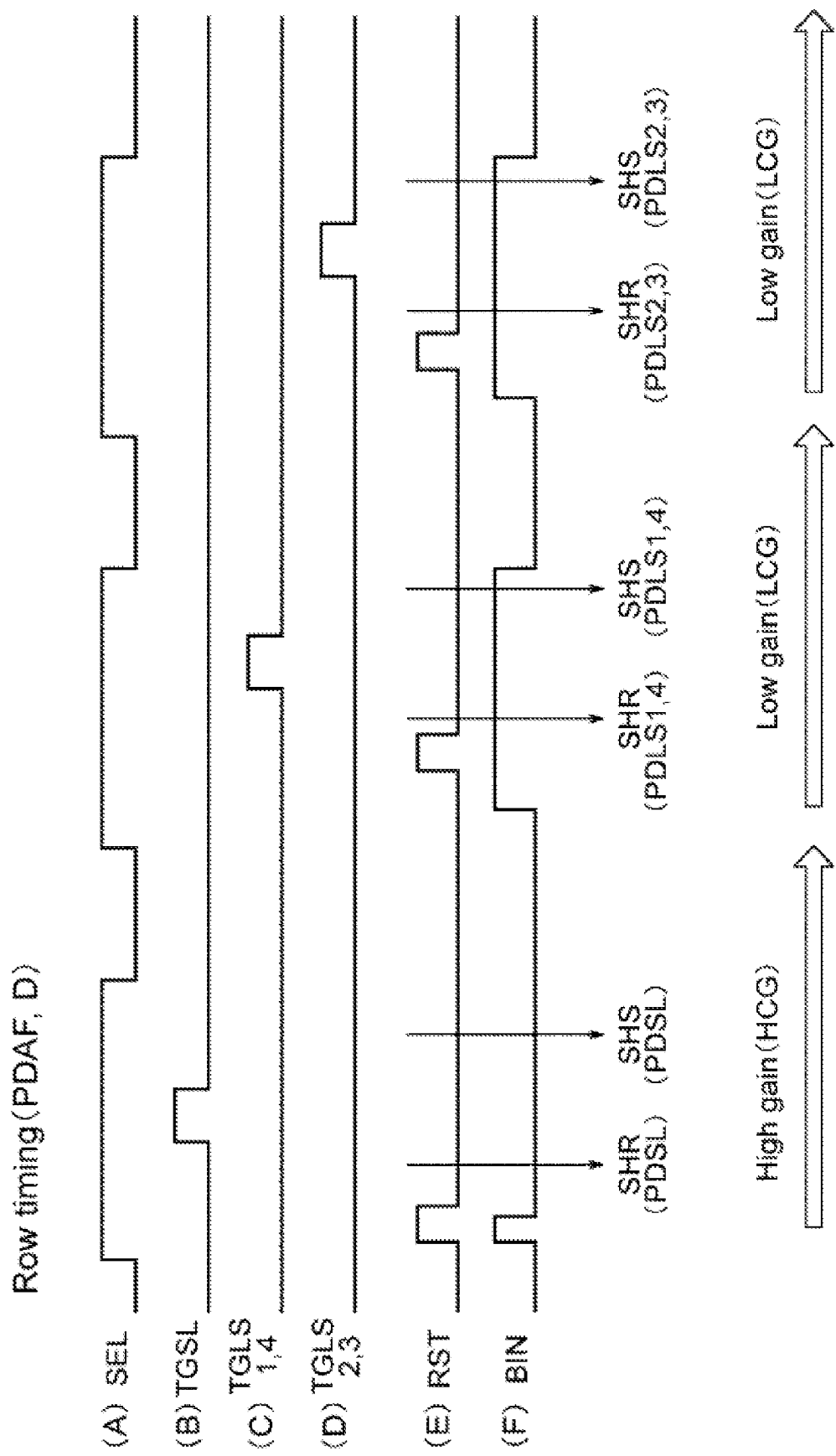
FIG. 29 is a timing chart including parts (A) to (F) to illustrate a reading operation performed in a third phase difference detecting mode (PDAF(D)) relating to the seventh embodiment.

FIG. 29 is a timing chart including parts (A) to (F) to illustrate a reading operation performed in a third phase difference detecting mode (PDAF(D)) relating to the seventh embodiment.

In the third phase difference detecting mode (PDAF(D)), when a fourth dynamic range widening function and a third phase difference detecting function are effectuated, the capacitance changing part 80A keeps the capacitance of the floating diffusion FD at the first capacitance corresponding to the first conversion gain (HCG) at least after the reset period, in order to obtain a fourth first reading operation signal Sig1. In a first reading period following the reset period, a first round of the first conversion gain mode reading is performed. While the capacitance of the floating diffusion FD is retained at the first capacitance corresponding to the first conversion gain (HCG), a transfer operation of a first transfer period by the first transfer transistor TGSL1-Tr is performed after the first reading period. In a second reading period following the first transfer period, a second round of the first conversion gain mode reading is performed.

In the third phase difference detecting mode (PDAF(D)), the capacitance changing part 80A keeps the capacitance of the floating diffusion FD at the second capacitance that includes the capacitance of the capacitor C82 and corresponds to the second conversion gain (LCG) at least after the reset period, in order to obtain a sixth second reading operation signal Sig2. In a third reading period following the reset period, a first round of the second conversion gain mode reading is performed. While the capacitance of the floating diffusion FD is retained at the second capacitance corresponding to the second conversion gain (LCG), a transfer operation of a second transfer period by the first one of the second transfer transistors TGLS1-Tr and the fourth one of the second transfer transistors TGLS4-Tr is performed after the third reading period. In a fourth reading period following the second transfer period, a second round of the second conversion gain mode reading is performed.

In the third phase difference detecting mode (PDAF(D)), the capacitance changing part 80A keeps the capacitance of the floating diffusion FD at the second capacitance that includes the capacitance of the capacitor C82 and corresponds to the second conversion gain (LCG) at least after the reset period, in order to obtain a seventh second reading operation signal Sig3. In a fifth reading period following the reset period, a first round of the second conversion gain mode reading is performed. While the capacitance of the floating diffusion FD is retained at the second capacitance corresponding to the second conversion gain (LCG), a transfer operation of a second transfer period by the second one of the second transfer transistors TGLS2-Tr and the third one of the second transfer transistors TGLS3-Tr is performed after the fifth reading period. In a sixth reading period after the second transfer period, a second round of the second conversion gain mode reading is performed.

In the third phase difference detecting mode (PDAF(D)), as a third phase difference detecting signal PDAFSig, a difference signal (Sig2–Sig3) between the sixth second reading operation signal Sig2 and the seventh second reading operation signal Sig3 is used.

In the third phase difference detecting mode (PDAF(D)), as a fourth dynamic range widening signal HDRSig, a sum signal (Sig2+Sig3) of adding together the sixth second reading operation signal Sig2 and the seventh second reading operation signal Sig3 is used.

In the third phase difference detecting mode (PDAF(D)), the dynamic range is 103 dB, and the to-be-stored capacitance (LFWC) is, for example, equivalent to 150 Ke. This means that a sufficient well capacity can be obtained and a sufficiently widened dynamic range can be achieved.

(6) Special Dynamic Range Widening Mode (Extra-HDR)

Figure 30:
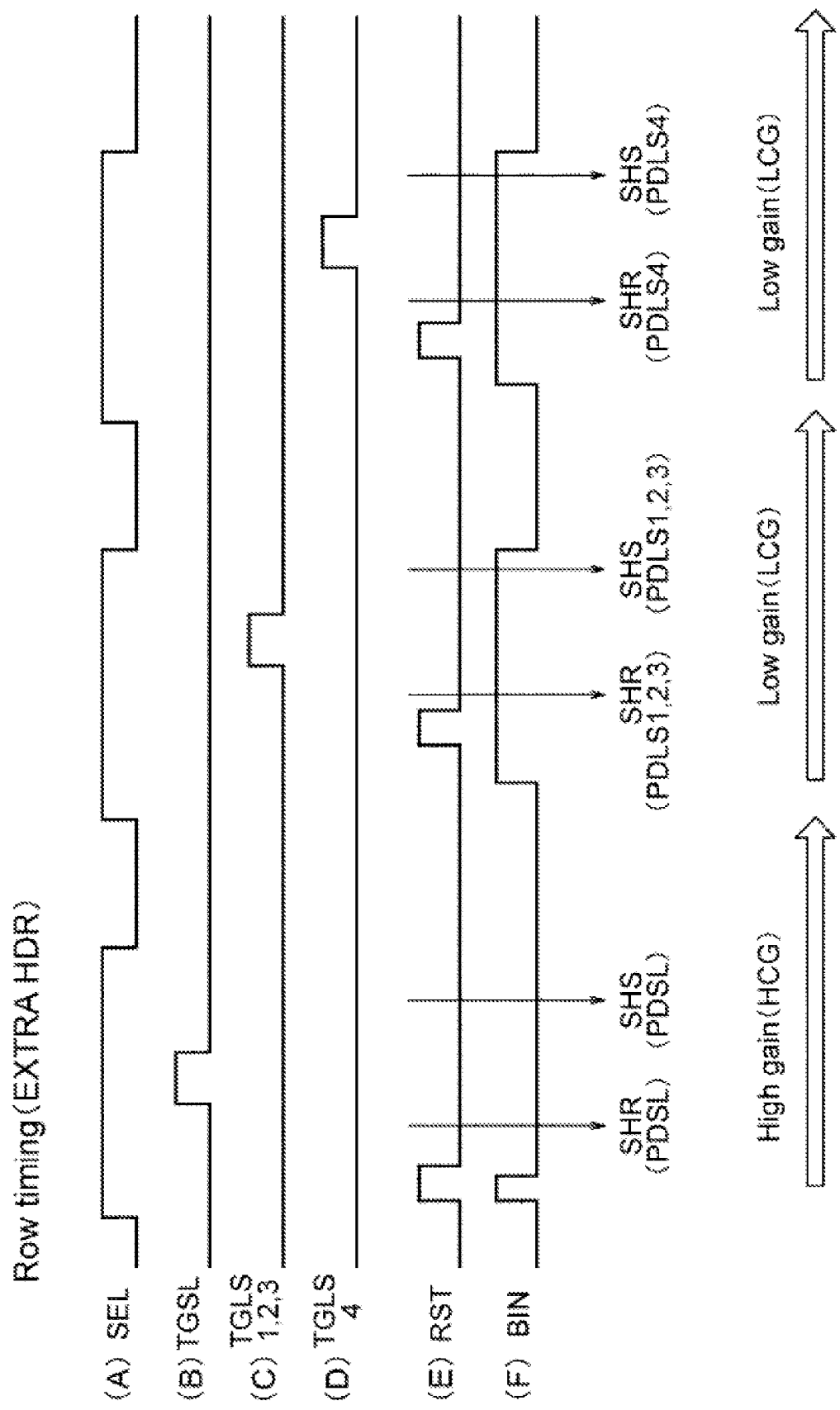
FIG. 30 is a timing chart including parts (A) to (F) to illustrate a reading operation performed in a special dynamic range widening mode (Extra-HDR) relating to the seventh embodiment.

FIG. 30 is a timing chart including parts (A) to (F) to illustrate a reading operation performed in a special dynamic range widening mode (Extra-HDR) relating to the seventh embodiment.

In the special dynamic range widening mode (Extra-HDR), when a fifth dynamic range widening function is effectuated, the capacitance changing part 80A keeps the capacitance of the floating diffusion FD at the first capacitance corresponding to the first conversion gain (HCG) at least after the reset period, in order to obtain a fifth first reading operation signal Sig1. In a first reading period following the reset period, a first round of the first conversion gain mode reading is performed. While the capacitance of the floating diffusion FD is retained at the first capacitance corresponding to the first conversion gain (HCG), a transfer operation of a first transfer period by the first transfer transistor TGSL1-Tr is performed after the first reading period. In a second reading period following the first transfer period, a second round of the first conversion gain mode reading is performed.

In the special dynamic range widening mode (Extra-HDR), the capacitance changing part 80A keeps the capacitance of the floating diffusion FD at the second capacitance that includes the capacitance of the capacitor C82 and corresponds to the second conversion gain (LCG) at least after the reset period, in order to obtain an eighth second reading operation signal Sig2. In a third reading period following the reset period, a first round of the second conversion gain mode reading is performed. While the capacitance of the floating diffusion FD is retained at the second capacitance corresponding to the second conversion gain (LCG), a transfer operation of a second transfer period by the first one of the second transfer transistors TGLS1-Tr, the second one of the second transfer transistors TGLS2-Tr and the third one of the second transfer transistors TGLS3-Tr is performed after the third reading period. In a fourth reading period following the second transfer period, a second round of the second conversion gain mode reading is performed.

In the special dynamic range widening mode (Extra-HDR), the capacitance changing part 80A keeps the capacitance of the floating diffusion FD at the second capacitance that includes the capacitance of the capacitor C82 and corresponds to the second conversion gain (LCG) at least after the reset period, in order to obtain a ninth second reading operation signal Sig3. In a fifth reading period following the reset period, a first round of the second conversion gain mode reading is performed. While the capacitance of the floating diffusion FD is retained at the second capacitance corresponding to the second conversion gain (LCG), a transfer operation of a third transfer period by the fourth one of the second transfer transistors TGLS4-Tr is performed after the fifth reading period. In a sixth reading period following the third transfer period, a second round of the second conversion gain mode reading is performed. In this case, it is preferable to lower the responsivity of the fourth one of the second photodiodes PDLS4. For example, the storing period may be shortened, or the light is reduced.

In the special dynamic range widening mode (Extra-HDR), as a fifth dynamic range widening signal HDRSig, a sum signal (Sig2+Sig3) of adding together the eighth second reading operation signal Sig2 and the ninth second reading operation signals Sig3 is used.

In the special dynamic range widening mode (Extra-HDR), the dynamic range is 108 dB, and the to-be-stored capacitance (LFWC) is, for example, equivalent to 250 Ke. This means that a sufficient well capacity can be obtained and a sufficiently widened dynamic range can be achieved.

According to the seventh embodiment, the reading part 70 is configured to perform reading in such a manner that at least one selected from the group consisting of the dynamic range widening function and the phase difference detecting function is effectuated by combining reading operations for the charges stored in, for example, the first photodiode PDSL1 in the first pixel PXLF1, the first one of the second photodiodes PDLS1 in the first pixel PXLF1, the second one of the second photodiodes PDLS2 in the second pixel PXLF2, the third one of the second photodiodes PDLS3 in the third pixel PXLF3 and the fourth one of the second photodiodes PDLS4 in the fourth pixel PXLF4.

Figure 31:
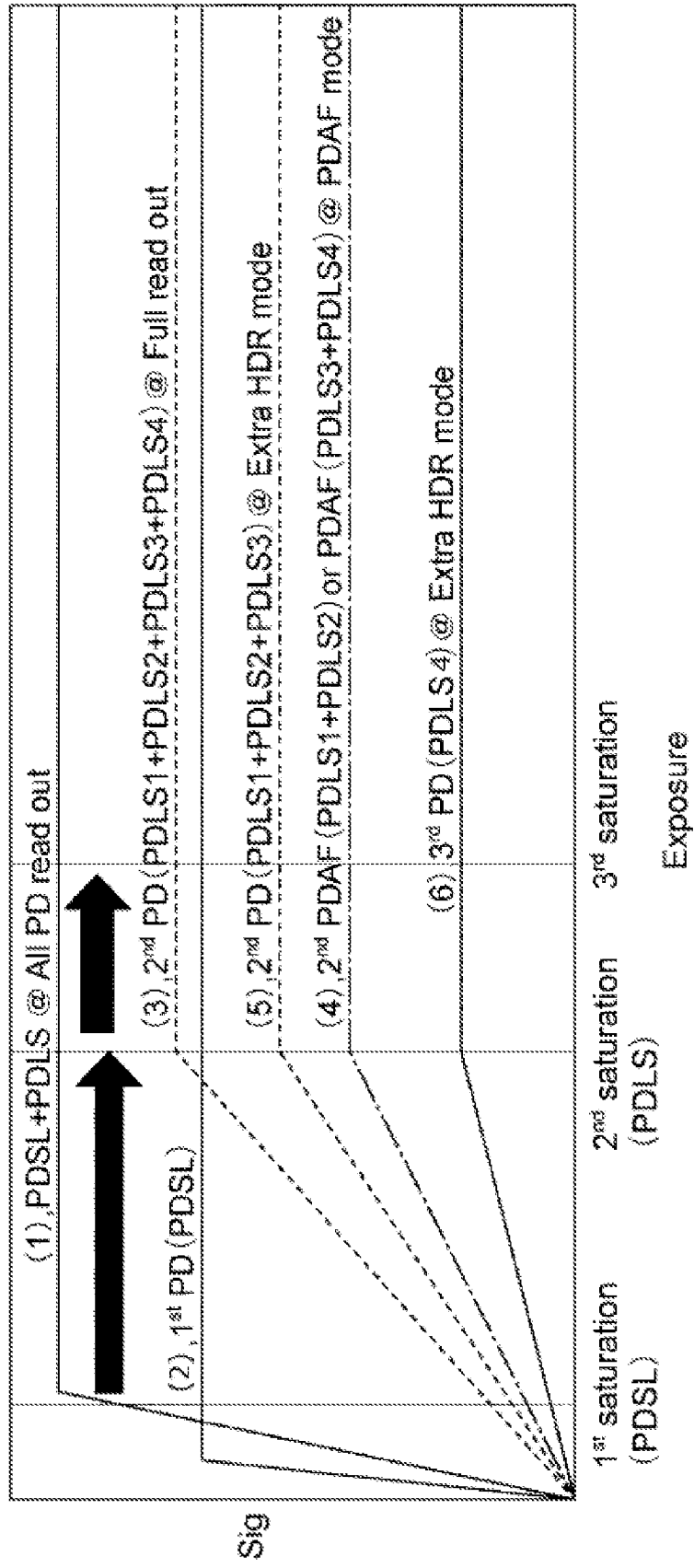
FIG. 31 shows responsivity characteristics of first and second photodiodes in the respective reading modes in accordance with the seventh embodiment of the present invention.
Figure 32A:
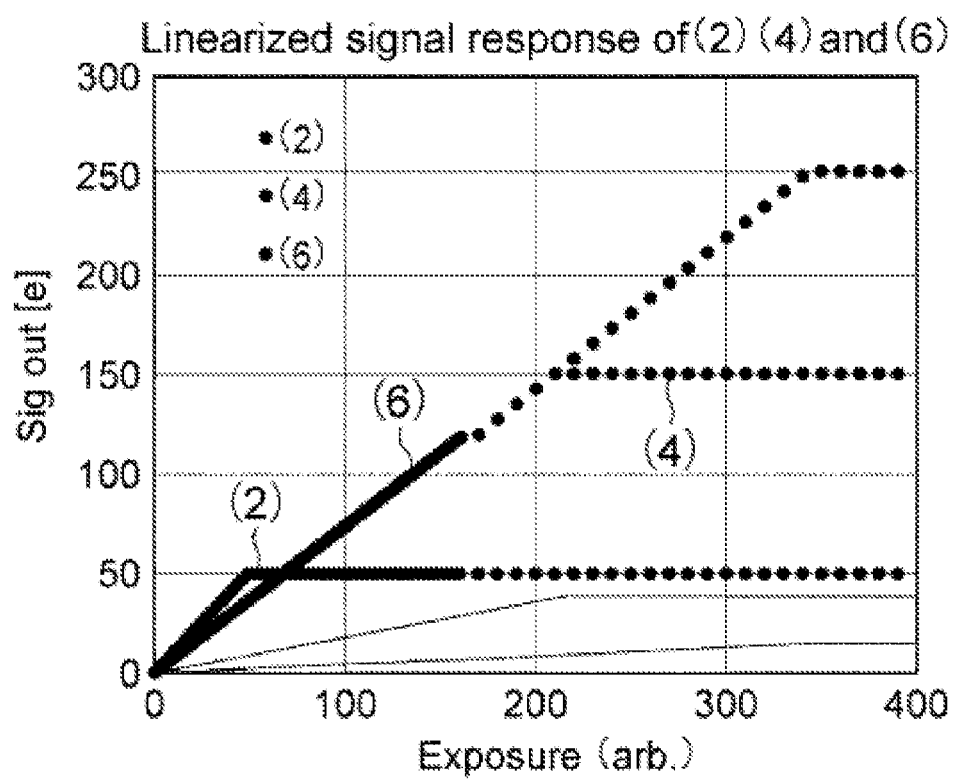
FIGS. 32A and 32B show linearized responsivity characteristics for the dynamic range widening mode (HDR), the third phase difference detecting mode (PDAF(D)) and the special dynamic range widening mode (Extra-HDR) in accordance with the seventh embodiment of the present invention.
Figure 32B:
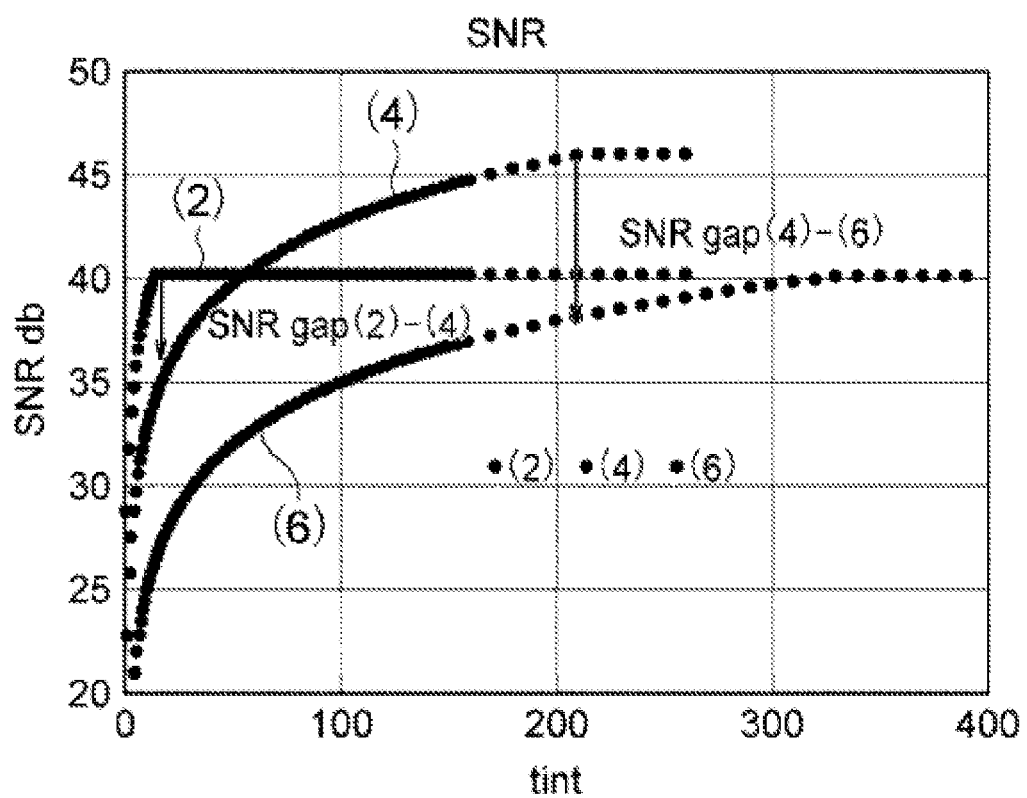

FIG. 31 shows the responsivity characteristics of the first photodiode PDSL and the second photodiodes PDLS in the respective reading modes relating to the seventh embodiment of the present invention. FIGS. 32A and 32B show the linearized responsivity characteristics for the dynamic range widening mode (HDR), the second phase difference detecting mode (PDAF(H)) and the special dynamic range widening mode (Extra-HDR) in accordance with the seventh embodiment of the present invention. FIG. 32A shows the input/output characteristics of the signals, and FIG. 32B shows the SNR characteristics.

FIGS. 32A and 32B indicate that the seventh embodiment can make an improvement of approximately 10 dB in the dynamic range widening mode (HDR) and the third phase difference detecting mode (PDAF(D)) and another improvement of 5 dB in the special dynamic range widening mode (Extra-HDR).

The seventh embodiment can not only produce the same effects as the first and second embodiments, but also provide a phase difference detecting system designed to obtain phase difference information for, for example, autofocus (AF) since a plurality of second photodiodes PDLS and a plurality of second transfer transistors TGLS are provided, a phase difference detecting system can be provided to obtain phase difference information for, for example, auto focus (AF).

Figures 33A, 33B, 33C:
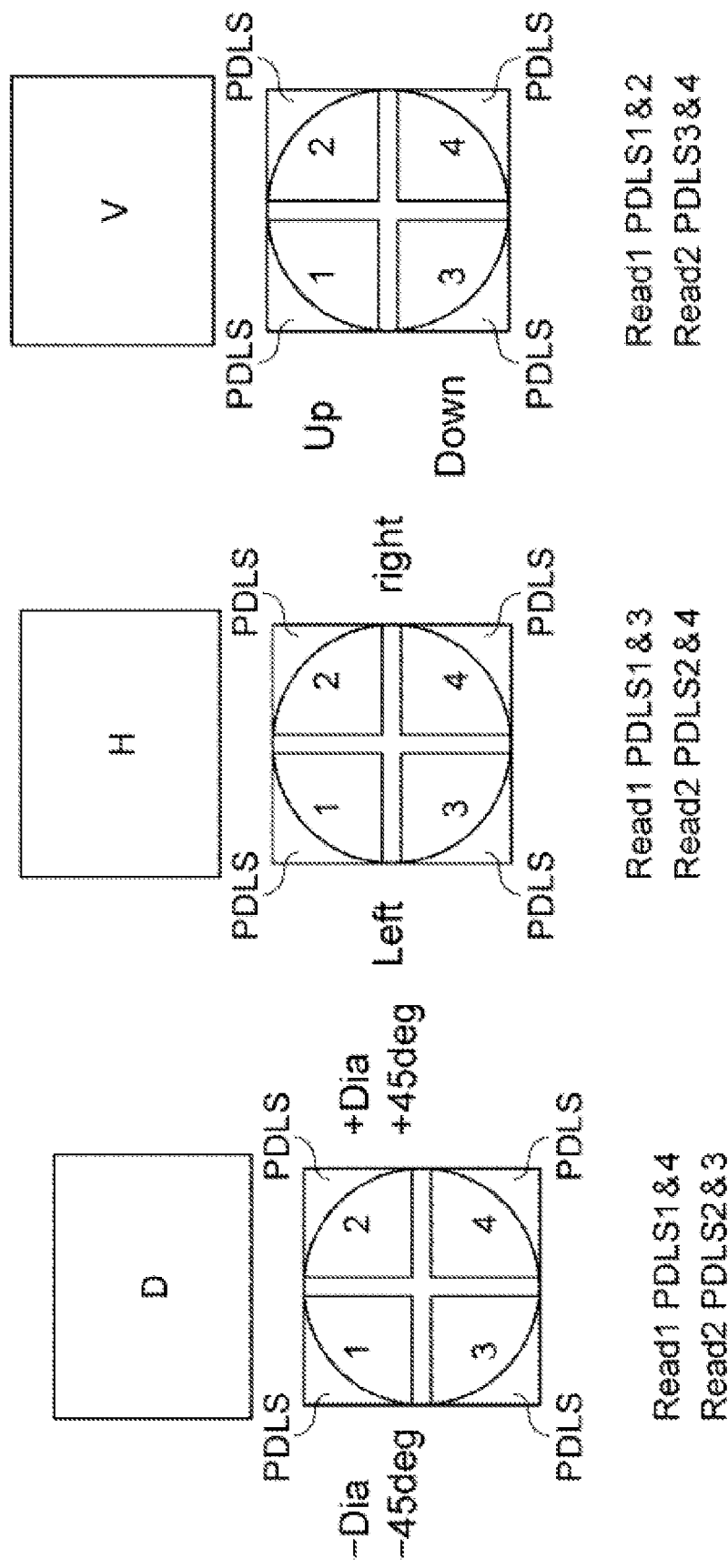
FIGS. 33A to 33C are used to illustrate that the reading operations of the respective reading modes relating to the seventh embodiment can be similarly applied to the pixel shown in FIG. 22 relating to the sixth embodiment.

The reading operations performed in the above-described reading modes can be applied similarly to the pixel PXLE relating to the sixth embodiment shown in FIG. 22. FIGS. 33A to 33C are used to illustrate that the reading operations performed in the respective reading modes relating to the seventh embodiment can be similarly applied to the pixel PXLE shown in FIG. 22 relating to the sixth embodiment. FIGS. 33A to 33C are only related to the reading operations performed in the phase difference detecting modes (PDAF), but the reading operations performed in the other modes can be used. To be specific, FIG. 33A outlines the reading operation performed in the first phase difference detecting mode (PDAF(V)), FIG. 33B outlines the reading operation performed in the second phase difference detecting mode (PDAF(H)), and FIG. 33C outlines the reading operation performed in the third phase difference detecting mode (PDAF(D)).

Eighth Embodiment

Figure 34:
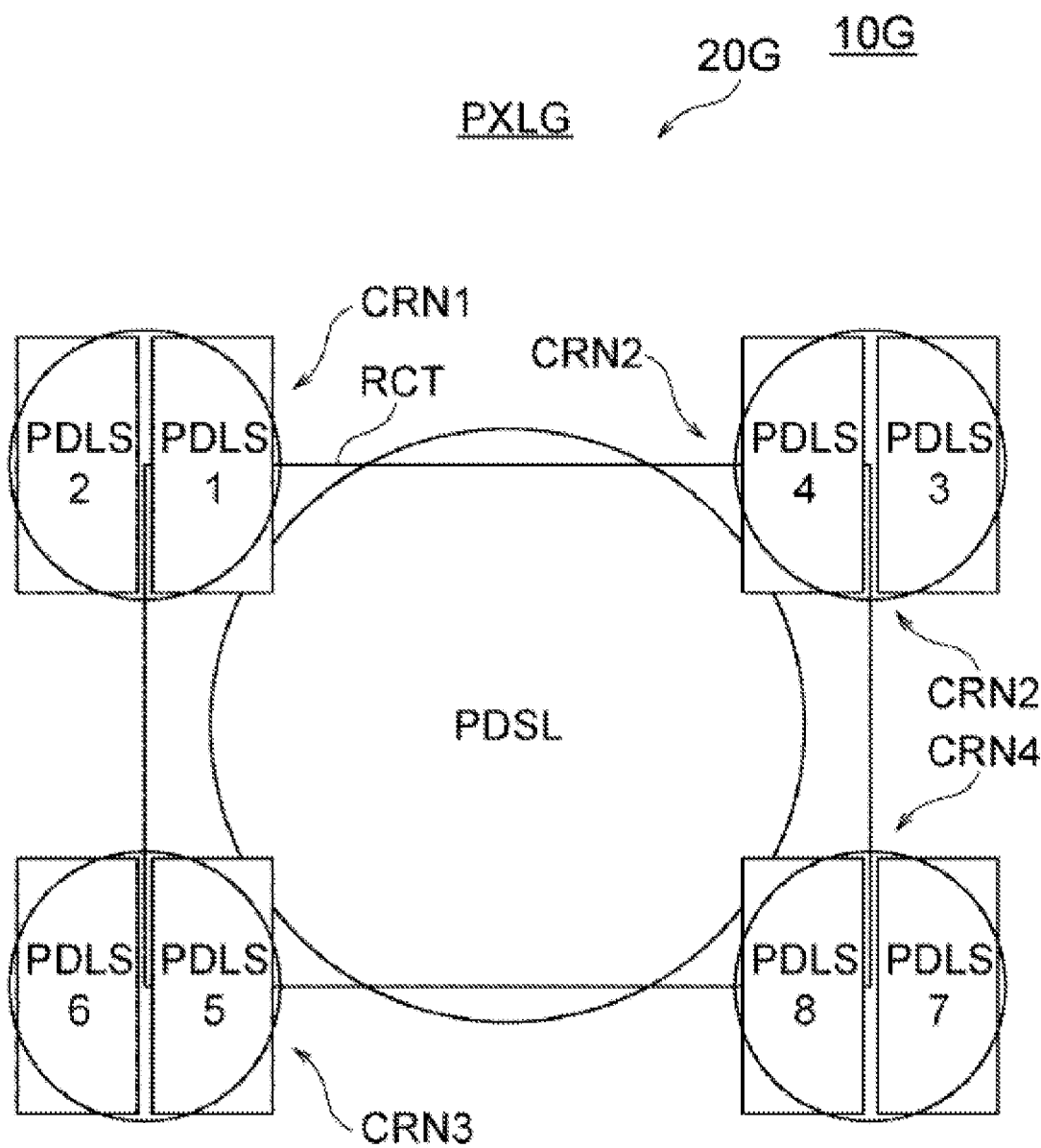
FIG. 34 is used to illustrate an example of arrangement of a first photodiode and eight second photodiodes in the pixel relating to the eighth embodiment.

FIG. 34 is used to illustrate an example of how to arrange a first photodiode and eight second photodiodes in the pixel relating to the eighth embodiment.

The pixel PXLG relating to the eighth embodiment differs from the pixel PXLE shown in FIG. 22 in that eight second photodiodes PDLS (1 to 8) are included. The pixel PXLG includes, for example, a first photodiode PDSL, and the first photodiode PDSL has a rectangular shape RCT. At the four corners of the first photodiode PDSL, the second photodiodes PDLS1 to PDLS8 (the second transfer transistors TGLS1-Tr to TGLS8-Tr) are arranged.

As the four corners, the pixel PXLG have a first corner CRN1 that is an upper left corner, a second corner CRN2 that is an upper right corner, a third corner CRN3 that is a lower left corner and a fourth corner CRN4 that is a lower right corner, as in the example shown in FIG. 22.

In the pixel PXLG, at the first corner CRN1, the first one of the second photodiodes PDLS1 and the first one of the second transfer transistors TGLS1-Tr form a pair with the second one of the second photodiodes PDLS2 and the second one of the second transfer transistors TGLS2-Tr. At the second corner, the third one of the second photodiodes PDLS3 and the third one of the second transfer transistors TGLS3-Tr form a pair with the fourth one of the second photodiodes PDSL4 and the fourth one of the second transfer transistors TGLS4-Tr. At the third corner CRN3, the fifth one of the second photodiodes PDLS5 and the fifth one of the second transfer transistors TGLS5-Tr form a pair with the sixth one of the second photodiodes PDLS6 and the sixth one of the second transfer transistors TGLS6-Tr. At the fourth corner CRN4, the seventh one of the second photodiodes PDLS7 and the seventh one of the second transfer transistors TGLS7-Tr form a pair with the eighth one of the second photodiodes PDLS8 and the eighth one of the second transfer transistors TGLS8-Tr.

In the eighth embodiment, the reading part 70 is configured to perform reading in such a manner that at least one selected from the group consisting of a dynamic range widening function and a phase difference detecting function is effectuated by combining reading operations for the charges stored in the first photodiode PDSL, the first one of the second photodiodes PDLS1, the second one of the second photodiodes PDLS2, the third one of the second photodiodes PDLS3, the fourth one of the second photodiodes PDLS4, the fifth one of the second photodiodes PDLS5, the sixth one of the second photodiodes PDLS6, the seventh one of the second photodiodes PDLS7 and the eighth one of the second photodiodes PDLS 8.

The eighth embodiment can not only produce the same effects as the first and second embodiments, but also provide a phase difference detecting system designed to obtain phase difference information for, for example, autofocus (AF) since eight second photodiodes PDLS and eight second transfer transistors TGLS are provided and obtain phase difference information in the horizontal (left-to-right), vertical (top-to-down) and angled directions.

First Application Example

Figure 35:
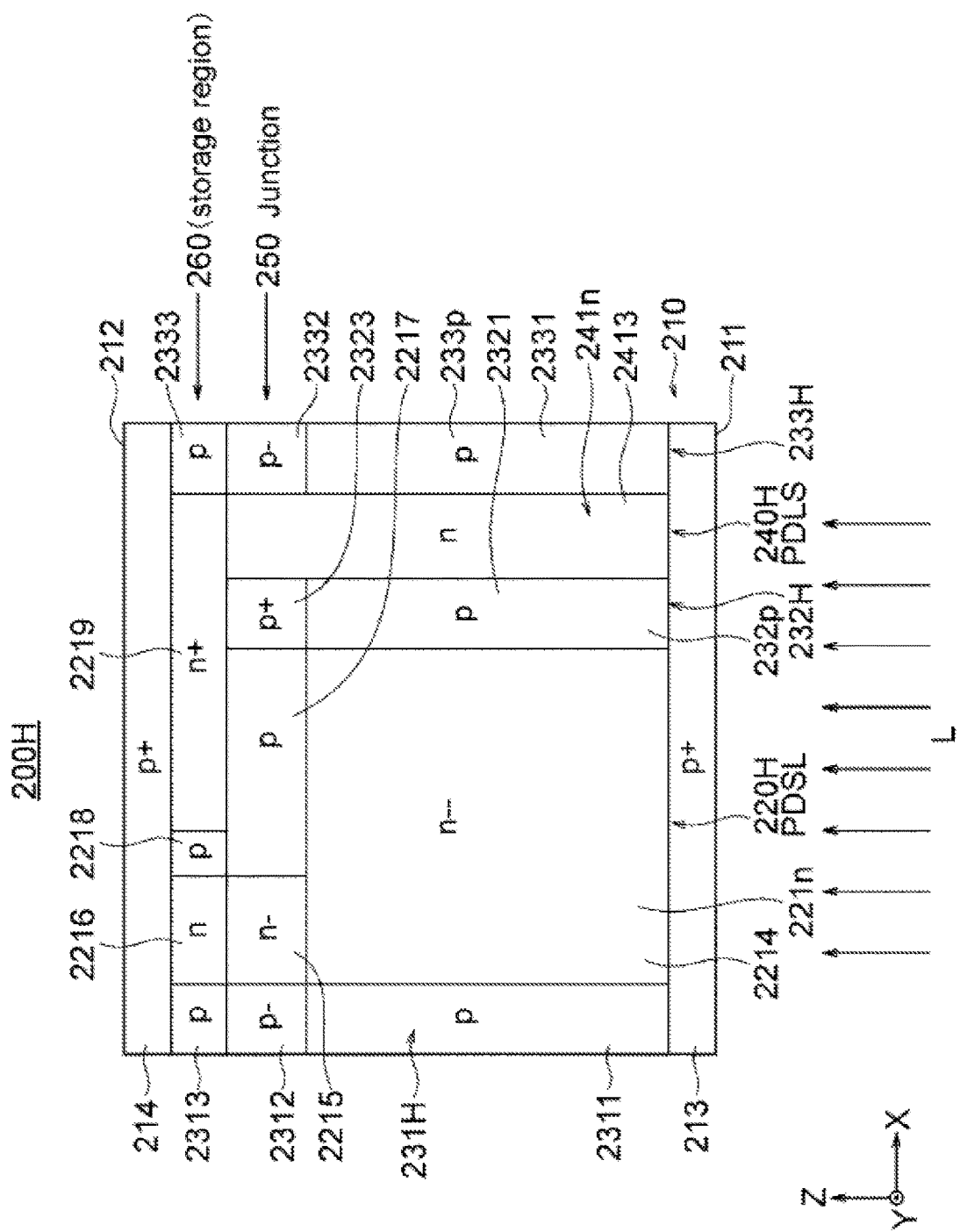
FIG. 35 is a simplified sectional view showing another example configuration of the first and second photodiodes of the pinned type relating to the embodiment shown in FIG. 5.

FIG. 35 is a simplified sectional view showing another example configuration of the first and second photodiodes of the pinned type relating to the embodiment shown in FIG. 5.

Although the example configuration of the pixel including the pinned first and second photodiodes PDSL and PDLS has been described with reference to FIG. 5 (and FIG. 20), the configuration of the pixel is not limited to the same. For example, as shown in FIG. 35, a more compact structure can be employed in which a junction part 250, a storage region 260 are stacked on the photoelectric conversion region.

In a first photodiode 220H (PDSL) shown in FIG. 35, an n layer (first-conductivity-type semiconductor layer) 221n has a three-layer structure in the normal direction to the substrate 210 (the Z direction in the orthogonal coordinate system shown in FIG. 35). In the present example, an n−− layer 2214 is the closest to the first substrate surface 211, an n− layer 2215 is formed on a part of the n−− layer 2214 and closer to the second substrate surface 212 than the n−− layer 2214 is, and an n layer 2216 is further formed and positioned closer to the second substrate surface 212 than the n− layer 2215 is. A p layer 2217 is parallel with the n− layer 2215, which is positioned closer to the second substrate surface 212 than the n−− layer 2214 is, and a p layer 2218 and an n+ layer 2219 are formed and positioned closer to the second substrate surface 212 than the p layer 2217 is.

In the second photodiode 240H (PDSL) shown in FIG. 35, an n layer (first-conductivity-type semiconductor layer) 241n has a single layer structure in the normal direction to the substrate 210 (the Z direction in the orthogonal coordinate system shown in FIG. 5). In the present example, an n layer 2413 is formed.

In a p-type separation layer 231H shown in FIG. 35, a p layer (second-conductivity-type semiconductor layer) 231p has a three-layer structure in the normal direction to the substrate 210 (the Z direction in the orthogonal coordinate system shown in FIG. 35). In the present example, a p layer 2311 is the closest to the first substrate surface 211, a p− layer 2312 is closer to the second substrate surface 212 than the p layer 2311 is, and a p layer 2313 is further formed and positioned closer to the second substrate surface 212 than the p− layer 2312 is.

In a p-type separation layer 232H shown in FIG. 35, a p layer (second-conductivity-type semiconductor layer) 232p has a two-layer structure in the normal direction to the substrate 210 (the Z direction in the orthogonal coordinate system shown in FIG. 35). In the present example, a p layer 2321 is formed and positioned closer to the first substrate surface 211 and a p+ layer 2323 is formed and positioned closer to the second substrate surface 212 than the p layer 2321 is.

In a p-type separation layer 233H shown in FIG. 35, a p layer (second-conductivity-type semiconductor layer) 233p has a three-layer structure in the normal direction to the substrate 210 (the Z direction in the orthogonal coordinate system shown in FIG. 35). In the present example, a p layer 2331 is the closest to the first substrate surface 211, a p− layer 2332 is closer to the second substrate surface 212 than the p layer 2331 is, and a p layer 2333 is further formed and positioned closer to the second substrate surface 212 than the p− layer 2332 is. In the example shown in FIG. 35, an n+ layer 2219 is formed on and covers the p layer 2217, the p+ layer 2323, and the n layer 2413.

The above-described configurations are only illustrated as examples, and other stacked structured can be employed.

Second Application Example

Figure 36A:
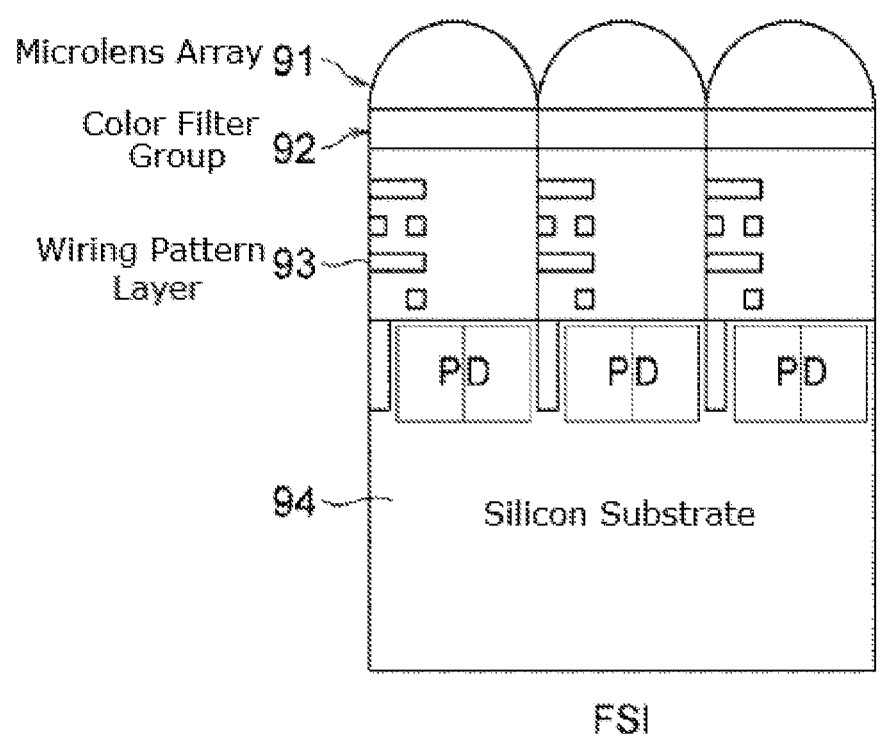
FIGS. 36A and 36B are used to illustrate that the solid-state imaging device relating to the embodiment of the present invention can be applied to both a frontside-illuminated image sensor and a backside-illuminated image sensor.
Figure 36B:
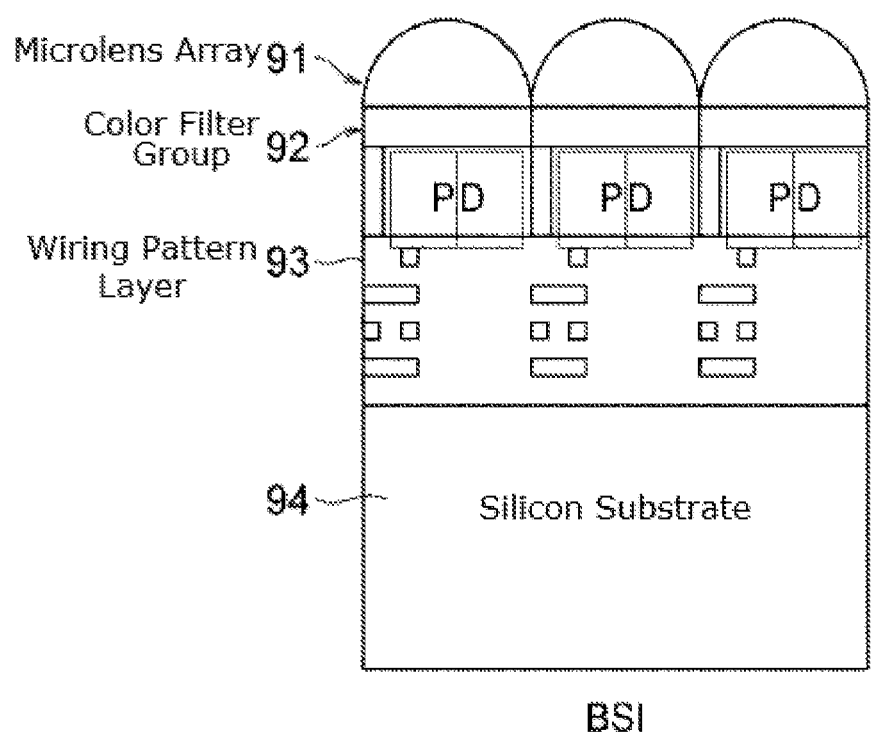

FIGS. 36A and 36B are used to illustrate that the solid-state imaging device relating to the embodiment of the present invention can be applied to both a frontside-illuminated image sensor and a backside-illuminated image sensor. FIG. 36A shows a simplified configuration of a frontside-illuminated image sensor, and FIG. 36B shows a simplified configuration of a backside-illuminated image sensor.

In FIGS. 36A and 36B, reference numerals 91, 92, 93 and 94 respectively denote a microlens array, a color filter group, a wiring pattern layer, and a silicon substrate.

As shown in FIGS. 36A and 36B, the solid-state imaging device 10 relating to the above-described embodiment can be applied to both the frontside-illuminated image sensor (FSI) and the backside-illuminated image sensor (BSI).

The solid-state imaging devices 10, 10A to 10G described above can be applied, as an imaging device, to electronic apparatuses such as digital cameras, video cameras, mobile terminals, surveillance cameras, and medical endoscope cameras.

Figure 37:
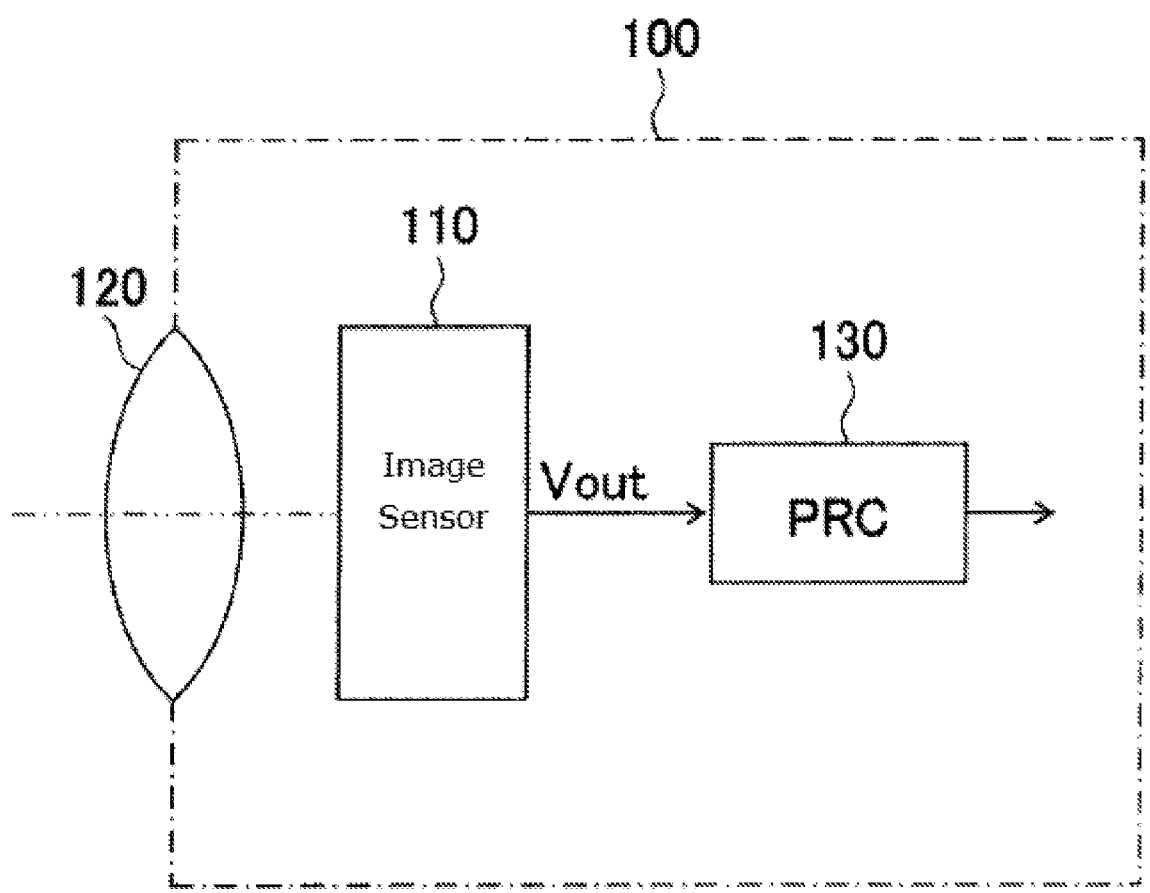
FIG. 37 shows an example configuration of an electronic apparatus to which the solid-state imaging devices relating to the embodiments of the present invention can be applied.

FIG. 37 shows an example of the configuration of an electronic apparatus including a camera system to which the solid-state imaging device according to the embodiments of the present invention is applied.

As shown in FIG. 37, the electronic apparatus 100 includes a CMOS image sensor 110, which can be constituted by any of the solid-state imaging devices 10, 10A to 10G according to the embodiments of the present invention. Further, the electronic apparatus 100 includes an optical system (such as a lens) 120 for redirecting the incident light to pixel regions of the CMOS image sensor 110 (to form a subject image). The electronic apparatus 100 includes a signal processing circuit (PRC) 130 for processing output signals of the CMOS image sensor 110.

The signal processing circuit 130 performs predetermined signal processing on the output signals of the CMOS image sensor 110. The image signals processed in the signal processing circuit 130 can be handled in various manners.

For example, the image signals can be displayed as a video image on a monitor having a liquid crystal display, or the image signals can be printed by a printer or recorded directly on a storage medium such as a memory card.

As described above, a high-performance, compact, and low-cost camera system can be provided that includes the solid-state imaging device 10, 10A to 10G as the CMOS image sensor 110. Further, it is possible to produce electronic apparatuses such as surveillance cameras and medical endoscope cameras that are used for applications where cameras are required to be installed under restricted conditions such as the installation size, number of connectable cables, cable length, and installation height.

What is claimed is:

1. A solid-state imaging device comprising:
    a pixel part having a pixel arranged therein, wherein the pixel has:
        at least one first photoelectric converting part configured to store therein, in a storing period, charges generated by photoelectric conversion;
        at least one second photoelectric converting part configured to store therein, in a storing period, charges generated by photoelectric conversion;
        at least one first transfer element configured to transfer, in a designated transfer period, the charges stored in the at least one first photoelectric converting part;
        at least one second transfer element configured to transfer, in a designated transfer period, the charges stored in the at least one second photoelectric converting part;
        a floating diffusion to which the charges stored in at least one of the at least one first photoelectric converting part or the at least one second photoelectric converting part are transferred through at least one of the at least one first transfer element or the at least one second transfer element;
        a source follower element configured to convert the charges in the floating diffusion into a voltage signal with a gain determined by a quantity of the charges; and
        a capacitance changing part configured to change a capacitance of the floating diffusion depending on a capacitance changing signal, wherein:
    the at least one first photoelectric converting part has a first well capacity and a first responsivity,
    the at least one second photoelectric converting part has a second well capacity and a second responsivity,
    the first well capacity is smaller than the second well capacity, and
    the first responsivity is larger than the second responsivity.

2. The solid-state imaging device according to claim 1, comprising:
    a reading part configured to read a pixel signal from the pixel part, the pixel has:
        a reset element configured to discharge, in a reset period, the charges from the floating diffusion, wherein the reading part is configured to perform read-out scanning including:
            reading, in a reading period following a reset period in which the floating diffusion is reset through the reset element, a signal in a reset state; and
            reading, in a reading period following a transfer period in which the charges stored in the at least one of the at least one first photoelectric converting part or the at least one second photoelectric converting part are transferred to the floating diffusion through the at least one of the at least one first transfer element or the at least one second transfer element after the reading period following the reset period, a signal determined by the stored charges, and
    wherein the reading part is further configured to perform, in a single reading period, at least one of (i) first conversion gain mode reading of reading the pixel signal with a first conversion gain corresponding to a first capacitance set by the capacitance changing part or (ii) second conversion gain mode reading of reading the pixel signal with a second conversion gain corresponding to a second capacitance set by the capacitance changing part.

3. The solid-state imaging device according to claim 2, wherein, in the first conversion gain mode reading, the reading part is further configured to:
    control the capacitance changing part to retain the capacitance of the floating diffusion at the first capacitance corresponding to the first conversion gain at least after the reset period;
    perform a first round of the first conversion gain mode reading in a first reading period following the reset period;
    while the capacitance of the floating diffusion is retained at the first capacitance corresponding to the first conversion gain, perform a transfer operation of a first transfer period by the at least one first transfer element after the first reading period; and
    perform a second round of the first conversion gain mode reading in a second reading period following the first transfer period.

4. The solid-state imaging device according to claim 2, wherein, in the second conversion gain mode reading, the reading part is further configured to:
    control the capacitance changing part to retain the capacitance of the floating diffusion at the second capacitance corresponding to the second conversion gain and including the capacitance of the capacitance changing part at least after the reset period;
    perform a first round of the second conversion gain mode reading in a third reading period following the reset period;
    while the capacitance of the floating diffusion is retained at the second capacitance corresponding to the second conversion gain, perform a transfer operation of a second transfer period by the at least one second transfer element after the third reading period; and
    perform a second round of the second conversion gain mode reading in a fourth reading period following the second transfer period.

5. The solid-state imaging device according to claim 1, the pixel has:
    one first photoelectric converting part configured to store therein, in a storing period, charges generated by photoelectric conversion;
    at least two second photoelectric converting parts configured to store therein, in a storing period, charges generated by photoelectric conversion;
    one first transfer element configured to transfer, in a designated transfer period, the charges stored in the one first photoelectric converting part; and
    at least two second transfer elements configured to transfer, in a designated transfer period, the charges stored in the at least two second photoelectric converting parts to the floating diffusion, the charges stored in at least one of the one first photoelectric converting part or the at least two second photoelectric converting parts are transferred through at least one of the one first transfer element and the at least two second transfer elements.

6. The solid-state imaging device according to claim 5, wherein in the pixel, the one first photoelectric converting part has a rectangular shape, and the at least two second photoelectric converting parts and the at least two second transfer elements correspond to and are arranged at four corners of the one first photoelectric converting part.

7. The solid-state imaging device according to claim 6, further comprising,
a reading part configured to read a pixel signal from the pixel part, wherein:
the pixel has, as the four corners, a first corner that is an upper left corner, a second corner that is an upper right corner, a third corner that is a lower left corner, and a fourth corner that is a lower right corner,
a first one of the at least two second photoelectric converting parts and a first one of the at least two second transfer elements are arranged at the first corner,
a second one of the at least two second photoelectric converting parts and a second one of the at least two second transfer elements are arranged at the second corner,
a third one of the at least two second photoelectric converting parts and a third one of the at least two second transfer elements are arranged at the third corner,
a fourth one of the at least two second photoelectric converting parts and a fourth one of the at least two second transfer elements are arranged at the fourth corner, and
the reading part is configured to perform reading in such a manner that at least one of a dynamic range widening function or a phase difference detecting function is effectuated, by combining reading operations for the charges stored in the one first photoelectric converting part and the first to fourth ones of the at least two second photoelectric converting parts.

8. The solid-state imaging device according to claim 7, the reading part is further configured to:
perform, in a single reading period, at least one of first conversion gain mode reading of reading the pixel signal with a first conversion gain corresponding to a first capacitance set by the capacitance changing part or second conversion gain mode reading of reading the pixel signal with a second conversion gain corresponding to a second capacitance set by the capacitance changing part, and
wherein when a first dynamic range widening function is effectuated, in order to obtain a first first reading operation signal, the reading part is further configured to:
control the capacitance changing part to retain the capacitance of the floating diffusion at the first capacitance corresponding to the first conversion gain at least after a reset period;
perform a first round of the first conversion gain mode reading in a first reading period following the reset period;
while the capacitance of the floating diffusion is retained at the first capacitance corresponding to the first conversion gain, perform a transfer operation of a first transfer period by the at least one first transfer element after the first reading period; and
perform a second round of the first conversion gain mode reading in a second reading period following the first transfer period,
in order to obtain a first second reading operation signal, the reading part is further configured to:
control the capacitance changing part to retain the capacitance of the floating diffusion at the second capacitance corresponding to the second conversion gain at least after the reset period;
perform a first round of the second conversion gain mode reading in a third reading period following the reset period;
while the capacitance of the floating diffusion is retained at the second capacitance corresponding to the second conversion gain, perform a transfer operation of a second transfer period by the first one of the at least two second transfer elements, the second one of the at least two second transfer elements, the third one of the at least two second transfer elements, and the fourth one of the at least two second transfer elements after the third reading period; and
perform a second round of the second conversion gain mode reading in a fourth reading period following the second transfer period, and
the reading part uses the first second reading operation signal as a first dynamic range widening signal.

9. The solid-state imaging device according to claim 7, wherein the reading part is further configured to perform, in a single reading period, at least one of first conversion gain mode reading of reading the pixel signal with a first conversion gain corresponding to a first capacitance set by the capacitance changing part or second conversion gain mode reading of reading the pixel signal with a second conversion gain corresponding to a second capacitance set by the capacitance changing part, and
wherein when a second dynamic range widening function and a first phase difference detecting function are effectuated, in order to obtain a second first reading operation signal, the reading part is further configured to:
control the capacitance changing part to retain the capacitance of the floating diffusion at the first capacitance corresponding to the first conversion gain at least after a reset period;
perform a first round of the first conversion gain mode reading in a first reading period following the reset period;
while the capacitance of the floating diffusion is retained at the first capacitance corresponding to the first conversion gain, perform a transfer operation of a first transfer period by the at least one first transfer element after the first reading period; and
perform a second round of the first conversion gain mode reading in a second reading period following the first transfer period, and
in order to obtain a second second reading operation signal, the reading part is further configured to:
control the capacitance changing part to retain the capacitance of the floating diffusion at the second capacitance corresponding to the second conversion gain at least after the reset period;
perform a first round of the second conversion gain mode reading in a third reading period following the reset period;
while the capacitance of the floating diffusion is retained at the second capacitance corresponding to the second conversion gain, perform a transfer operation of a second transfer period by the first one of the at least two second transfer elements and the second one of the at least two second transfer elements after the third reading period; and perform a second round of the second conversion gain mode reading in a fourth reading period following the second transfer period, in order to obtain a third second reading operation signal, the reading part is further configured to:

control the capacitance changing part to retain the capacitance of the floating diffusion at the second capacitance corresponding to the second conversion gain at least after the reset period;

perform a first round of the second conversion gain mode reading in a fifth reading period following the reset period;

while the capacitance of the floating diffusion is retained at the second capacitance corresponding to the second conversion gain, perform a transfer operation of a second transfer period by the third one of the at least two second transfer elements and the fourth one of the at least two second transfer elements after the fifth reading period; and perform a second round of the second conversion gain mode reading in a sixth reading period following the second transfer period, and the reading part uses, as a first phase difference detecting signal, a difference signal between the second second reading operation signal and the third second reading operation signal, and the reading part uses, as a second dynamic range widening signal, a sum signal obtained by adding together the second second reading operation signal and the third second reading operation signal.

10. The solid-state imaging device according to claim 7, wherein the reading part is further configured to:

perform, in a single reading period, at least one of first conversion gain mode reading of reading the pixel signal with a first conversion gain corresponding to a first capacitance set by the capacitance changing part or second conversion gain mode reading of reading the pixel signal with a second conversion gain corresponding to a second capacitance set by the capacitance changing part, and wherein when a third dynamic range widening function and a second phase difference detecting function are effectuated, in order to obtain a third first reading operation signal, the reading part is further configured to:

control the capacitance changing part to retain the capacitance of the floating diffusion at the first capacitance corresponding to the first conversion gain at least after a reset period;

perform a first round of the first conversion gain mode reading in a first reading period following the reset period;

while the capacitance of the floating diffusion is retained at the first capacitance corresponding to the first conversion gain, perform a transfer operation of a first transfer period by the at least one first transfer element after the first reading period; and perform a second round of the first conversion gain mode reading in a second reading period following the first transfer period, in order to obtain a fourth second reading operation signal, the reading part is further configured to:

control the capacitance changing part to retain the capacitance of the floating diffusion at the second capacitance corresponding to the second conversion gain at least after the reset period;

perform a first round of the second conversion gain mode reading in a third reading period following the reset period;

while the capacitance of the floating diffusion is retained at the second capacitance corresponding to the second conversion gain, perform a transfer operation of a second transfer period by the first one of the at least two second transfer elements and the third one of the at least two second transfer elements after the third reading period; and perform a second round of the second conversion gain mode reading in a fourth reading period following the second transfer period, in order to obtain a fifth second reading operation signal, the reading part is further configured to:

control the capacitance changing part to retain the capacitance of the floating diffusion at the second capacitance corresponding to the second conversion gain at least after the reset period;

perform a first round of the second conversion gain mode reading in a fifth reading period following the reset period;

while the capacitance of the floating diffusion is retained at the second capacitance corresponding to the second conversion gain, perform a transfer operation of a second transfer period by the second one of the at least two second transfer elements and the fourth one of the at least two second transfer elements after the fifth reading period; and perform a second round of the second conversion gain mode reading in a sixth reading period following the second transfer period, and the reading part uses, as a second phase difference detecting signal, a difference signal between the fourth second reading operation signal and the fifth second reading operation signal, and the reading part uses, as a third dynamic range widening signal, a sum signal obtained by adding together the fourth second reading operation signal and the fifth second reading operation signal.

11. The solid-state imaging device according to claim 7, the reading part is further configured to:

perform, in a single reading period, at least one of first conversion gain mode reading of reading the pixel signal with a first conversion gain corresponding to a first capacitance set by the capacitance changing part or second conversion gain mode reading of reading the pixel signal with a second conversion gain corresponding to a second capacitance set by the capacitance changing part, and wherein when a fourth dynamic range widening function and a third phase difference detecting function are effectuated, in order to obtain a fourth first reading operation signal, the reading part is further configured to:

control the capacitance changing part to retain the capacitance of the floating diffusion at the first capacitance corresponding to the first conversion gain at least after a reset period;

perform a first round of the first conversion gain mode reading in a first reading period following the reset period;

while the capacitance of the floating diffusion is retained at the first capacitance corresponding to the first conversion gain, perform a transfer operation of a first transfer period by the at least one first transfer element after the first reading period; and perform a second round of the first conversion gain mode reading in a second reading period following the first transfer period, in order to obtain a sixth second reading operation signal, the reading part is further configured to:

control the capacitance changing part to retain the capacitance of the floating diffusion at the second capacitance corresponding to the second conversion gain at least after the reset period;

perform a first round of the second conversion gain mode reading in a third reading period following the reset period;

while the capacitance of the floating diffusion is retained at the second capacitance corresponding to the second conversion gain, perform a transfer operation of a second transfer period by the first one of the at least two second transfer elements and the fourth one of the at least two second transfer elements after the third reading period; and perform a second round of the second conversion gain mode reading in a fourth reading period following the second transfer period, in order to obtain a seventh second reading operation signal, the reading part is further configured to:

control the capacitance changing part to retain the capacitance of the floating diffusion at the second capacitance corresponding to the second conversion gain at least after the reset period;

perform a first round of the second conversion gain mode reading in a fifth reading period following the reset period;

while the capacitance of the floating diffusion is retained at the second capacitance corresponding to the second conversion gain, perform a transfer operation of a second transfer period by the second one of the at least two second transfer elements and the third one of the at least two second transfer elements after the fifth reading period; and perform a second round of the second conversion gain mode reading in a sixth reading period following the second transfer period, and the reading part uses, as a third phase difference detecting signal, a difference signal between the sixth second reading operation signal and the seventh second reading operation signal, and the reading part uses, as a fourth dynamic range widening signal, a sum signal obtained by adding together the sixth second reading operation signal and the seventh second reading operation signal.

12. The solid-state imaging device according to claim 7, wherein the reading part is further configured to:

perform, in a single reading period, at least one of first conversion gain mode reading of reading the pixel signal with a first conversion gain corresponding to a first capacitance set by the capacitance changing part or second conversion gain mode reading of reading the pixel signal with a second conversion gain corresponding to a second capacitance set by the capacitance changing part, and wherein when a fifth dynamic range widening function is effectuated, in order to obtain a fifth first reading operation signal, the reading part is further configured to:

control the capacitance changing part to retain the capacitance of the floating diffusion at the first capacitance corresponding to the first conversion gain at least after a reset period;

perform a first round of the first conversion gain mode reading in a first reading period following the reset period;

while the capacitance of the floating diffusion is retained at the first capacitance corresponding to the first conversion gain, perform a transfer operation of a first transfer period by the at least one first transfer element after the first reading period; and perform a second round of the first conversion gain mode reading in a second reading period following the first transfer period, in order to obtain an eighth second reading operation signal, the reading part is further configured to:

control the capacitance changing part to retain the capacitance of the floating diffusion at the second capacitance corresponding to the second conversion gain at least after the reset period;

perform a first round of the second conversion gain mode reading in a third reading period following the reset period;

while the capacitance of the floating diffusion is retained at the second capacitance corresponding to the second conversion gain, perform a transfer operation of a second transfer period by the first one of the at least two second transfer elements, the second one of the at least two second transfer elements, and the third one of the at least two second transfer elements after the third reading period; and perform a second round of the second conversion gain mode reading in a fourth reading period following the second transfer period, in order to obtain a ninth second reading operation signal, the reading part is further configured to:

control the capacitance changing part to retain the capacitance of the floating diffusion at the second capacitance corresponding to the second conversion gain at least after the reset period;

perform a first round of the second conversion gain mode reading in a fifth reading period following the reset period;

while the capacitance of the floating diffusion is retained at the second capacitance corresponding to the second conversion gain, perform a transfer operation of a second transfer period by the fourth one of the at least two second transfer elements after the fifth reading period; and perform a second round of the second conversion gain mode reading in a sixth reading period following the second transfer period, and the reading part uses, as a fifth dynamic range widening signal, a sum signal obtained by adding together the eighth second reading operation signal and the ninth second reading operation signal.

13. The solid-state imaging device according to claim 6, wherein:

the pixel part includes a plurality of pixels, including the pixel, arranged therein in a matrix pattern, and the pixel part has a pixel sharing configuration in such a manner that the floating diffusion is shared between the at least two second photoelectric converting parts and the at least two second transfer elements of adjacent pixels.

14. The solid-state imaging device according to claim 13, wherein:
   each of the pixels has, as the four corners, a first corner that is an upper left corner, a second corner that is an upper right corner, a third corner that is a lower left corner, and a fourth corner that is a lower right corner,
   a first one of the at least two second photoelectric converting parts and a first one of the at least two second transfer elements are arranged at the first corner,
   a second one of the at least two second photoelectric converting parts and a second one of the at least two second transfer elements are arranged at the second corner,
   a third one of the at least two second photoelectric converting parts and a third one of the at least two second transfer elements are arranged at the third corner,
   a fourth one of the at least two second photoelectric converting parts and a fourth one of the at least two second transfer elements are arranged at the fourth corner,
   the first one of the at least two second photoelectric converting parts and the first one of the at least two second transfer elements share the floating diffusion with at least one of (i) the second one of the at least two second photoelectric converting parts and the second one of the at least two second transfer elements of a left adjacent pixel in a column direction, (ii) the third one of the at least two second photoelectric converting parts and the third one of the at least two second transfer elements of an upper adjacent pixel in a row direction, or (iii) the fourth one of the at least two second photoelectric converting parts and the fourth one of the at least two second transfer elements of an upper left adjacent pixel,
   the second one of the at least two second photoelectric converting parts and the second one of the at least two second transfer elements share one floating diffusion with at least one of (i) the first one of the at least two second photoelectric converting parts and the first one of the at least two second transfer elements of a right adjacent pixel in a column direction, (ii) the fourth one of the at least two second photoelectric converting parts and the fourth one of the at least two second transfer elements of an upper adjacent pixel in a row direction, or (iii) the third one of the at least two second photoelectric converting parts and the third one of the at least two second transfer elements of an upper right adjacent pixel,
   the third one of the at least two second photoelectric converting parts and the third one of the at least two second transfer elements share one floating diffusion with at least of (i) the fourth one of the at least two second photoelectric converting parts and the fourth one of the at least two second transfer elements of a left adjacent pixel in a column direction, (ii) the first one of the at least two second photoelectric converting parts and the first one of the at least two second transfer elements of a lower adjacent pixel in a row direction, or (iii) the second one of the at least two second photoelectric converting parts and the second one of the at least two second transfer elements of a lower left adjacent pixel, and
   the fourth one of the at least two second photoelectric converting parts and the fourth one of the at least two second transfer elements share one floating diffusion with at least one of (i) the third one of the at least two second photoelectric converting parts and the third one of the at least two second transfer elements of a right adjacent pixel in a column direction, (ii) the second one of the at least two second photoelectric converting parts and the second one of the at least two second transfer elements of a lower adjacent pixel in a row direction, or (iii) the first one of the at least two second photoelectric converting parts and the first one of the at least two second transfer elements of a lower right adjacent pixel.

15. The solid-state imaging device according to claim 14, further comprising;
   a reading part configured to read a pixel signal from the pixel part, wherein:
      the pixel part includes a first pixel, a second pixel, a third pixel, and a fourth pixel arranged therein in a matrix pattern,
      the floating diffusion is shared between (i) the first one of the at least two second photoelectric converting parts and the first one of the at least two second transfer elements in the first pixel, (ii) the second one of the at least two second photoelectric converting parts and the second one of the at least two second transfer elements in the second pixel, (iii) the third one of the at least two second photoelectric converting parts and the third one of the at least two second transfer elements in the third pixel, and (iv) the fourth one of the at least two second photoelectric converting parts and the fourth one of the at least two second transfer elements in the fourth pixel, and
      wherein the reading part is further configured to:
   perform reading in such a manner that at least one of a dynamic range widening function or a phase difference detecting function is effectuated by combining reading operations for the charges stored in the at least one first photoelectric converting part in the first pixel, the first one of the at least two second photoelectric converting parts in the first pixel, the second one of the at least two second photoelectric converting parts in the second pixel, the third one of the at least two second photoelectric converting parts in the third pixel, and the fourth one of the at least two second photoelectric converting parts in the fourth pixel.

16. The solid-state imaging device according to claim 1, further comprising:
   a substrate having a first substrate surface and a second substrate surface opposite the first substrate surface, wherein the at least one first photoelectric converting part includes a first-conductivity-type semiconductor layer is buried in the substrate, and the at least one first photoelectric converting part being configured to photoelectrically convert received light and store resulting charges;
   a second-conductivity-type separation layer formed on at least one of lateral portions of the first-conductivity-type semiconductor layer of the at least one first photoelectric converting part; and
   the at least one second photoelectric converting part including a first-conductivity-type semiconductor layer buried in the substrate such that the at least one second photoelectric converting part is parallel with the at least one first photoelectric converting part with the second-conductivity-type separation layer being sandwiched therebetween, the at least one second photoelectric converting part being configured to photoelectrically convert received light and store resulting charges, wherein an aperture of a light receiving region of the at least one first photoelectric converting part is larger than an aperture of the at least one second photoelectric converting part, and wherein an impurity concentration of the first-conductivity-type semiconductor layer of the at least one first photoelectric converting part is lower than an impurity concentration of the first-conductivity-type semiconductor layer of the at least one second photoelectric converting part.

17. The solid-state imaging device according to claim 16, wherein the at least one second photoelectric converting part includes, at least in a portion of the first-conductivity-type semiconductor layer, at least one second-conductivity-type semiconductor layer having a junction capacitance component with the first-conductivity-type semiconductor layer in a direction orthogonal to a normal to the substrate.

18. A method for driving a solid-state imaging device including a pixel part having a pixel arranged therein, the method comprising:
storing, during a storing period, via at least one first photoelectric converting part of the pixel, charges generated by photoelectric conversion;
storing, during a storing period, via at least one second photoelectric converting part of the pixel, charges generated by photoelectric conversion;
transferring, during a designated transfer period, via at least one first transfer element of the pixel, the charges stored in the at least one first photoelectric converting part;
transferring, during a designated transfer period, via at least one second transfer element of the pixel, the charges stored in the at least one second photoelectric converting part;
transferring, via a floating diffusion of the pixel, the charges stored in at least one of the at least one first photoelectric converting part or the at least one second photoelectric converting part through at least one of the at least one first transfer element or the at least one second transfer element;
converting, via a source follower element of the pixel, the charges in the floating diffusion into a voltage signal with a gain determined by a quantity of the charges;
discharging, via a reset element of the pixel, during a reset period, the charges from the floating diffusion; and
changing, via a capacitance changing part of the pixel, the capacitance of the floating diffusion depending on a capacitance changing signal, wherein the at least one first photoelectric converting part has a first well capacity and a first responsivity, the at least one second photoelectric converting part has a second well capacity and a second responsivity, the first well capacity is smaller than the second well capacity, and the first responsivity is larger than the second responsivity, and wherein during a read-out scanning period the method further comprises:
reading, during a reading period following a reset period in which the floating diffusion is reset through the reset element, a signal in a reset state; and
reading, during a reading period following a transfer period in which the charges stored in the at least one of the at least one first photoelectric converting part or the at least one second photoelectric converting part are transferred to the floating diffusion through the at least one of the at least one first transfer element or the at least one second transfer element after the reading period following the reset period, a pixel signal determined by the stored charges, wherein:
during a single reading period, performing at least one of first conversion gain mode reading of reading the pixel signal corresponding to the charges stored in the at least one first photoelectric converting part, with a first conversion gain corresponding to a first capacitance set by the capacitance changing part or second conversion gain mode reading of reading the pixel signal corresponding to the charges stored in the at least one second photoelectric converting part, with a second conversion gain corresponding to a second capacitance set by the capacitance changing part is performed.

19. An electronic apparatus comprising:
a solid-state imaging device; and
an optical system for forming a subject image on the solid-state imaging device, wherein the solid-state imaging device includes a pixel part having a pixel arranged therein, wherein the pixel has:
at least one first photoelectric converting part configured to store therein, in a storing period, charges generated by photoelectric conversion;
at least one second photoelectric converting part configured to store therein, in a storing period, charges generated by photoelectric conversion;
at least one first transfer element configured to transfer, in a designated transfer period, the charges stored in the at least one first photoelectric converting p art;
at least one second transfer element configured to transfer, in a designated transfer period, the charges stored in the at least one second photoelectric converting p art;
a floating diffusion to which the charges stored in at least one of the at least one first photoelectric converting part or the at least one second photoelectric converting part are transferred through at least one of the at least one first transfer element or the at least one second transfer element;
a source follower element configured to convert the charges in the floating diffusion into a voltage signal with a gain determined by a quantity of the charges; and
a capacitance changing part configured to change a capacitance of the floating diffusion depending on a capacitance changing signal, wherein:
the at least one first photoelectric converting part has a first well capacity and a first responsivity,
the at least one second photoelectric converting part has a second well capacity and a second responsivity,
the first well capacity is smaller than the second well capacity, and
the first responsivity is larger than the second responsivity.

* * * * *